United States Patent
Inoue et al.

(10) Patent No.: US 7,283,407 B2
(45) Date of Patent: *Oct. 16, 2007

(54) SEMICONDUCTOR MEMORY DEVICE

(75) Inventors: Koji Inoue, Ikoma (JP); Yoshinao Morikawa, Ikoma (JP); Atsushi Shimaoka, Kashihara (JP); Yukio Tamai, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 136 days.

This patent is subject to a terminal disclaimer.

(21) Appl. No.: 11/045,786

(22) Filed: Jan. 28, 2005

(65) Prior Publication Data

US 2005/0169038 A1    Aug. 4, 2005

(30) Foreign Application Priority Data

| Jan. 29, 2004 | (JP) | ............................ 2004-020749 |
| Mar. 29, 2004 | (JP) | ............................ 2004-094057 |
| Oct. 28, 2004 | (JP) | ............................ 2004-313648 |

(51) Int. Cl.
*G11C 7/00* (2006.01)

(52) U.S. Cl. ............... 365/189.11; 365/148; 365/230.06

(58) Field of Classification Search ........... 365/189.11, 365/148, 230.06
See application file for complete search history.

(56) References Cited

U.S. PATENT DOCUMENTS 6,621,729 B1    9/2003  Garni et al.

2003/0031045 A1    2/2003  Hosotani
2004/0003191 A1*   1/2004  Minne ........................ 711/163
2004/0012996 A1    1/2004  Tanizaki

FOREIGN PATENT DOCUMENTS

| EP | 0 399 362 A2 | 11/1990 |
| EP | 0 399 362 A3 | 11/1990 |
| EP | 1 152 429 A2 | 11/2001 |
| EP | 1 152 429 A3 | 11/2001 |
| JP | 2002-008369 A | 1/2002 |

OTHER PUBLICATIONS

European Search Report mailed on Oct. 13, 2005 for European Patent Application No. 05250434.7, 4 pages.
European Search Report mailed Nov. 30, 2005 for European Patent Application No. 05250434.7, three pages.

* cited by examiner

*Primary Examiner*—Huan Hoang
(74) *Attorney, Agent, or Firm*—Morrison & Foerster LLP

(57) ABSTRACT

A semiconductor memory device comprises a column readout voltage supply circuit which supplies a predetermined first voltage when readout is selected and supplies a predetermined second voltage which is different from the fist voltage when the readout is not selected, to each column selection line, a row readout voltage supply circuit which supplies the second voltage to each row selection line at the time of readout, a sense circuit which detects a current flowing in the selected row selection line separately from a current flowing in the non-selected row selection lines to detect an electric resistance state of the selected memory cell at the time of readout, and a column voltage displacement prevention circuit which prevents displacement of a supplied voltage level for each of the non-selected column selection lines at the time of readout.

36 Claims, 33 Drawing Sheets

(a)

Distance from Bit Line Drive Circuit (Bit Line Length)

(b)

(a)

(b)

(a)

(d)

(b)

(e)

(c)

- ▨ High Resistance
- ▢ Low Resistance
- ○ Selected Memory Cell b (a)

- ▨ High Resistance
- ▢ Low Resistance
- ○ Selected Memory Cell b (d)

- ▨ High Resistance
- ▢ Low Resistance
- ○ Selected Memory Cell b (b)

- ▨ High Resistance
- ▢ Low Resistance
- ○ Selected Memory Cell b (e)

- ▨ High Resistance
- ▢ Low Resistance
- ○ Selected Memory Cell b (c)

- ▨ High Resistance
- ▢ Low Resistance
- ○ Selected Memory Cell c (a)

- ▨ High Resistance
- ▢ Low Resistance
- ○ Selected Memory Cell c (d)

- ▨ High Resistance
- ▢ Low Resistance
- ○ Selected Memory Cell c (b)

- ▨ High Resistance
- ▢ Low Resistance
- ○ Selected Memory Cell c (e)

- ▨ High Resistance
- ▢ Low Resistance
- ○ Selected Memory Cell c (c)

| ▨ | High Resistance |
|---|---|
| ▢ | Low Resistance |
| ○ | Selected Memory Cell d |

(a)

| ▨ | High Resistance |
|---|---|
| ▢ | Low Resistance |
| ○ | Selected Memory Cell d |

(d)

| ▨ | High Resistance |
|---|---|
| ▢ | Low Resistance |
| ○ | Selected Memory Cell d |

(b)

| ▨ | High Resistance |
|---|---|
| ▢ | Low Resistance |
| ○ | Selected Memory Cell d |

(e)

| ▨ | High Resistance |
|---|---|
| ▢ | Low Resistance |
| ○ | Selected Memory Cell d |

(c)

SEMICONDUCTOR MEMORY DEVICE

CROSS REFERENCE TO RELATED APPLICATIONS

This Nonprovisional application claims priority under 35 U.S.C. §119(a) on Patent Applications No. 2004-020749, No. 2004-094057 and 2004-313648 filed in Japan on Jan. 29, 2004, Mar. 29, 2004 and Oct. 28, 2004 respectively, the entire contents of which are hereby incorporated by reference.

BACKGROUND OF THE INVENTION

1. Field of the Invention

The present invention relates to a semiconductor memory device having a cross-point type of memory cell array in which memory cells are arranged in the row and column directions, each memory cell in the same row has one end connected to the same row selection line, and each memory cell in the same column has the other end connected to the same column selection line.

2. Description of the Related Art

Recently, development has been progressed for a cross-point type of semiconductor memory device (referred to as the cross-point memory hereinafter) which provides a memory cell array by connecting memory elements directly to a row selection line (referred to as the data line hereinafter) and to a column selection line (referred to as the bit line hereinafter) in the memory cells without providing a selection element other than the memory elements (refer to Japanese Unexamined Patent Publication No. 2002-8369, for example).

According to "method of detecting equal voltage for resistive cross-point memory cell array" disclosed in the Japanese Unexamined Patent Publication No. 2002-8369, a resistance state of a memory cell of a MRAM (Magnetic Random Access Memory) is detected by supplying a predetermined voltage to each data line and bit line. According to this document, when a selected memory cell is read, a first voltage is applied to the selected data line, and a second voltage lower than the first voltage is applied to the selected and non-selected bit lines and non-selected data lines to detect the resistance state, that is, a memory state of the selected memory cell.

FIG. 24 is a circuit diagram showing a memory cell array of a conventional cross-point memory and set levels and current paths of a supplied voltage to data lines and bit lines. According to the cross-point memory shown in FIG. 24, when the selected memory cell is read, a third voltage V2 is applied to a selected bit line, and a fourth voltage V1 higher than the third voltage V2 is applied to selected and non-selected data lines and non-selected bit lines to detect a resistance state of the selected memory cell.

FIG. 24 shows the case where the resistance state of the memory cell positioned at intersection of a data line D0 with a bit line B0 is determined by reading a current of the selected data line D0.

FIG. 25 shows voltage setting and a current path of each data line and each bit line when a resistance value of the memory cell at intersection of the data line D0 with the bit line B0 is read. Referring to FIG. 25, like the voltage setting in the above Japanese Unexamined Patent Publication No. 2002-8369, when a selected memory cell is read, a first voltage V1 is applied to a selected data line and a second voltage V2 lower than the first voltage V1 is applied to selected and non-selected bit lines and non-selected data lines to detect a resistance state of the selected memory cell. In this case, the resistance state of the desired memory cell is determined by reading a current of the bit line B0.

FIG. 26 shows current paths of leak currents $I_{leak}0$, $I_{leak}1, \ldots, I_{leak}k$ which are generated when a readout current Id of a memory cell Md is measured. Reference character M virtually designates an ampere meter which measures a current IM in the selected data line. In a readout state shown in FIG. 26, a voltage applied to the bit lines and data lines are set in the same manner shown in FIG. 24. In this case, a readout current Id of a memory cell Md is as shown by the following equation (1). In addition, a symbol of operation $\Sigma_{i=0 \sim k}$ designates arithmetic sum in a range i=0~k in this specification.

$$Id = IM - \Sigma_{i=0 \sim k} I_{leak} i \qquad (1)$$

In addition, FIG. 27 shows current paths and directions of the leak currents $\Sigma_{i=0 \sim k} I_{leak} i$ which are generated when a readout current Id1 of a memory cell Md1 is measured, and directions of the leak currents $\Sigma_{i=0 \sim k} I_{leak} 2i$ which are generated when a readout current Id2 of a memory cell Md2 is measured. In addition, in a readout state shown in FIG. 27, voltages applied to the bit lines and the data lines are set like in the case shown in FIG. 24. In this case, when a resistance value of the memory cell Md1 is low in the memory cells connected to the selected bit line, a voltage of a data line D1 drops because of voltage division corresponding to a resistance ratio between an on resistance value of a driver which drives the data line and a resistance value of the memory cell Md1.

Therefore, since the voltage of a d1A at intersection of the memory cell Md1 with the data line D1 is lower than the another data line voltage, a leak current which flows from each bit line to the memory cell Md1 is generated. That is, the leak current (passing through the non-selected memory cells) $\Sigma_{i=0 \sim k} I_{leak} 1i$ which flows from each bit line toward the memory cell Md1 through the data line D1 is generated. In this case, a relation between the readout current Id1 of the memory cell Md1 and a measurement current IM1 in the data line D1 is as shown by the following equation (2). Reference character M1 in FIG. 27 virtually designates an ampere meter which measures the current IM1.

$$IM1 = Id1 - \Sigma_{i=0 \sim k} I_{leak} 1i \qquad (2)$$

In addition, when a resistance value of the memory cell Md2 is high in the memory cells connected to the selected bit line, a voltage of the data line D2 rises because of voltage division corresponding to a resistance division ratio between the on resistance value of the driver which drives the data line and a resistance vale of the memory cell Md2.

Therefore, since the voltage of a d2A at intersection of the memory cell Md2 with the data line D2 is higher than the another data line voltage, a leak current (passing through the non-selected memory cells) $\Sigma_{i=0 \sim k} I_{leak} 2i$ flows from the data line D2 toward each bit line. That is, the leak current $\Sigma_{i=0 \sim k} I_{leak} 2i$ which flows from the data line D2 toward a memory cell Mdx connected to each data line through each bit line is generated. In this case, a relation between the readout current Id2 of the memory cell Md2 and a measurement current IM2 in the data line D2 is as shown by the following equation (3). Reference character M2 in FIG. 27 virtually designates an ampere meter which measures the current IM2.

$$IM2 = Id2 + \Sigma_{i=0 \sim k} I_{leak} 2i \qquad (3)$$

The reason why the leak current is generated depending on the resistance value of the memory cell to be read is that a hypocritical resistance value exists in the data line and the bit line as shown in FIG. 28. More specifically, the hypocritical resistance value is a resistance value at the time of driving of drivers which drives the data line and the bit line.

FIG. 28 shows the case where voltages applied to the data lines and the bit lines are set in the same manner as in FIG. 24. First, as shown in FIG. 28, a driver A is necessary to set the voltage at the data line and the bit line. When this driver A is driven, on resistance is provided (assumed that the resistance value is R). When resistance values of the memory cells on the selected bit lines in the memory cell array such as R1, R2, R3 and R4 are different from each other, each voltage Vdi (i=1 to 4) of data lines 1 to 4 is shown by the following equation (4), where it is assumed that a driving voltage of each data line is V1 and a voltage on the selected bit line is V2'.

$$Vdi=(V1-V2')\times Ri/(Ri+R) \qquad (4)$$

As shown in the equation (4), as Ri is changed, the voltage Vdi of each data line is also changed. Therefore, the voltage of each data line fluctuates depending on the resistance value of the memory cells on the selected bit line, so that the leak current is generated.

Next, a case where the memory cell array is accessed (selected) by the bank will be described with reference to FIG. 29. FIG. 29 shows that the memory cell array is divided into a plurality of banks. In this case, in addition to the on resistance of the driver described with reference to FIG. 28, on resistance of a bank selection transistor BSi is added.

Therefore, voltage fluctuation of the data line becomes larger as compared with the case of the single memory cell array constitution shown in FIG. 28. When a memory cell is read in a memory cell array 10 (bank 1) shown in FIG. 29, it is necessary to turn on the transistor in a transistor column BS1 (bank selection transistor column) which selects the memory cell array 10 (bank 1). In addition, in order not to select other memory cell arrays MR0, MR2, and MR3 (banks 0, 2, and 3), it is necessary to turn off all of the transistors of the bank selection transistor columns BS0, BS2 and BS3. Thus, when the transistor in the bank selection transistor column BS1 is turned on, on resistances Rbs1, Rbs2, . . . , Rbsx of the transistors are provided on the data line. Therefore, a voltage Vdij of the data line in each bank shown in FIG. 29 is shown by the following equation (5), where reference character "i" designates an order of the data line in the same bank and "j" designates an order of the bank. In addition, reference character Rij designates a resistance value of the memory cell connected to the selection bit line and the i-th data line in the bank j.

$$Vdij=(V1-V2')\times Rij/(Rij+R+Rbsj) \qquad (5)$$

As shown in the equation (5), the voltage Vdij of the data line in each bank shown in FIG. 29 fluctuates larger than the voltage of the data line shown in the equation (4).

FIG. 30 shows an example of a data line driver-amplifier circuit shown in FIG. 28. The data line driver-amplifier circuit applies a predetermined voltage (power supply voltage Vcc, for example) to selected and non-selected data lines. A P-channel MOSFET (referred to as the PMOS hereinafter) (P0) in the data line driver-amplifier circuit supplies a drive current Ix which accesses a memory cell from the data line. When a resistance value of the accessed memory cell is great, since the current supplied from the PMOS (P0) of the data line drive circuit in FIG. 30 to the memory cell array is reduced, the gate voltage of the PMOS becomes high. Alternatively, when the resistance value of the accessed memory cell is small, since the current supplied from the PMOS (P0) to the memory cell array is increased, the gate voltage of the PMOS(P0) becomes low. The gate voltage of the PMOS (P0) is amplified by PMOS (P1) in a data line current amplification circuit and a load transistor (N-channel MOSFET) in FIG. 30 and an amplified voltage V0 is output.

FIG. 31 shows an example of the bit line drive circuit in FIG. 28. The bit line drive circuit comprises a load circuit P0 of a PMOS and a column selection circuit comprising two CMOS transfer gates. When a bit line is selected by a decode output of a column address decoder (column decoder), the column selection circuit turns on the right CMOS transfer gate in FIG. 31, and supplies a ground voltage Vss to the bit line and when the bit line is not selected, it turns on the left CMOS transfer gate in FIG. 31 and supplies a voltage which drops from the power supply voltage Vcc by a threshold voltage of the PMOS (P0). In addition, the voltage supplied to the bit line when the bit line is not selected is the same level as that supplied to the data line.

As described above, the current IM1 measured in the data line D1 in FIG. 27 is shown by the equation (2) and the current IM2 measured in the data line D2 in FIG. 27 is shown by the equation (3). As shown in the equations (2) and (3), when the predetermined voltage is applied to each of the data line and the bit line at the time of readout, using the conventional data line driver-amplfier circuit and the conventional bit line driver, the flowing direction of the leak current is changed depending on the resistance value of the memory cell to be read. Thus, when the leak current value is great, it becomes difficult to calculate the memory cell readout currents Id1 and Id2 from the currents IM1 and IM2 measured on the data lines.

As described above, FIG. 25 showed the set level of the voltage supplied to the data line and the bit line and its path at that time in "method of detecting equal voltage for resistive cross-point memory cell array" disclosed in Japanese Unexamined Patent Publication No. 2002-8369. In addition, FIG. 32 shows flowing directions of the leak currents when a resistance value of a selected memory cell is great, in a case where the voltage setting level shown in FIG. 25 is employed.

Referring to FIG. 32, when the resistance value of the selected memory cell is great, the direction of the memory cell current Id1 flowing in the bit line B0 is the same as the directions of the leak currents $I_{leak}0$, $I_{leak}1$, . . . $I_{leak}k$. Furthermore, as shown in FIG. 27, when the resistance value of the selected memory cell is small, the direction of the memory cell current Id2 flowing in the bit line B0 is opposite to the directions of the leak currents $I_{leak}00$, $I_{leak}01$, . . . $I_{leak}0k$. In this case, since the values of the measured currents IM1 and IM2 are greatly changed according to the leak current value, the memory cell currents Id1 and Id2 cannot be correctly detected. There is a problem in which the leak current flows back depending on the resistance value of the selected memory cell even with the method of setting the voltage supplied to the data line and the bit line in FIG. 31, similar to the leak current shown in FIGS. 32 and 33.

SUMMARY OF THE INVENTION

The present invention has been made in view of the above problems, and it is an object of the present invention to reduce a leak current which depends on a resistance value of a memory cell to be read out and improve a readout margin. It is another object of the present invention to improve a readout margin by a readout circuit in view of an influence of a leak current which depends on a resistance value of a memory cell to be read.

A semiconductor memory device of the present invention comprises a memory cell array in which a plurality of memory cells consisting of variable resistive elements which store information by a change of electric resistance are arranged in the row direction and the column direction, a plurality of row selection lines extended in the row direction and a plurality of column selection lines extended in the column direction are provided, each of the memory cells in the same row has one end of the variable resistive element connected to the same row selection line, and each of the memory cells in the same column has the other end of the variable resistive element connected to the same column selection line. The semiconductor memory device is characterized by first characteristics in that it comprises a column readout voltage supply circuit which supplies a predetermined first voltage when readout is selected and supplies a predetermined second voltage which is different from the fist voltage when the readout is not selected, to each column selection line, a row readout voltage supply circuit which supplies the second voltage to each row selection line at the time of readout, a sense circuit which detects a current flowing in the selected row selection line separately from a current flowing in the non-selected row selection lines to detect an electric resistance state of the selected memory cell at the time of readout, and in that it further comprises at least either a column voltage displacement prevention circuit which prevents displacement of a supplied voltage level for each of the non-selected column selection lines at the time of readout or a row voltage displacement prevention circuit which prevents displacement of a supplied voltage level for at least the selected row selection line at the time of readout. In addition, the row voltage displacement prevention circuit may prevent displacement of a supplied voltage level for each of the row selection lines at the time of readout.

According to the first characteristics of the semiconductor memory device, since the displacement of the voltage level of the column selection line is prevented by the column voltage displacement prevention circuit, the leak current induced by the displacement of the voltage level of the column selection line can be reduced, so that a readout margin can be improved. Furthermore, in stead of or in addition to the column voltage displacement prevention circuit, when the row voltage displacement prevention circuit is provided, the leak current induced by the displacement of the voltage level of the row selection line can be reduced, so that the readout margin is further improved. Especially, when both column voltage displacement prevention circuit and row voltage displacement prevention circuit are provided, the readout margin can be improved more effectively.

The semiconductor memory device according to the first characteristics is characterized by second characteristics in that the plurality of memory cell arrays are arranged at least in the row direction, each of the plurality of row selection lines of each memory cell array is connected to a corresponding global row selection line through an array selection transistor for selecting the memory cell array, the row readout voltage supply circuit is constituted so as to supply the second voltage to each of the plurality of row selection lines of the memory cell array selected by the array selection transistor through the corresponding global row selection line, and the row voltage displacement prevention circuit is provided between the row selection line and the array selection transistor.

According to the second characteristics of the semiconductor memory device, since the row voltage displacement prevention circuit is directly connected to the row selection line in the constitution in which the plurality of memory cell arrays are arranged in the row directions and each of the plurality of row selection lines in each memory cell array is connected to the row readout voltage supply circuit through a corresponding global row selection line, the displacement of the voltage level can be effectively prevented for the row selection line in each memory cell array. That is, when the row voltage displacement prevention circuit is connected to the row selection line through the array selection transistor, although the displacement of the voltage level can be effectively prevented for the global row selection line, the preventing effect for the row selection lines in each memory cell array is inhibited by the array selection transistor. However, according to the second characteristics, the above problem can be solved.

Furthermore, the semiconductor memory device according to the present invention is characterized by third characteristics in that the sense circuit is constituted so as to compare a current flowing in the selected row selection line, with a current of a middle state between a first current state in which a current flowing in the row selection line which is selected when a high-resistance memory cell whose electric resistance is in a high-resistance state is read becomes a maximum state depending on a distribution pattern of an electric resistance state of the other non-selected memory cells in the memory array, and a second current state in which a current flowing in the row selection line which is selected when a low-resistance memory cell whose electric resistance is in a low-resistance state is read becomes a minimum state depending on a distribution pattern of an electric resistance state of the other non-selected memory cells in the memory array.

Still further, according to third characteristics of the semiconductor memory device, it is preferable that the sense circuit comprises a first current and voltage conversion circuit part which converts the current flowing in the selected row selection line to a readout voltage level, a first reference current generation circuit which implements the first current state approximately, a second reference current generation circuit which implements the second current state approximately, a second current and voltage conversion circuit part which converts a current in a middle state between the first current state and the second current state to a reference voltage level, and a comparison circuit which compares the readout voltage level with the reference voltage level.

According to the third characteristics of the semiconductor memory device, since the readout current of the row selection line connected to the memory cell to be read can be compared with the reference current value which flows in the row selection line in a middle state when the leak current influence reaches the maximum in the two resistance states of the memory cell to be read, the maximum readout margin can be provided for each of the two resistance states of the memory cell to be read, so that the readout margin can be improved. Especially, the readout margin is further improved by combining the third characteristics with the first characteristics.

The third characteristics of the semiconductor memory device is characterized by fourth characteristics in that it comprises a first reference current generation circuit which implements the first current state approximately, and a second reference current generation circuit which implements the second current state approximately, in which each of the first reference current generation circuit and the second reference current generation circuit comprises a reference memory cell array having a constitution equivalent to the memory cell array comprising reference memory cells consisting of the same variable resistive elements as the memory cells, a reference column readout voltage supply circuit having a constitution equivalent to the column readout voltage supply circuit, and a reference row readout voltage supply circuit having a constitution equivalent to the row readout voltage supply circuit, the distribution pattern of the electric resistance state of the reference memory cell in the reference memory cell array of the first reference current generation circuit is set at a first distribution pattern in which the current flowing in the selected row selection line in the reference memory cell array becomes the first current state, and the distribution pattern of the electric resistance state of the reference memory cell in the reference memory cell array of the second reference current generation circuit is set at a second distribution pattern in which the current flowing in the selected row selection line in the reference memory cell array becomes the second current state.

According to the fourth characteristics of the semiconductor memory device, since the first reference current generation circuit which implements the first current state approximately and the second reference current generation circuit which implements the second current state approximately in the second characteristics can be surely and easily implemented by the two reference memory cell arrays which are set in the different distribution patterns, the effect of the second characteristics of the semiconductor memory device can be more specifically provided.

The fourth characteristics of the semiconductor memory device is characterized by a fifth characteristics in that it comprises the plurality of memory cell arrays, and at least two sense circuits for memory cell arrays commonly use the first reference current generation circuit and the second reference current generation circuit.

According to the fifth characteristics of the semiconductor memory device, since the first reference current generation circuit which implements the first current state approximately and the second reference current generation circuit which implements the second current state approximately are commonly used in the plurality of memory cell arrays, a circuit size for the first reference current generation circuit and the second reference current generation circuit (that is, an occupied area on a semiconductor chip) can be reduced, and the semiconductor memory device can be provided at low cost.

DESCRIPTION OF PREFERRED EMBODIMENTS

An embodiment of a semiconductor memory device according to the present invention (referred to as the device of the present invention hereinafter) will be described with reference to the accompanying drawings.

Embodiment 1

Figure 1:
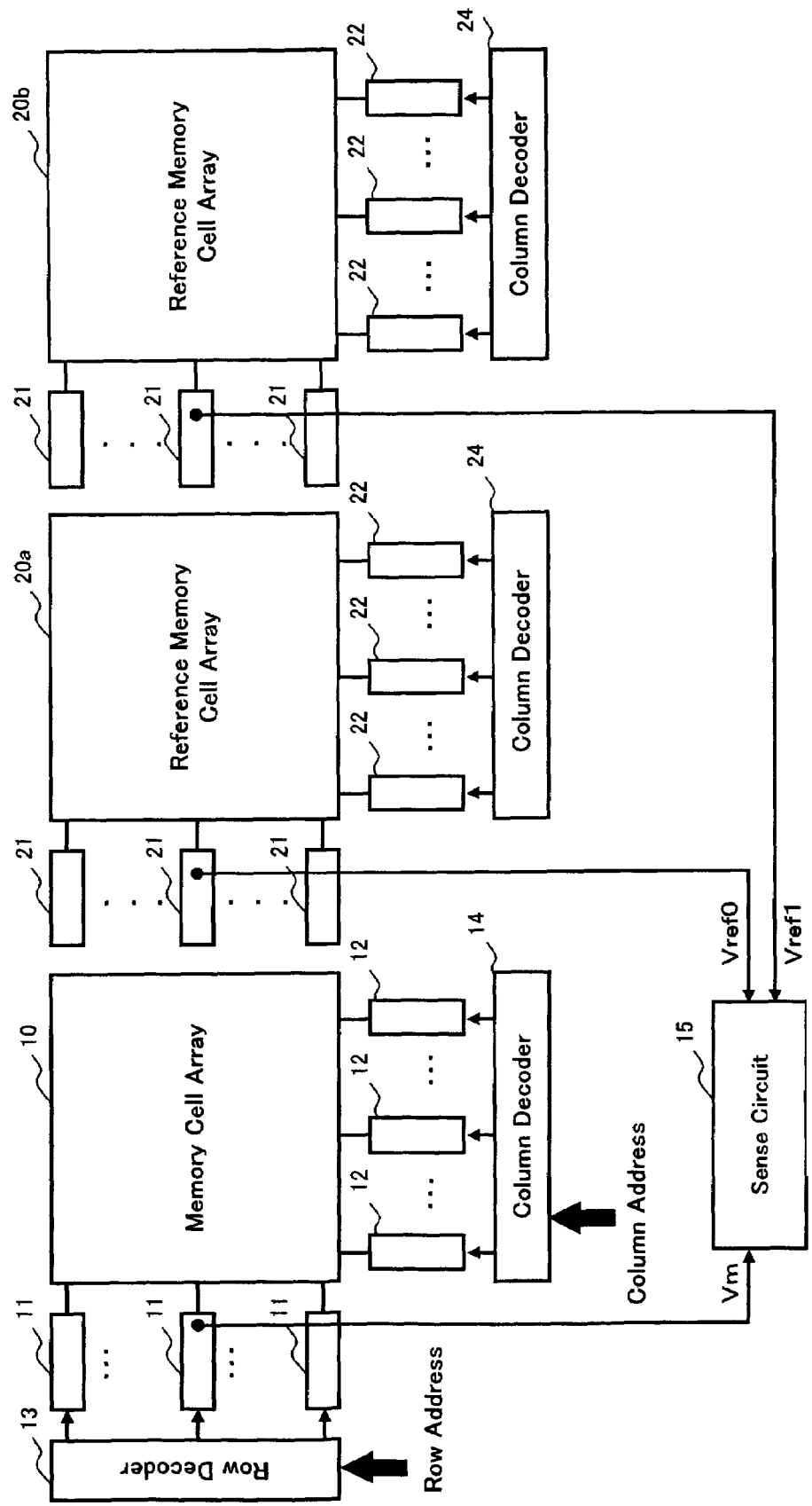
FIG. 1 is a circuit block diagram showing one embodiment of a semiconductor memory device according to the present invention.

FIG. 1 is a block diagram showing a main part regarding a readout operation of a memory cell in a memory cell array 10 in the device of the present invention. The memory cell array 10 has a cross-point type of memory cell array structure, in which memory cells (not shown) comprising variable resistive elements which store information by a change of electric resistance are aligned in the form of array in the row and column directions, a plurality of data lines (row selection line) extending in the row direction and a plurality of bit lines (column selection line) extending in the column direction are provided, each memory cell in the same row has one end of the variable resistive element connected to the same data line, and each memory cell in the same column has the other end of the variable resistive element connected to the same bit line. For example, the memory cell array 10 has an array size 16×16 in row and column and in this case, each of the number of data lines and bit lines is 16.

As shown in FIG. 1, the device of the present invention comprises a data line drive circuit 11 which drives each data line individually, a bit line drive circuit 12 which drives each bit line individually, a row decoder 13 which selects a data line connected to a memory cell which is an object to be read among the plurality of data lines, and a column decoder 14 which selects a bit line connected to the memory cell which is the object to be read among the plurality of bit lines for the memory cell array 10.

The device of the present invention further comprises two reference memory cell arrays 20a and 20b which have the same array size and use the same memory cells as the memory cell array 10, and a sense circuit 15 which generates a reference voltage level from output voltages Vref0 and Vref1 of the reference memory arrays 20a and 20b and generates a readout voltage level from a voltage level Vm of a selection data line of the memory cell array 10 and compares the readout voltage level with the reference voltage level to determine a memory state (resistance state) of the selected memory cell.

Each of the two reference memory cell arrays 20a and 20b comprises a data line drive circuit 21, a bit line drive circuit 22 and a column decoder 24 which have the same circuit constitution as the data line drive circuit 11, the bit line drive circuit 12 and the column decoder 14 which are provided for the memory cell array 10 respectively.

Figure 2:
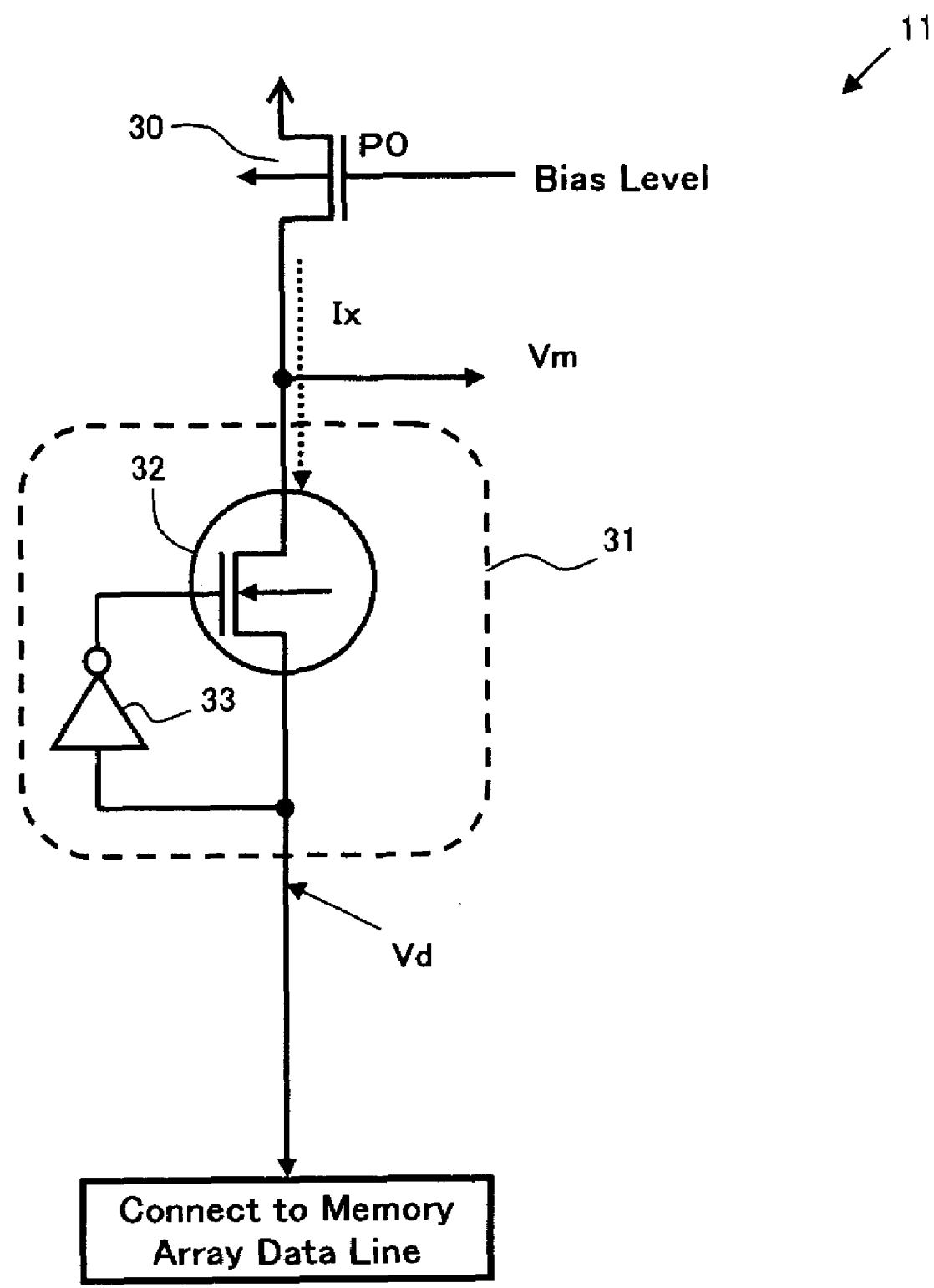
FIG. 2 is a circuit diagram showing one example of a data line drive circuit, a row readout voltage supply circuit, and a row voltage displacement prevention circuit in the semiconductor memory device according to the present invention.

As shown in FIG. 2, the data line drive circuit 11 provided for each data line comprises a row readout voltage supply circuit 30 which supplies a second voltage (a power supply voltage Vcc, for example) at the time of readout, and a row voltage displacement prevention circuit 31 which prevents displacement of a level of voltage supplied from the row readout voltage supply circuit 30. More specifically, the row readout voltage supply circuit 30 comprises a PMOS which is set such that a gate level is fixed to a predetermined bias level to operate in a saturation region, and a source of the PMOS is connected to the second voltage, and a drain thereof is connected to an output node which outputs the voltage level Vm of the selected data line. The row voltage displacement prevention circuit 31 comprises a feedback circuit part comprising an N-channel MOSFET 32 (referred to as NMOS hereinafter) in which a source is connected to the data line, and a drain is connected to the output node, and an inverter 33 which adjusts on resistance of the NMOS 32 by changing a gate voltage of the NMOS 32 depending on a voltage level Vd of the data line. As shown in FIG. 2, the voltage level Vd supplied to the data line is provided by subtracting a voltage dropped amount in the PMOS 30 and the row voltage displacement prevention circuit 31 from the second voltage (the power supply voltage Vcc, for example). More specifically, it is adjusted by an inversion level of the inverter 33 and a threshold voltage of the NMOS 32 in the row voltage displacement prevention circuit 31.

Figure 3:
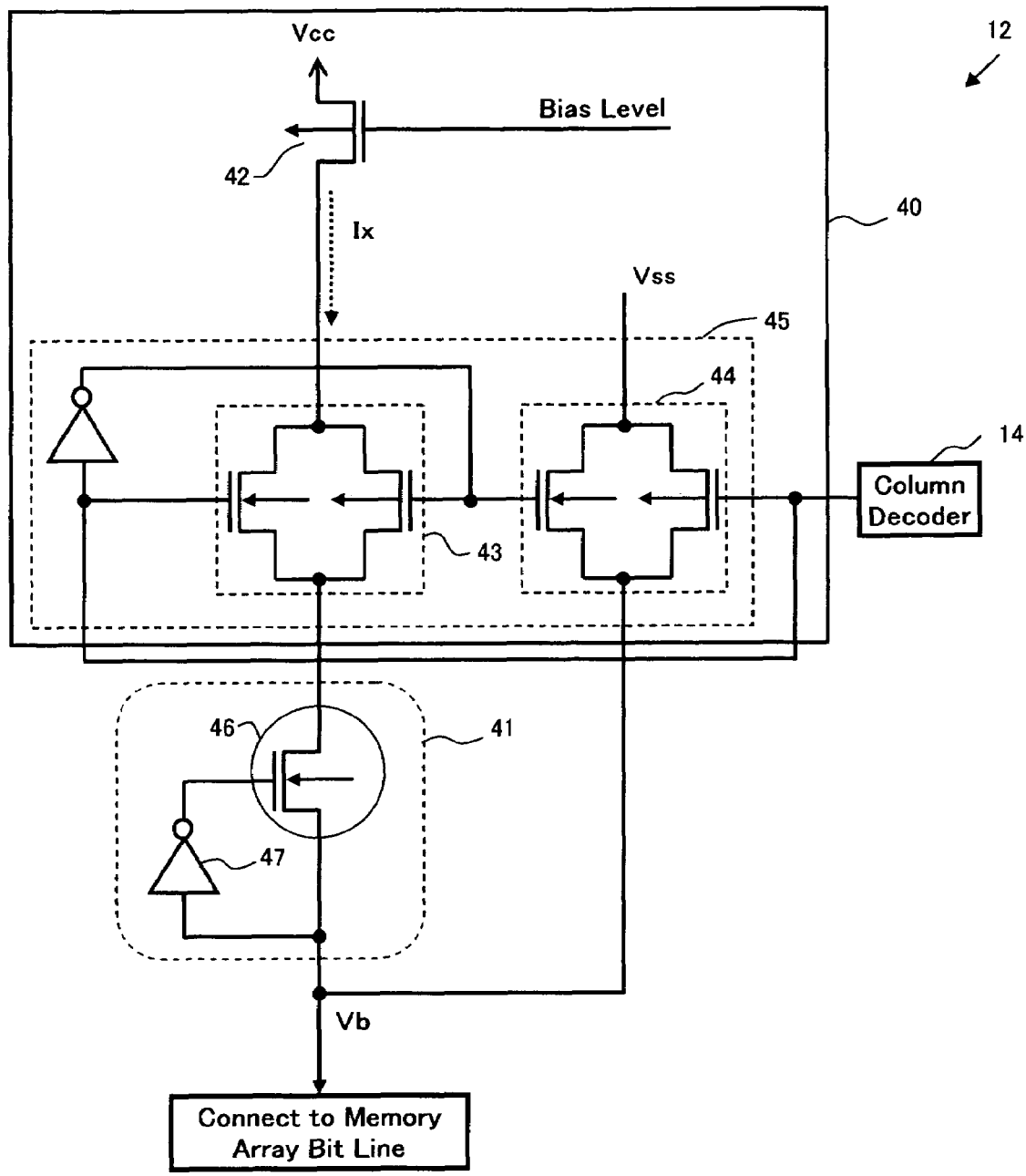
FIG. 3 is a circuit diagram showing one example of a bit line drive circuit, a column readout voltage supply circuit, and a column voltage displacement prevention circuit in the semiconductor memory device according to the present invention.

As shown in FIG. 3, the bit line drive circuit 12 provided for each bit line comprises a column readout voltage supply circuit 40 which supplies a predetermined first voltage (the ground voltage Vss, for example) when the readout is selected, and supplies a second voltage (the power supply voltage Vcc, for example) which is different from the first voltage when the readout is not selected, and a column voltage displacement prevention circuit 41 which prevents displacement of the level of voltage supplied from the column readout voltage supply circuit 40. More specifically, the column readout voltage supply circuit 40 comprises a load circuit comprising a PMOS 42, and a column selection circuit 45 comprising two CMOS transfer gates 43 and 44. According to the column selection circuit 45, when the bit line is selected by a decode output of the column decoder 14, the right CMOS transfer gate 44 turns on and the first voltage is supplied to the bit line, and when the bit line is not selected, the left CMOS transfer gate 43 turns on and the second voltage is supplied through the PMOS 42, the CMOS transfer gate 43 and the column voltage displacement prevention circuit 41. The PMOS 42 is set such that a source is connected to the power supply voltage Vcc, a drain is connected to one end of the CMOS transfer gate 43, and a gate is fixed to a predetermined bias level, to operate in a saturation region. The other end of the CMOS transfer gate 43 is connected to the bit line through the column voltage displacement prevention circuit 41. According to the CMOS transfer gate 44, one end is connected to the ground voltage Vss and the other end is connected to the bit line. The column voltage displacement prevention circuit 41 comprises a feedback circuit part comprising an NMOS 46 in which a source is connected to the bit line and a drain is connected to the other end of the CMOS transfer gate 43, and an inverter 47 which adjusts on resistance of the NMOS 46 by changing a gate voltage of the NMOS 46 depending on a voltage level Vb of the bit line. As shown in FIG. 3, the voltage level Vb supplied to the bit line when the bit line is not selected is provided by subtracting a voltage dropped amount of the PMOS 42, the CMOS transfer gate 43 and the column voltage displacement prevention circuit 41 from the second voltage (the power supply voltage Vcc, for example). More specifically, it is adjusted by an inversion level of the inverter 47 and a threshold voltage of the NMOS 46 in the column voltage displacement prevention circuit 41. In addition, the second voltage supplied to the non-selected bit line is the same voltage level as the second voltage supplied to the data line.

Figure 26:
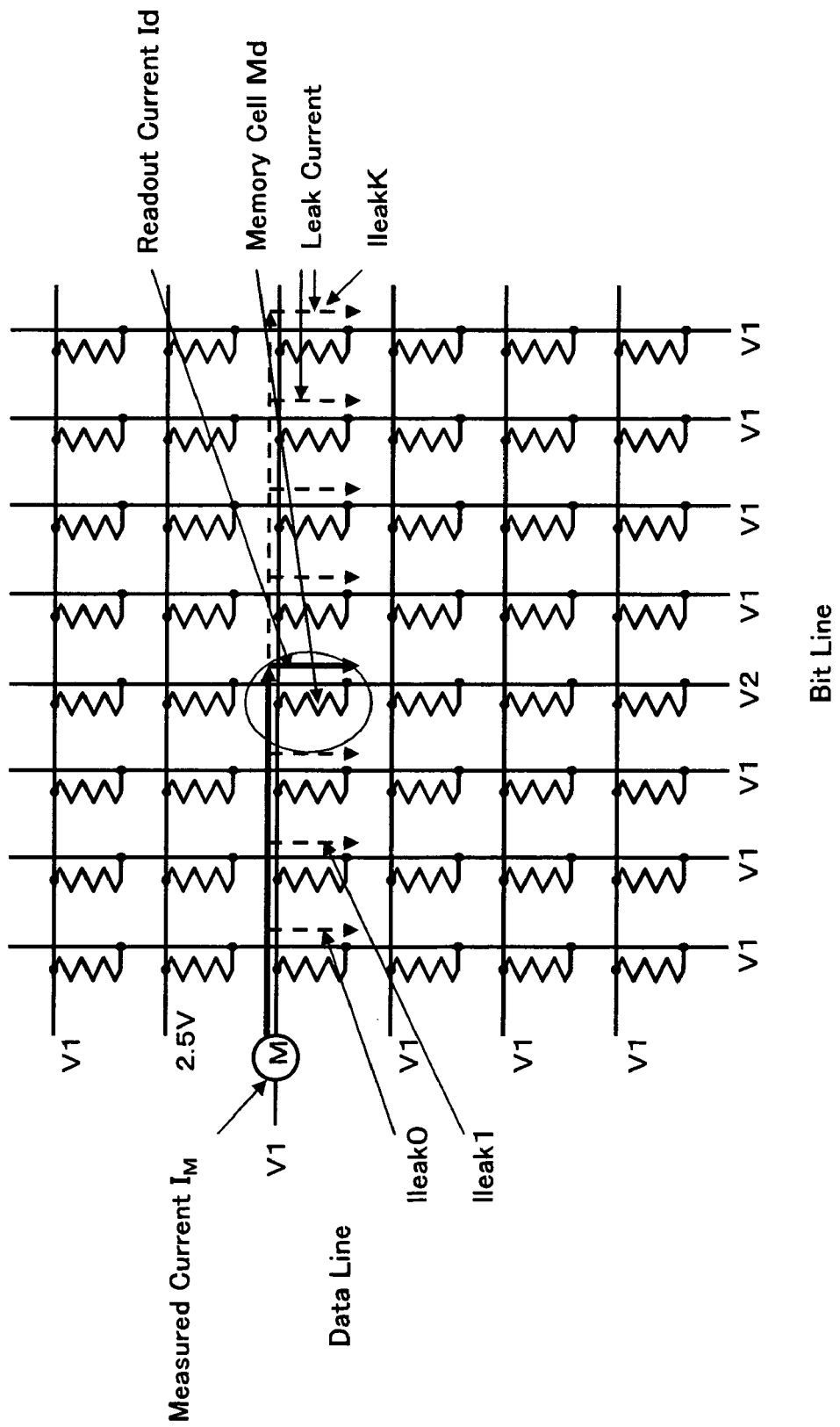
FIG. 26 is a circuit diagram showing a current path of a leak current generated when a readout current Id of a memory cell Md is measured, in the memory cell array of the conventional cross-point memory.
Figure 27:
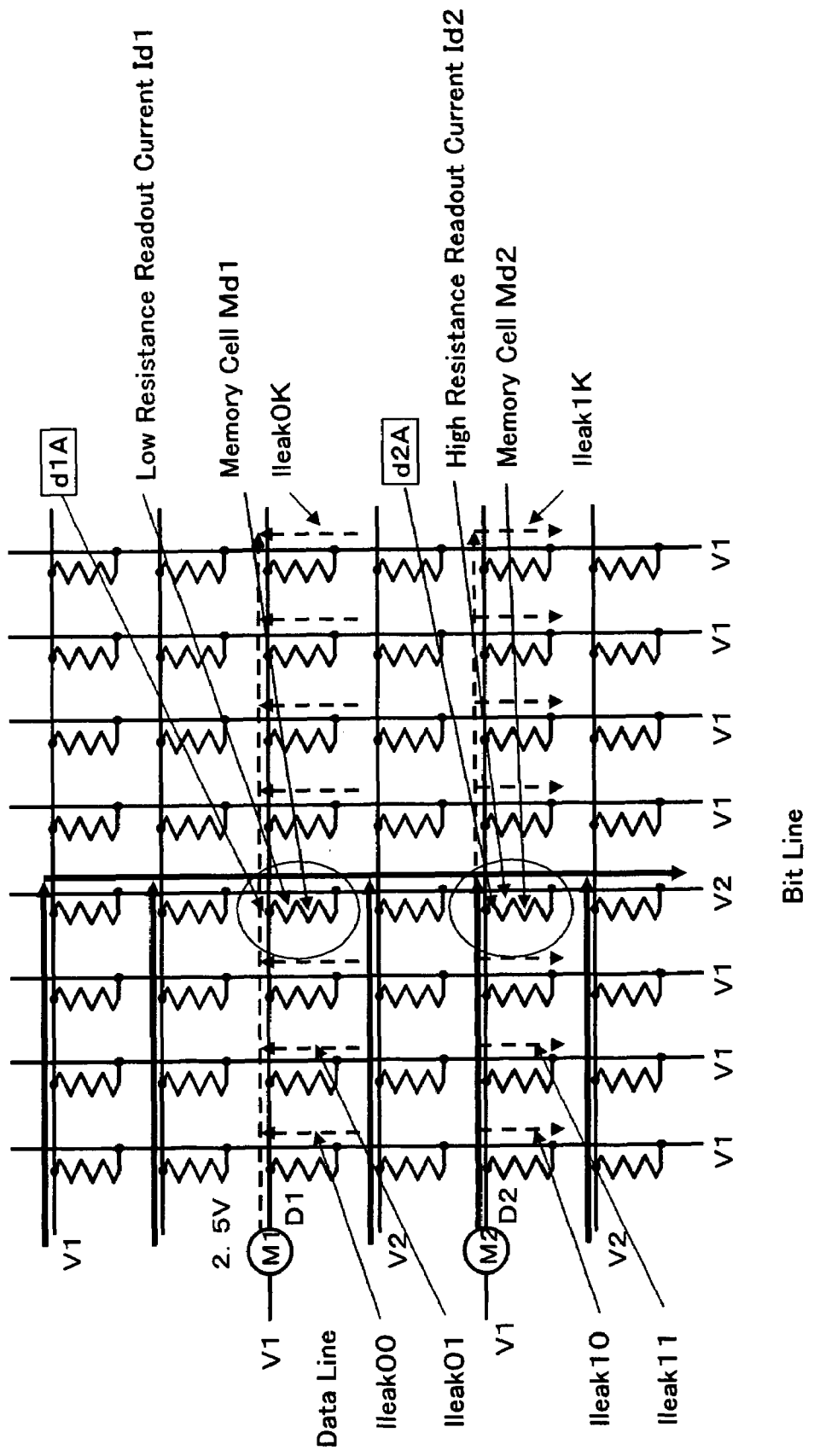
FIG. 27 is a circuit diagram showing current paths and directions of leak currents generated when a readout current Id1 of a memory cell Md is measured and generated when a readout current Id2 of a memory cell Md2 is measured, in the memory cell array of the conventional cross-point memory.
Figure 28:
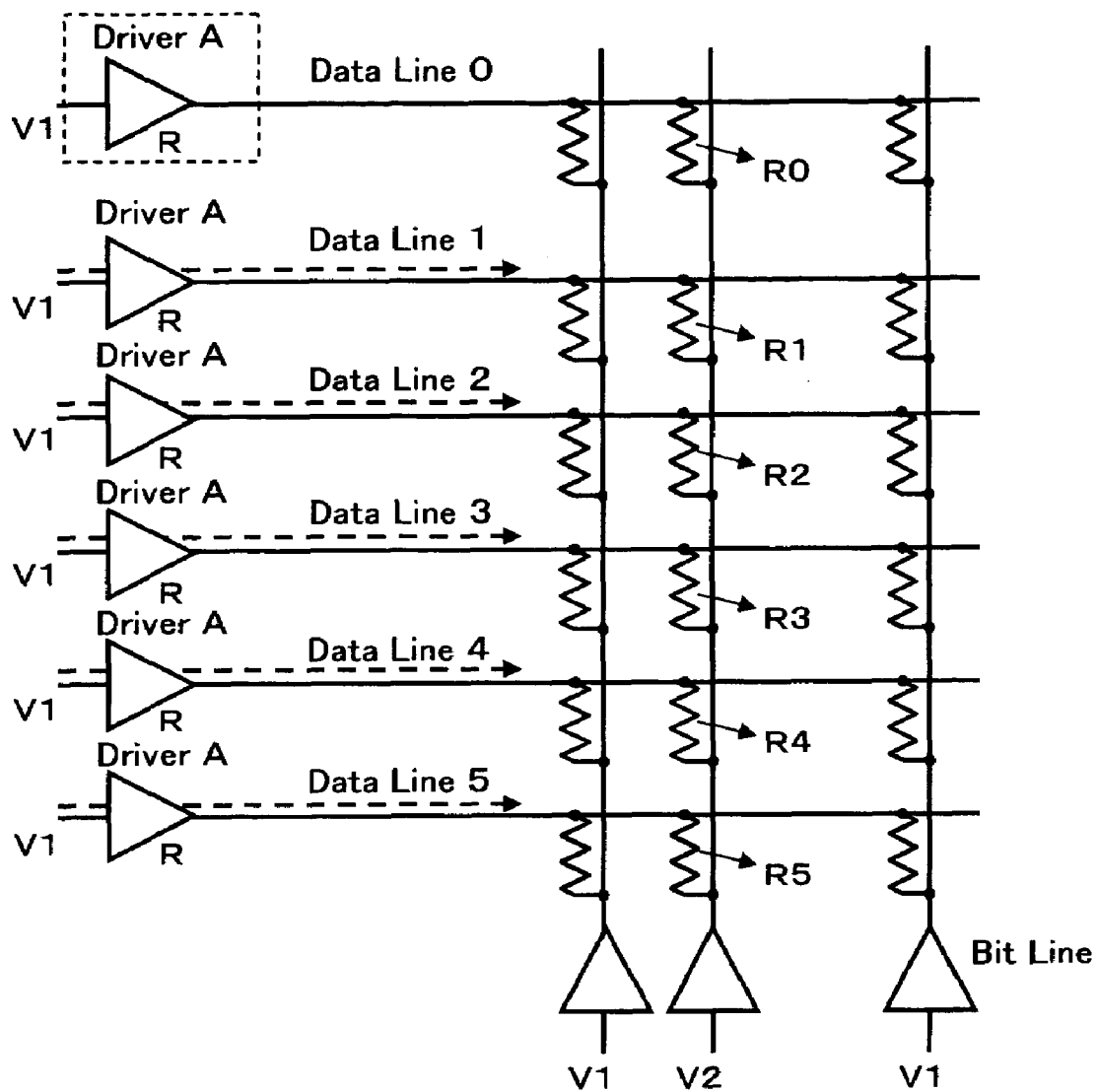
FIG. 28 is a view for explaining a reason why the leak current is generated in the memory cell array of the conventional cross-point memory.

The row voltage displacement prevention circuit 31 shown in FIG. 2 and the column voltage displacement prevention circuit 41 shown in FIG. 3 are provided in order to prevent fluctuation of a current measured in the selected data line (refer to equations (2) and (3)) because of the leak current (a current passing through the non-selected memory cell) which has been described with reference to FIG. 26 or 27 above as a problem of the cross-point type of memory cell array, and to improve a readout margin.

Next, an operation of the row voltage displacement prevention circuit 31 will be described with reference to FIG. 2. When a resistance value of a selected memory cell to be read is high, the voltage on the selected data line rises. When the voltage Vd of that selected data line rises, an input level of the inverter 33 in the row voltage displacement prevention circuit 31 rises and an output level of the inverter 31 drops. Therefore, when the output level of the inverter 31 drops, a voltage between the gate and the source of the NMOS 32 drops, and the on resistance of the NMOS 32 is lowered. Thus, since a driving ability for the selected data line is lowered, a supplying ability of the leak current is also lowered.

Meanwhile, when the resistance value of the selected memory cell is low, since the voltage of the selected data line is lower than the voltage of the data lines connected to other high-resistance memory cells, the leak current is generated from non-selected data line at the high data line voltage level to the selected data line at the low data line voltage level. Thus, when the voltage of the selected data line is lowered, the input level of the inverter 33 in the row voltage displacement prevention circuit 31 drops and the output level of the inverter 33 rises. Therefore, when the output level of the inverter 33 rises, the voltage between the gate and the source of the NMOS 32 becomes high and the on resistance of the NMOS 32 is increased and a driving ability for the selected data line is increased. Thus, since a current supplying ability for the selected data line is enhanced, the above-described current leak to the non-selected data line can be substantially reduced.

As a size of the memory cell array becomes large, the leak current tends to increase regardless of the resistance value of the selected memory cell. Therefore, an effect for reducing the current leak of the row voltage displacement prevention circuit 31 becomes more noticeable in a large memory cell array in which the leak current is likely to be generated.

An operation of the column voltage displacement prevention circuit 41 will be described with reference to FIG. 3. When the voltage of the non-selected bit line is higher than the voltage of the data lines and other non-selected bit lines, the column voltage displacement prevention circuit 41 lowers the voltage level of that non-selected bit line, or when the voltage of that non-selected bit line is lower than the voltage of the data lines and other non-selected bit lines, it raises the voltage level of that non-selected bit line. Since the operation principle is the same as that of the row voltage displacement prevention circuit 31, its description will be omitted.

In the row readout voltage supply circuit 30, a description will be made of a relation between the voltage level Vm of the selected data line output to the output node, that is, a drain voltage of the PMOS which forms the row readout voltage supply circuit 30, and the current flowing on the selected data line measured at the output node, that is, a drain current of that PMOS.

Figure 4:
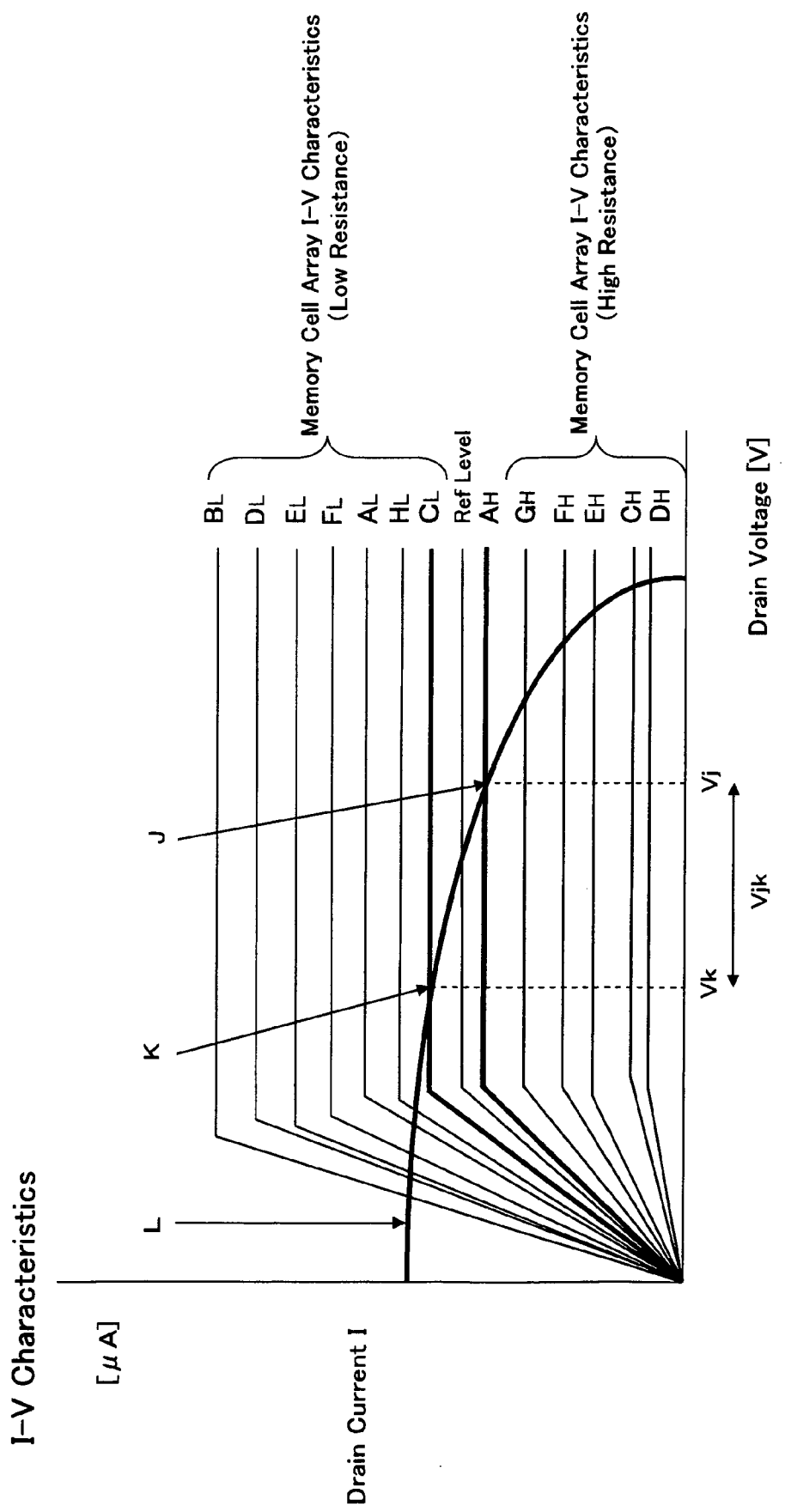
FIG. 4 is a static characteristic view showing load characteristics in which a PMOS operating in a saturation region is load resistance, I-V characteristics of a memory cell array in various kinds of distribution patterns in resistance states of memory cells in the memory cell array, and an output voltage of a row readout voltage supply circuit.

FIG. 4 shows load characteristics (I-V characteristics which is shown by "L" in the drawing) in which the PMOS operating in the saturation region is load resistance, and I-V characteristic (shown by "A" to "H" in the drawing) in the memory cell array in various kinds of distribution patterns (patterns A to H) which shows resistance states of the memory cells in the memory cell array together.

Next, a description will be made of the various distribution patterns (pattern A to H) showing the resistance states of the memory cells in the memory cell array with reference to FIG. 5. Although an array size of 8 rows and 12 columns is shown in FIG. 5 to describe the characteristics of each distribution pattern, this array size is not necessarily an actual array size.

Figure 5:
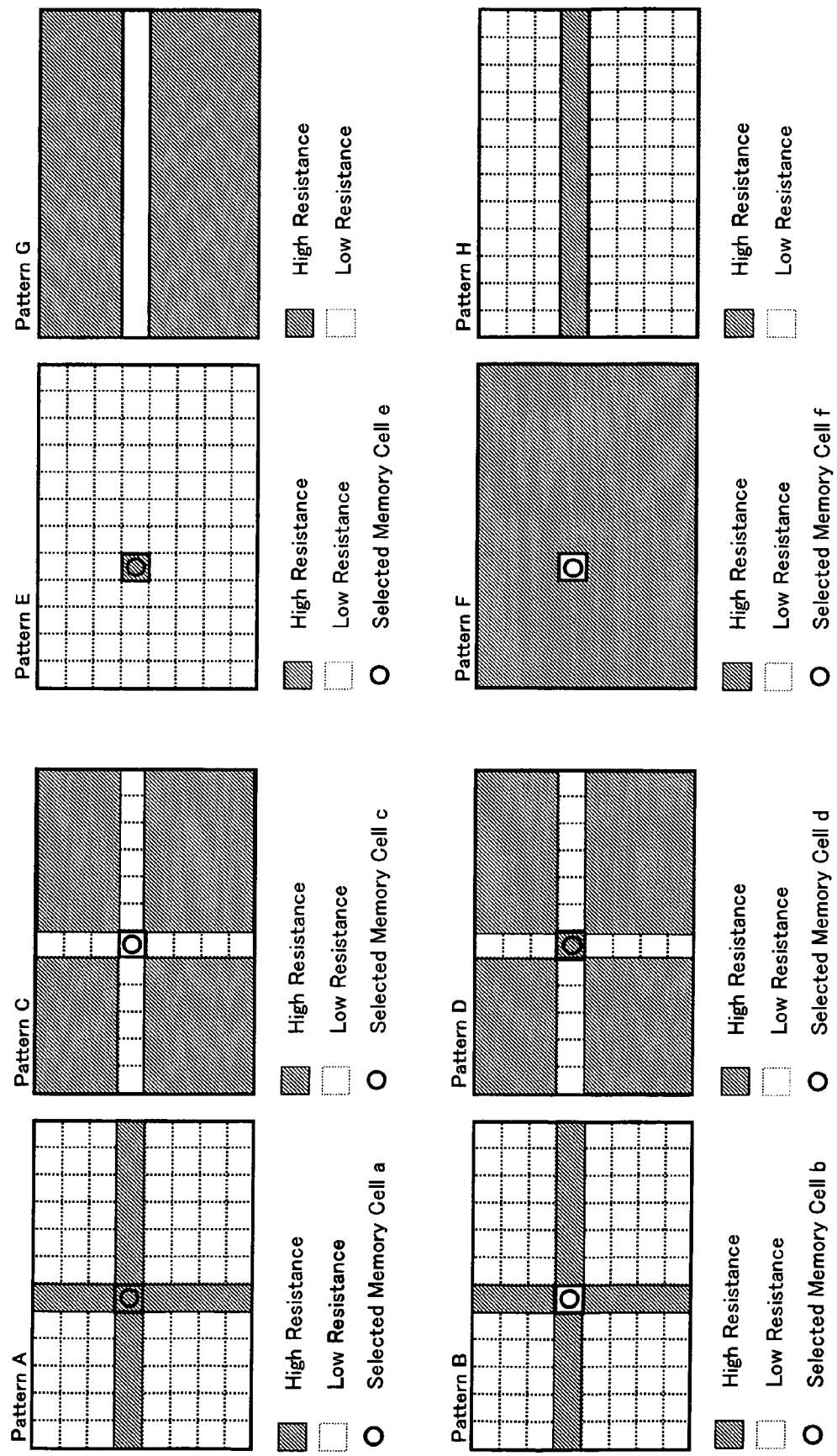
FIG. 5 are views for explaining the various kinds of distribution patterns in resistance states of memory cells in a cross-point type of memory cell array.

Referring to FIG. 5, according to the pattern A, memory cells on any one row connected to one data line and memory cells on any one column connected to one bit line are high in resistance, and memory cells in a region other than the above high-resistance memory cell region are low in resistance. When the memory cell to be selected is high in resistance, if the high-resistance memory cell at intersection of the higher-resistance row with the high-resistance column is read, the leak current value becomes greatest and the readout current value becomes greatest. When the memory cell to be selected is low in resistance, any of the low-resistance memory cells is selected. According to the pattern B, memory cells on any one row connected to one data line, and memory cells on any one column connected to one bit line except for the memory cell which is connected to the above one data line and the above one bit line, are high in resistance, and memory cells in a region other than the region of the high-resistance memory cells are low in resistance. When the memory cell to be selected is high in resistance, any of the high-resistance memory cells is selected. When the memory cell to be selected is low in resistance, if the low-resistance memory cell connected to both above one data line and above one bit line is read, the leak current value becomes greatest and the readout current value for the low-resistance memory cell becomes greatest. According to the pattern C, memory cells on any one row connected to one data line, and memory cells on any one column connected to one bit line are low in resistance, and memory cells at a region except for the region of the above low-resistance memory cells are high in resistance. When the memory cell to be selected is high in resistance, any of the high-resistance memory cells is selected. When the memory cell to be selected is low in resistance, if the low-resistance memory cell at intersection of the above row and the above column is read, the readout current value becomes the smallest. That is, the pattern C is a reversed pattern of the pattern A. According to the pattern D, memory cells on any one row connected to one data line, and memory cells on any one column connected to one bit line except for the memory cell which is connected to both above one data line and above one bit line are low in resistance, and memory cells in a region other than the region of the low-resistance memory cells are high in resistance. When the memory cell to be selected is high in resistance, if the high-resistance memory cell connected to both above one data line and above one bit line is read, the leak current value becomes greatest and the readout current value for the high-resistance memory cell becomes smallest. When the memory cell to be selected is low in resistance, any of the low-resistance memory cells is selected.

According to a pattern E, only one memory cell is high in resistance and other memory cells are low in resistance. When the memory cell to be selected is high in resistance, that one high-resistance memory cell is selected. When the memory cell to be selected is low in resistance, any of the other low-resistance memory cells is selected. According to the pattern F, only one memory cell is low in resistance and other memory cells are high in resistance. When the memory cell to be selected is low in resistance, that one low-resistance memory cell is selected. When the memory cell to be selected is high in resistance, any of the other high-resistance memory cells is selected. That is, the pattern F is the reversed pattern of the pattern E. According to the pattern G, only memory cells on one row connected to one data line are low in resistance and the memory cells on other rows are high in resistance. When the memory cell to be selected is low in resistance, any of the low-resistance memory cells on the above one row is selected. When the memory cell to be selected is high in resistance, any of the high-resistance memory cells on the other rows is selected.

According to the pattern H, only memory cells on one row connected to any one data line are high in resistance and the memory cells on other rows are low in resistance. When the memory cell to be selected is high in resistance, any of the high-resistance memory cells on the above one row is selected. When the memory cell to be selected is low in resistance, any of the low-resistance memory cells on the other rows is selected. That is, the pattern H is the reversed pattern of the pattern G.

A circuit simulation was performed for the above each pattern. As a result, as shown in FIG. 4, when the memory cell to be selected is high in resistance, if the memory cell at intersection of the row with the column in the high-resistance state is read in the pattern A (especially, a pattern A in FIG. 8(b) as will be described below), the readout current value of the high-resistance state becomes greatest, which is the worst case. In addition, when the memory cell to be selected is low in resistance, if the memory cell at intersection of the row with the column in the low-resistance state is read in the pattern C (especially, a pattern C in FIG. 10(b) as will be described below), the readout current value in the low-resistance state becomes smallest, which is the worst case.

Figure 6:
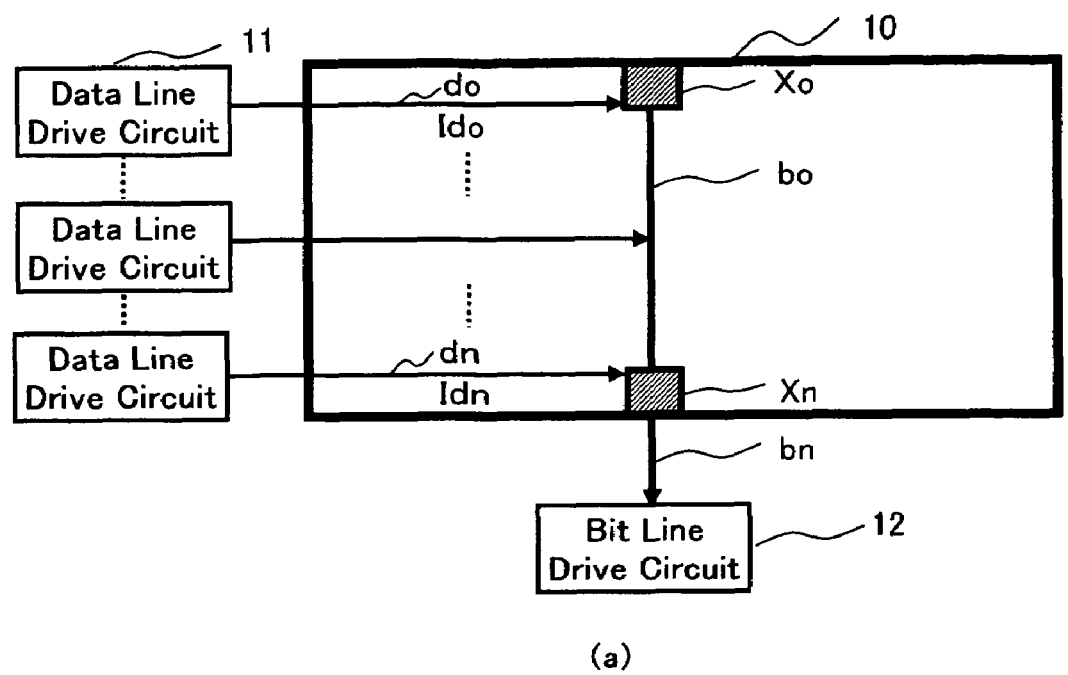
FIG. 6 are a view for explaining position dependency of the selected memory cells on the bit line in the memory cell array, and a view showing a relation between a distance between a selected memory cell and a bit line drive circuit, and a bit line potential.
Figure 6:
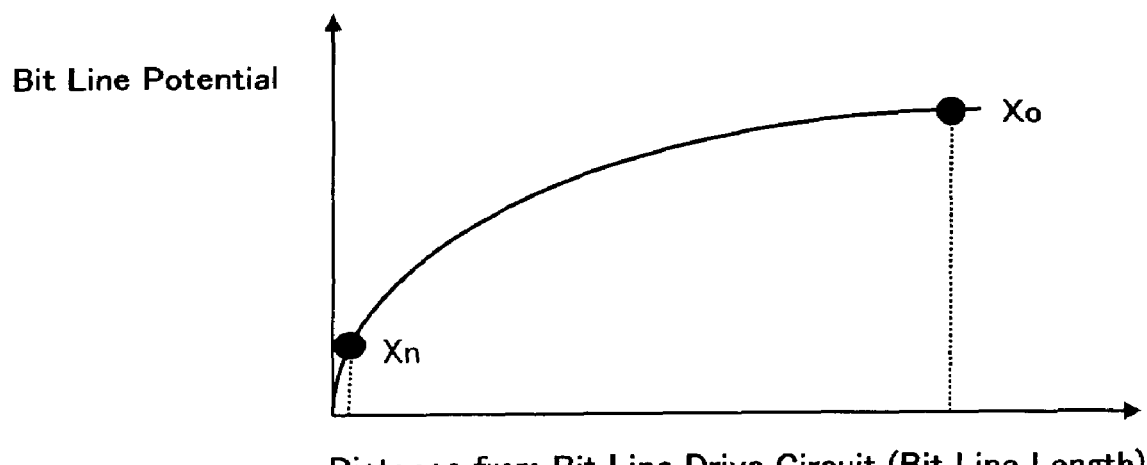

As a factor affecting the readout current, there is position dependency where the selected memory cell is positioned in the memory cell array. FIG. 6(a) shows positions of the selected memory cells on the bit line and current paths when the memory cell is read. This readout current flows from the data line drive circuit 11 to a selected bit line bn by driving data line currents Id0 to Idn of the data lines d0 to dn. That is, the current Ibn flowing in the selected bit line bn is the total of the data line currents Idi (i=0 to n) on the all data lines as shown by the following equation (6).

$$Ibn = Id0 + Id1 + \ldots + Idn \quad (6)$$

Therefore, a bit line potential when a memory cell XO which is the farthest from the bit line drive circuit 12 is selected is different from that when a memory cell Xn which is the closest to the bit line drive circuit 12 is selected.

FIG. 6(b) shows a relation between a length of the bit line (a distance between the selected memory cell and the bit line drive circuit 12) and the bit line potential. As shown in FIG. 6(b), when the memory cell closer to the bit line drive circuit 12 is selected, the bit line potential is lower, and when the memory cell farther from the bit line drive circuit is selected, the bit line potential is higher. Therefore, the readout current when the high-resistance memory cell XO which is the farthest from the bit line drive circuit 12 is selected is smaller than that when the high-resistance memory cell Xn which is the closest to the bit line drive circuit 12 is selected.

Figure 7:
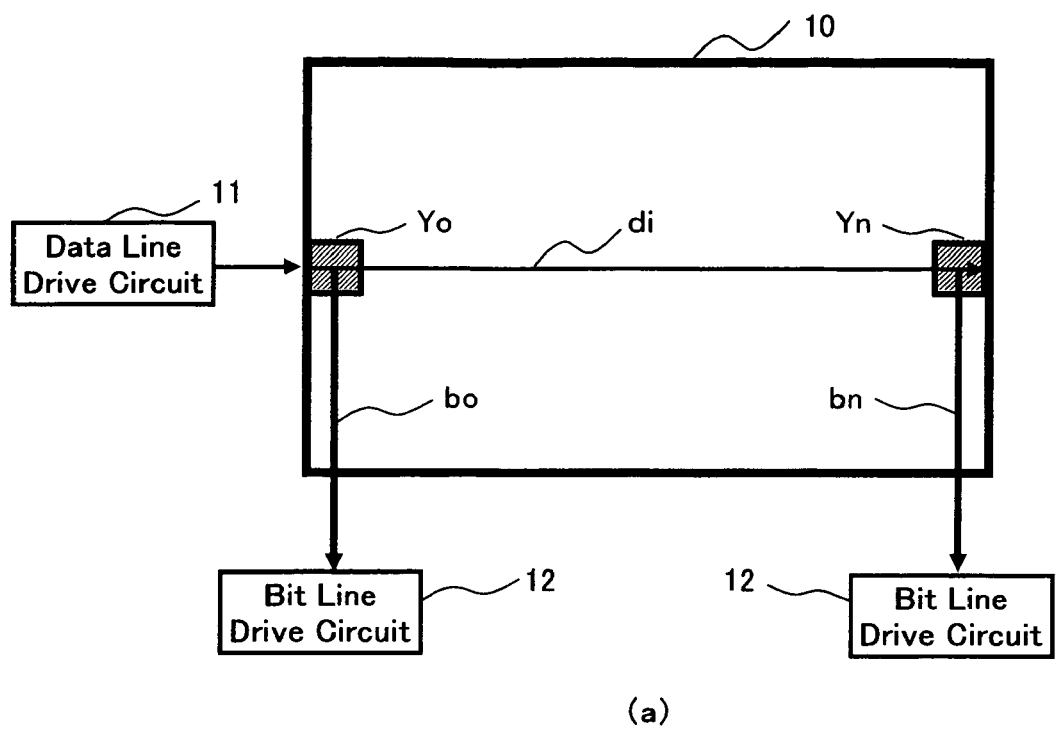
FIG. 7 are a view for explaining position dependency of the selected memory cells on the data line in the memory cell array, and a view showing a relation between a distance between a selected memory cell and a data line drive circuit, and a data line potential.
Figure 7:
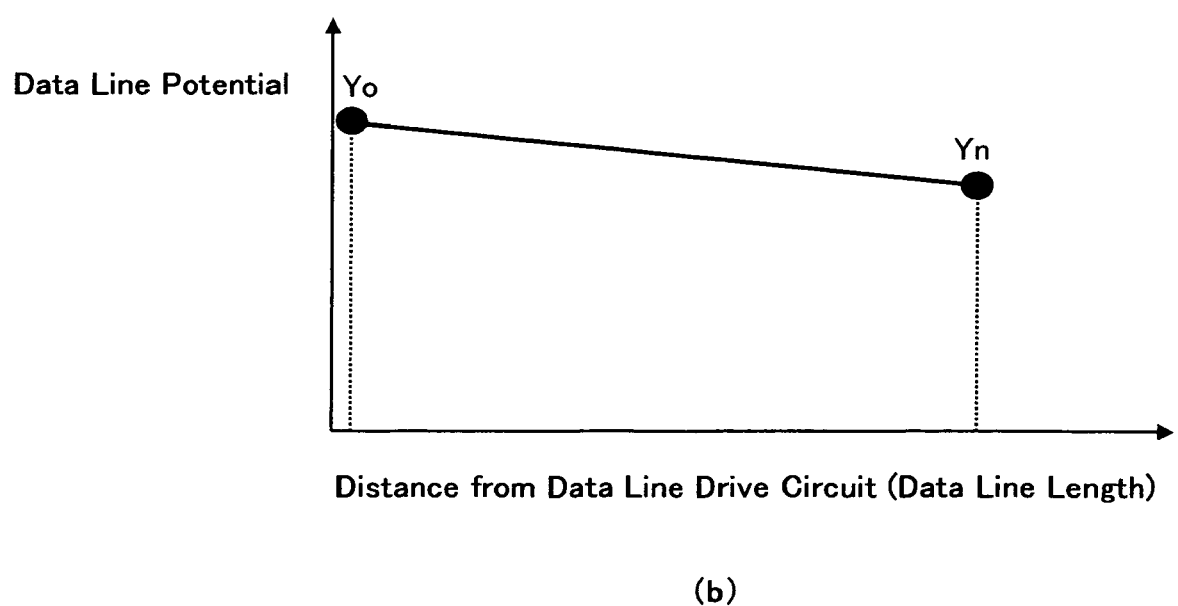

FIG. 7(a) shows positions of the selected memory cells on the data line and current paths when the memory cell is read. When a memory cell Y0 which is the closest to the data line drive circuit 11 in FIG. 7(a) is selected, the current from the data line drive circuit 11 reaches the bit line drive circuit 12 through the selected memory cell Y0 and the bit line b0. In addition, when a memory cell Yn which is the farthest from the data line drive circuit 11 is selected, the current from the data line drive circuit 11 reaches the bit line drive circuit 12 through the selected memory cell Yn and the bit line bn. A difference between when the memory cell X is selected and when the memory cell Y is selected is in a length of the data line dx (distance between the selected memory cell and the data line drive circuit 11). Since the data line dx is short in the case where the memory cell Y0 is selected as compared with the case where the memory cell Yn is selected, the data line potential rises because of a length difference of the data line dx, that is, a resistance difference of the data line dx. As a result, the more current flows because of the increased potential.

FIG. 7(b) shows a potential difference of the data line when the memory cell Y0 is accessed and that when the memory cell Yn is accessed, that is, shows a relation between the length of the data line and the data line potential.

As described above, under the consideration of the position dependency of the selected memory cell on the bit line shown in FIGS. 6(a) and 6(b) and the position dependency of the selected memory cell on the data line shown in FIGS. 7(a) and 7(b), the position dependency of the selected memory cell regarding various kinds of distribution patterns (the patterns A to D) shown in FIG. 5 is summarized as follows.

Figure 8:
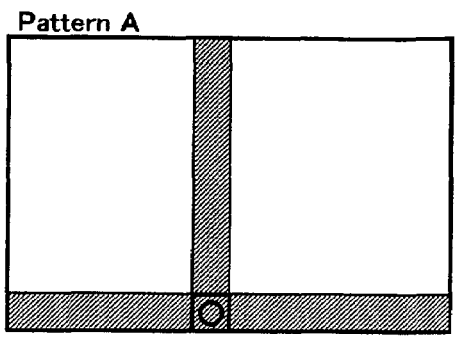
FIG. 8 are views showing variations of the same distribution pattern as a pattern A shown in FIG. 5 in which positions of selected memory cells are different.
Figure 8:
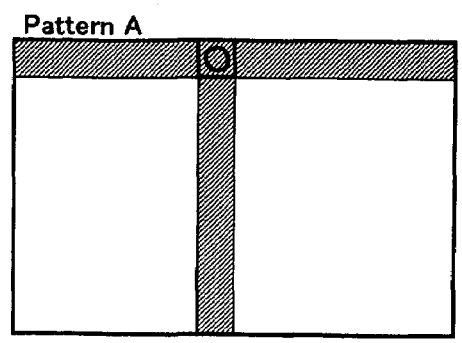
Figure 8:
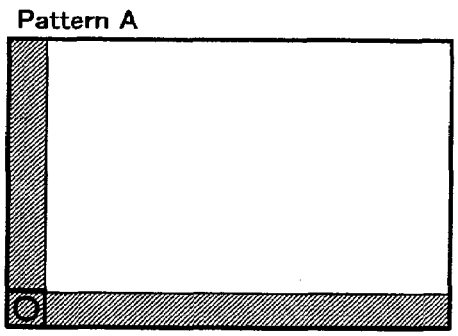
Figure 8:
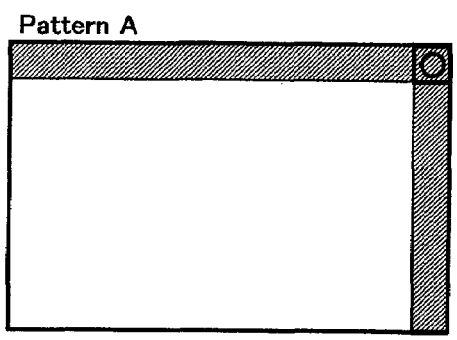
Figure 8:
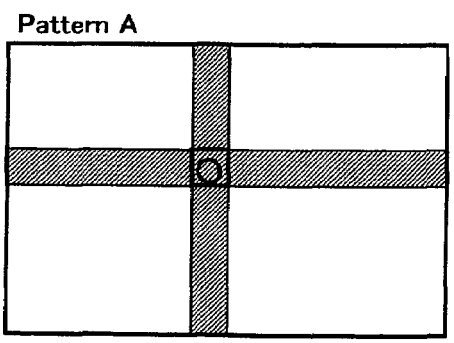

First, consideration is given to the position dependency of the selected memory cells on the bit line shown in FIGS. 6(a) and 6(b). Regarding the pattern A, when the readout currents of memory cells "a" shown in FIGS. 8(a), 8(d) and 8(e) are compared with each other, the readout current of the memory cell "a" of the pattern A shown in FIG. 8(a) reaches a maximum level. Regarding the pattern B, when the readout currents of the memory cells "b" shown in FIGS. 9(a), (d) and (e) are compared with each other, the readout current of the memory cell "b" of the pattern B shown in FIG. 9(a) reaches a maximum level. Regarding the pattern C, when the readout currents of the memory cells "c" shown in FIGS. 10(a), (d) and (e) are compared with each other, the readout current of the memory cell "c" of the pattern C shown in FIG. 10(a) becomes a minimum level. Regarding the pattern D, when the readout currents of the memory cells "d" shown in FIGS. 11(a), (d) and (e) are compared with each other, the readout current of the memory cell "d" of the pattern D shown in FIG. 11(a) becomes a minimum level.

Figure 9:
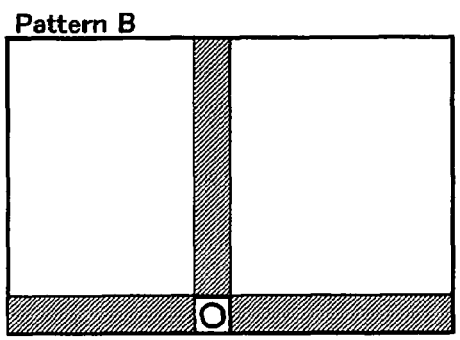
FIG. 9 are views showing variations of the same distribution pattern as a pattern B shown in FIG. 5 in which positions of selected memory cells are different.
Figure 9:
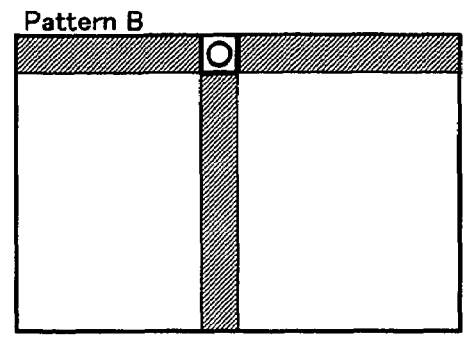
Figure 9:
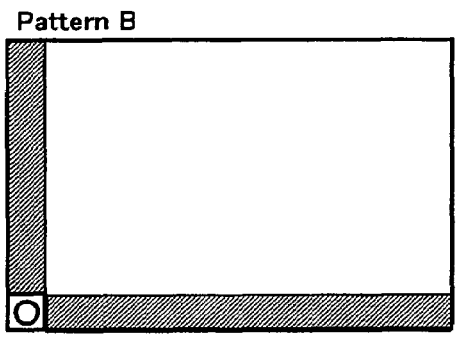
Figure 9:
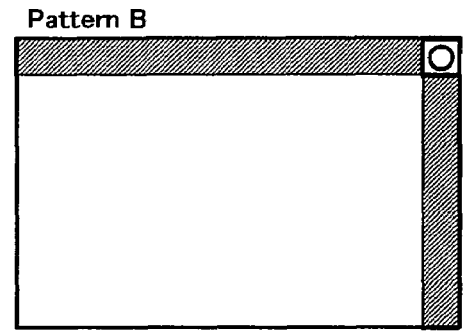
Figure 9:
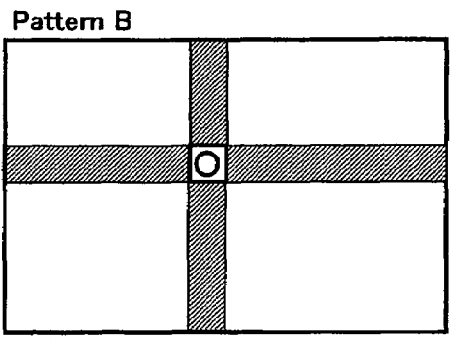
Figure 10:
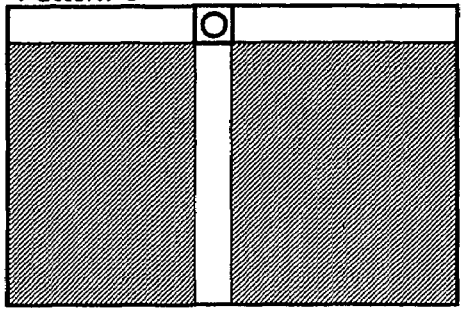
FIG. 10 are views showing variations of the same distribution pattern as a pattern C shown in FIG. 5 in which positions of selected memory cells are different.
Figure 10:
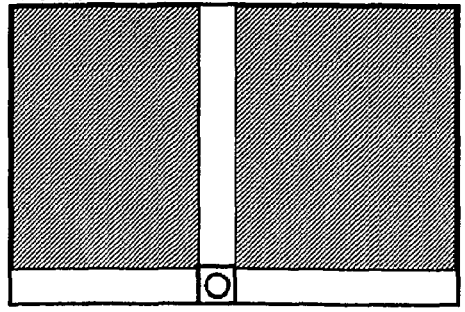
Figure 10:
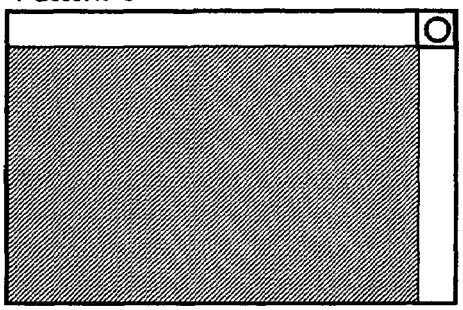
Figure 10:
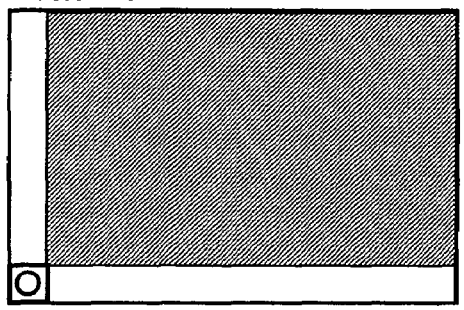
Figure 10:
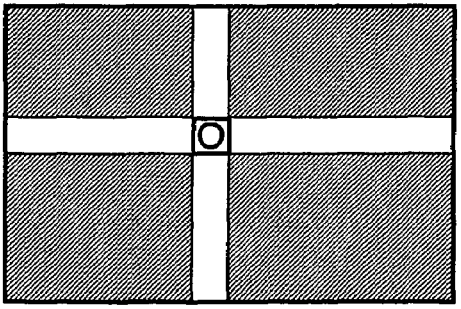
Figure 11:
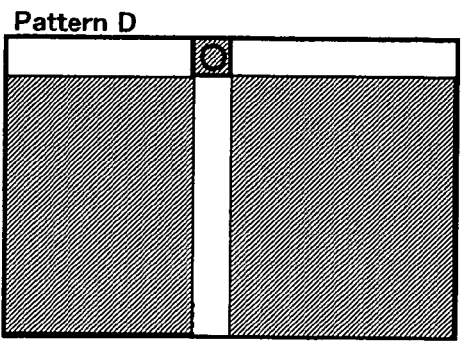
FIG. 11 are views showing variations of the same distribution pattern as a pattern D shown in FIG. 5 in which positions of selected memory cells are different.
Figure 11:
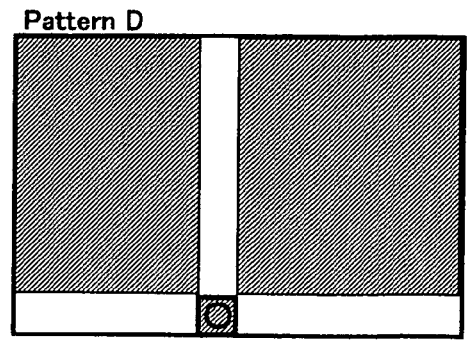
Figure 11:
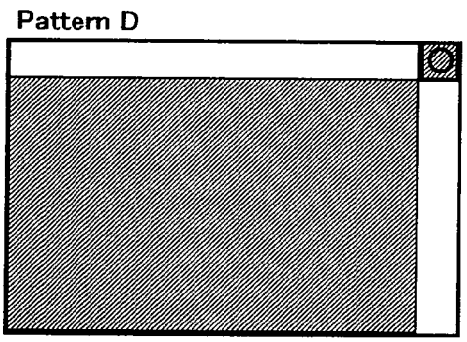
Figure 11:
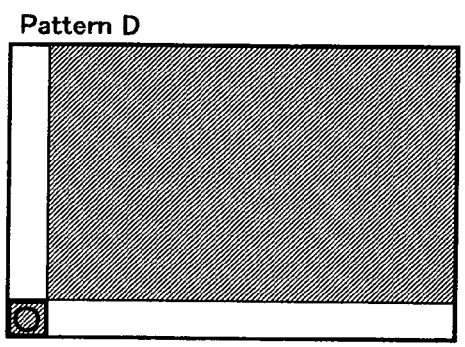
Figure 11:
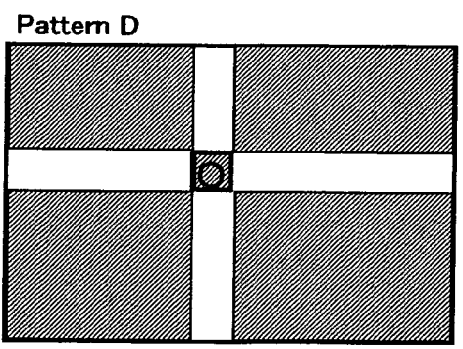

Next, a consideration is given to the position dependency of the selected memory cells on the data line shown in FIGS. 7(a) and 7(b). Regarding the pattern A, when the readout currents of memory cells "a" shown in FIGS. 8(a) and 8(b) are compared with each other, the readout current of the memory cell "a" shown in FIG. 8(b) reaches a maximum level. Regarding the pattern B, when the readout currents of the memory cells "b" shown in FIGS. 9(a) and 9(b) are compared with each other, the readout current of the memory cell "b" of the pattern B shown in FIG. 9(b) reaches a maximum level. Regarding the pattern C, when the readout currents of the memory cells "c" shown in FIGS. 10(a) and 10(b) are compared with each other, the readout current of the memory cell "c" of the pattern C shown in FIG. 10(b) becomes a minimum level. Regarding the pattern D, when the readout currents of the memory cells "d" shown in FIGS. 11(a) and 11(b) are compared with each other, the readout current of the memory cell "d" of the pattern D shown in FIG. 11(b) becomes a minimum level.

Referring to FIG. 4, a crossed point of the load characteristics L and the I-V characteristics of the memory cell array is an operation point. It is assumed that a voltage level of a point J at intersection of the load characteristics L with the I-V characteristics (pattern A) of the memory cell array when the selected memory cell is in the high-resistance state is Vj. In addition, it is assumed that a voltage level of a point K at intersection of the load characteristics L with the I-V characteristics (pattern C) of the memory cell array when the selected memory cell is in the low-resistance state is Vk. Thus, it is assumed that a voltage difference between the points J and K is Vjk. The voltage difference Vjk shows a readout margin voltage when the selected memory cell is high in resistance and low in resistance.

Meanwhile, a description will be made of a case where the PMOS forming the row readout voltage supply circuit 30 is not operated in the saturation region but operated in a linear region with reference to FIG. 12. In this case, the gate of the PMOS of the load resistance is not connected to the predetermined bias level but connected to the drain. It is assumed that a voltage level of a point M at intersection of the load characteristics L' operating in this linear region with the I-V characteristics (pattern A) of the memory cell array when the selected memory cell is high in resistance is Vm. In addition, it is assumed that a voltage level of a point N at intersection of the load characteristics L' with the I-V characteristics (pattern C or H) of the memory cell array when the selected memory cell is low in resistance is Vn. Thus, it is assumed that a voltage difference between the points M and N is Vmn. The voltage difference Vmn shows a readout margin voltage when the selected memory cell is high in resistance and low in resistance.

Figure 12:
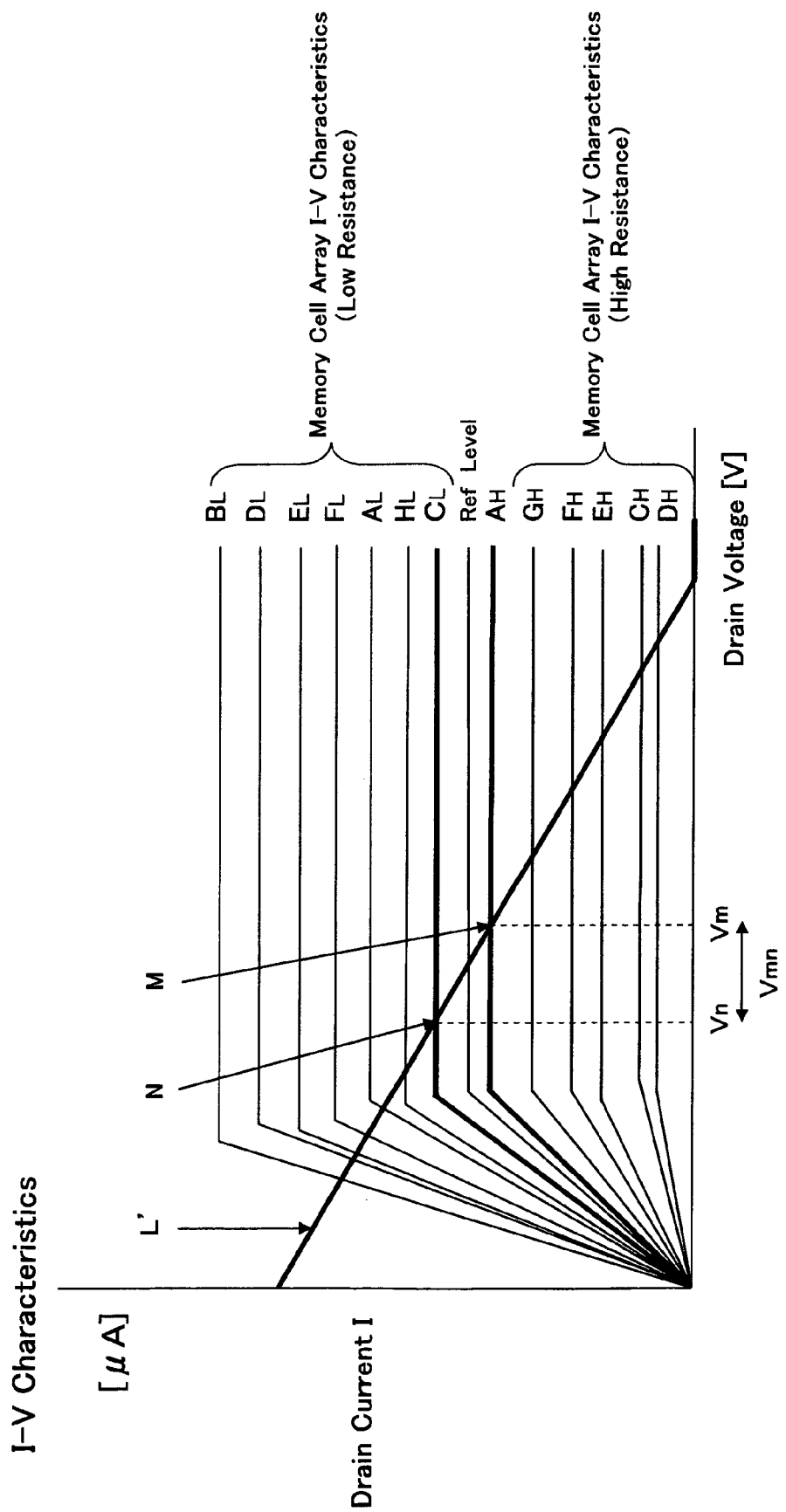
FIG. 12 is a static characteristic view showing load characteristics in which a PMOS operating in a linear region is load resistance, I-V characteristics of a memory cell array in various kinds of distribution patterns in resistance states of memory cells in the memory cell array, and an output voltage of a row readout voltage supply circuit.

As can be seen from FIGS. 4 and 12, the voltage difference Vjk between points J and K at intersection with the load characteristics L in which the operation is performed in the saturation region is higher than the voltage difference Vmn between the points M and N at intersection with the load characteristics L' in which operation is performed in the linear region (as a resistance element) (Vjk>Jmn). Therefore, a larger readout margin can be provided by operating the PMOS of the row readout voltage supply circuit 30 and the column readout voltage supply circuit 40 in the saturation region by setting the gate voltage thereof at the predetermined bias level (middle level).

Figure 13:
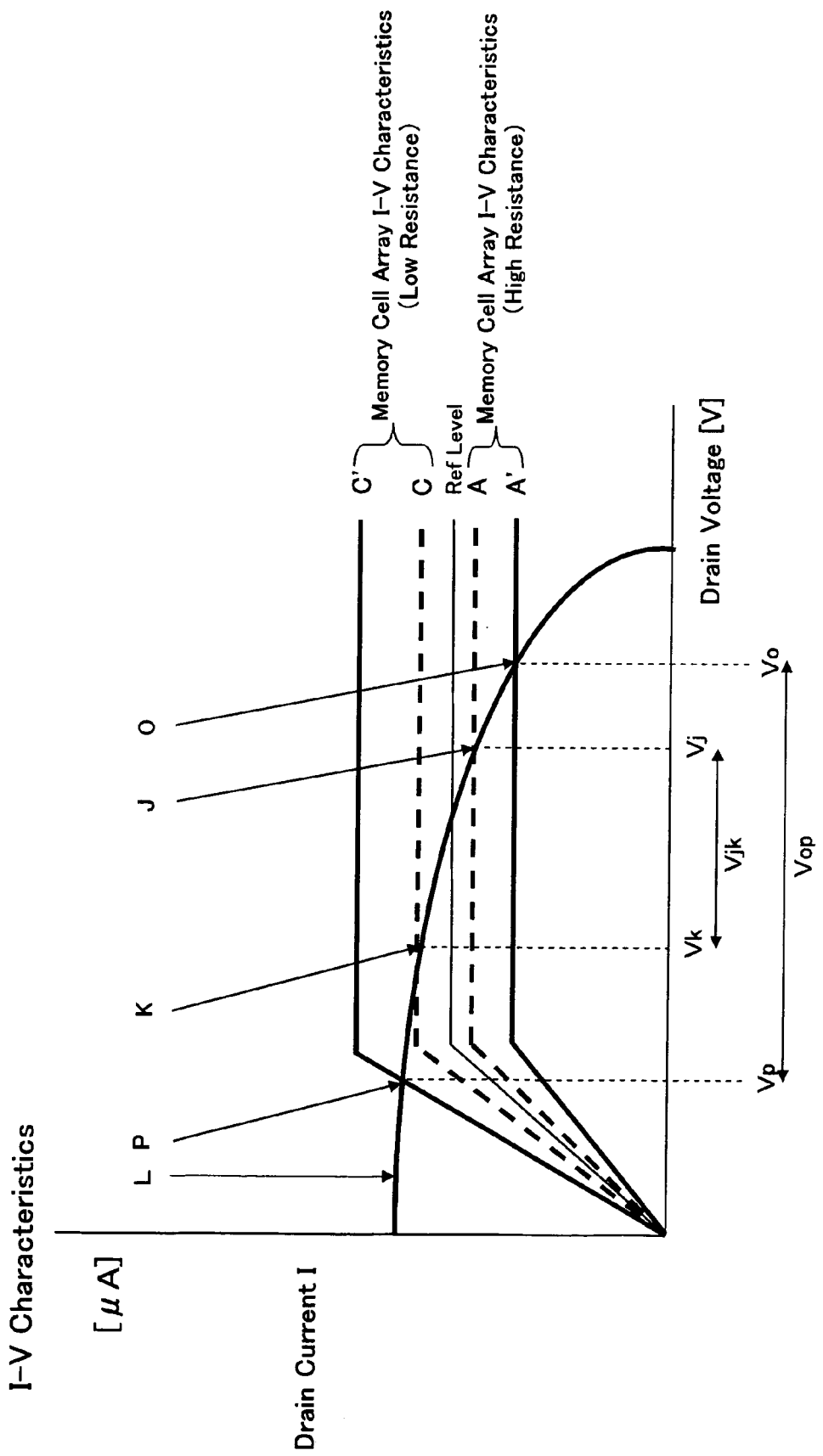
FIG. 13 is a static characteristic view showing I-V characteristics of a memory cell array when a row voltage displacement prevention circuit and a column voltage displacement prevention circuit are used.

FIG. 13 shows I-V characteristics of the memory cell array when the row voltage displacement prevention circuit 31 and the column voltage displacement prevention circuit 41 shown in FIGS. 2 and 3 are used. FIG. 13 shows only the pattern A and the pattern C which are the worst patterns when the selected memory cell is high and when the selected memory cell is low in resistance respectively.

As shown in FIG. 13, according to the I-V characteristics C' of the memory cell array of the pattern C when the selected memory cell is low in resistance, an influence of the leak current is prevented and current characteristics are improved as compared with the I-V characteristics C of the memory cell array of the same pattern when the row voltage displacement prevention circuit 31 and the column voltage displacement prevention circuit 41 shown in FIG. 4 are not used. In addition, according to the I-V characteristics A: of the memory cell array of the pattern A when the selected memory cell is high in resistance, an influence of the leak current is prevented, a drain current is suppressed as the drain voltage is increased and the characteristics are improved as compared with the I-V characteristics A of the memory cell array of the same pattern when the row voltage displacement prevention circuit 31 and the column voltage displacement prevention circuit 41 shown in FIG. 4 are not used. Therefore, a voltage difference Vop between the points O and P at intersection of the I-V characteristics A and the C' of the memory cell arrays respectively in the row voltage displacement prevention circuit 31 and the column voltage displacement prevention circuit 41 with the load characteristics L is larger than the voltage difference Vjk when the row voltage displacement prevention circuit 31 and the column voltage displacement prevention circuit 41 are not used (Vop>Vjk), which means that the readout margin is improved.

Next, a description will be made of the reference memory cell arrays 20a and 20b which are used in the device of the present invention.

As described above, according to a result of the circuit simulation, when the selected memory cell is in the high-resistance state, the distribution pattern of the resistance states of other non-selected memory cells is the worst case in the pattern A, and when the selected memory cell is in the low-resistance state, the distribution pattern of the resistance states of the other non-selected memory cells is the worst case in the pattern C as shown in FIG. 4 (or FIG. 12). Thus, when the memory cell in the high-resistance state is read in the various kinds of distribution pattern in the memory cell array 10, a measured current value on the selected data line is a drain current which is smaller than the I-V characteristics A in FIG. 4. In addition, when the memory cell in the low-resistance state is read, the measured current value on the selected data line becomes the drain current which is greater than the I-V characteristics C in FIG. 4. Therefore, the resistance state of the selected memory cell can be determined by setting the I-V characteristics A and the I-V characteristics C (Ref level in FIG. 4) in FIG. 4 at a determination reference level.

Therefore, the distribution pattern of the resistance states of each memory cell is set at the pattern A in one of the reference memory cell arrays 20a and 20b, and the pattern is set at the pattern C in the other reference memory cell array. For example, in a case where the reference memory cell array 20a is set at the pattern A and the reference memory cell array 20b is set at the pattern C, the reference memory cell array 20a implements a first current state in which a current flowing in the selected data line becomes the maximum state depending on the distribution pattern of the electric resistance state of other non-selected memory cells when the high-resistance memory cell is read, to function as a first reference current generation circuit. In addition, the reference memory cell array 20b implements a second current state in which a current flowing in the selected data line becomes the minimum state depending on the distribution pattern of the electric resistance state of the other non-selected memory cells when the low-resistance memory cell is read, to function as a second reference current generation circuit.

Since the memory cells of reference memory cell arrays 20a and 20b have to be selected so as to be set at the patterns A and B described above, the data line drive circuit 21, the bit line drive circuit 22 and the column decoder 24 provided for the reference memory cell arrays 20a and 20b are set so as to satisfy predetermined conditions.

Figure 14:
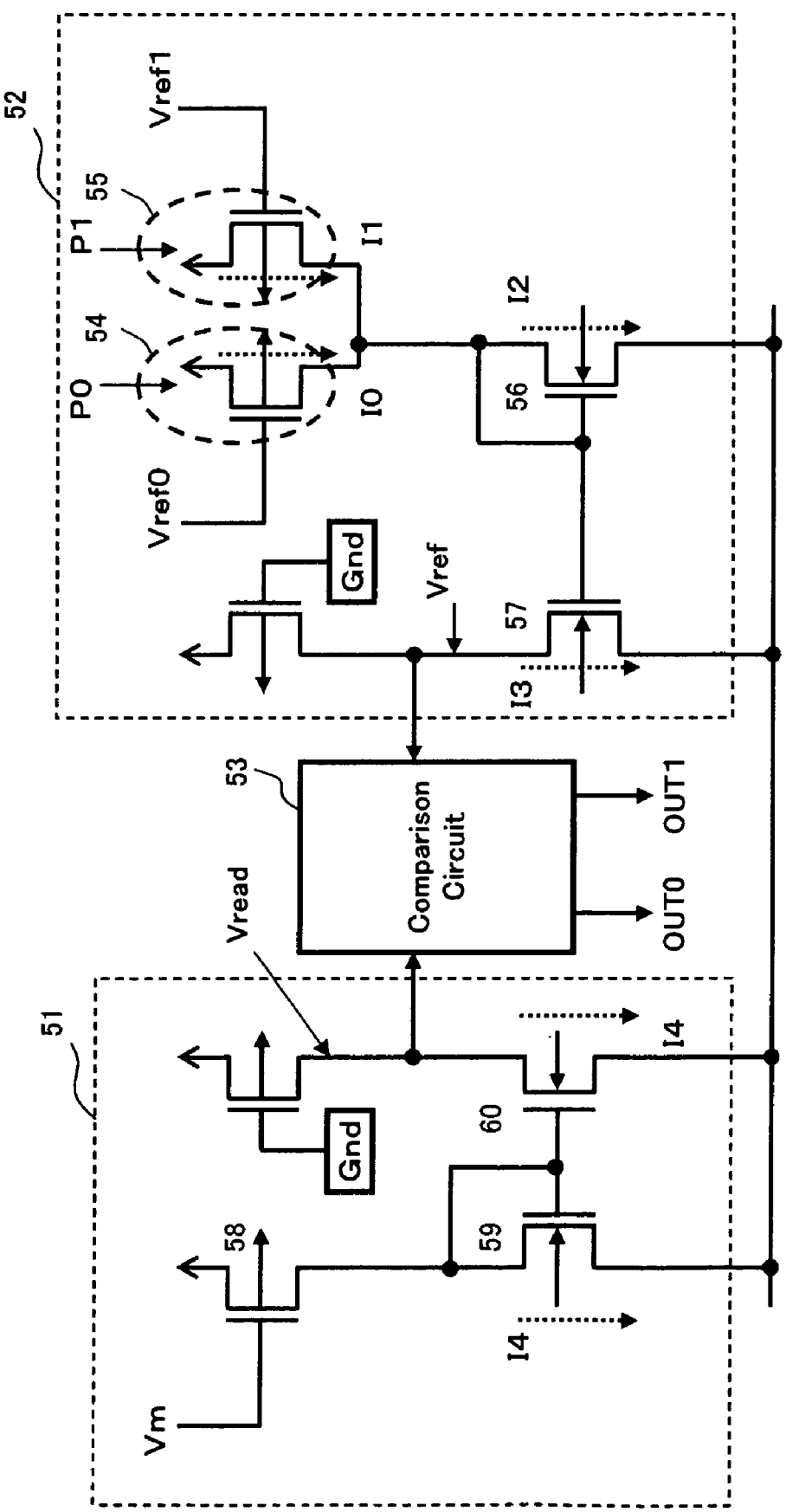
FIG. 14 is a circuit block diagram showing an example of a sense circuit of the semiconductor memory device according to the present invention.

The sense circuit 15 in the device of the present invention will be described. FIG. 14 is a circuit block diagram of the sense circuit 15. As shown in FIG. 14, the sense circuit 15 comprises a first current and voltage conversion circuit part 51 which converts the current of the selected data line and converts it to a readout voltage level, a second current and voltage conversion circuit part 52 which converts the current in the middle state between the first current state and the second current state to a reference voltage level, and a comparison circuit 53 which compares the converted readout voltage level with the reference voltage level. Although the reference memory cell arrays 20a and 20b are separately constituted from the sense circuit 15, they may be regarded as one part of the sense circuit 15 substantially.

As shown in FIG. 14, in the second current and voltage conversion circuit part 52, an output voltage Vref0 of the reference memory cell array 20a is input to the gate of a PMOS 54, an output voltage Vref1 of the reference memory cell array 20b is input to the gate of a PMOS 55, a synthetic current I2 of a drain current I0 of the PMOS 54 and a drain current I1 of the PMOS 55 flows in a NMOS 56, a current I3 which is a half of the synthetic current I2 flows in an NMOS 57 by a current mirror circuit of the NMOS 57 in which a current amount is set by half of the NMOS 56 and the NMOS 56, and a reference voltage level Vref is output to the drain of the NMOS 57.

Meanwhile, in the first current and voltage conversion circuit part 51, the output voltage Vm of the memory cell array 10 is input to the gate of the PMOS 58, a drain current I4 of the PMOS 58 flows in an NMOS 59, the drain current I4 flow in an NMOS 60 by a current mirror circuit of the NMOS 60 which is equivalent to the NMOS 59 and the NMOS 59, and a readout voltage level Vread is output to the drain of the NMOS 60. In addition, each of the NMOS 57, the NMOS 59 and the NMOS 60 is set in the same current ability.

Memory data determination of the selected memory cell is made by comparing the readout voltage level Vread generated in the first current and voltage conversion circuit part 51 with the reference voltage level Vref generated in the second current and voltage conversion circuit part 52.

Figure 15:
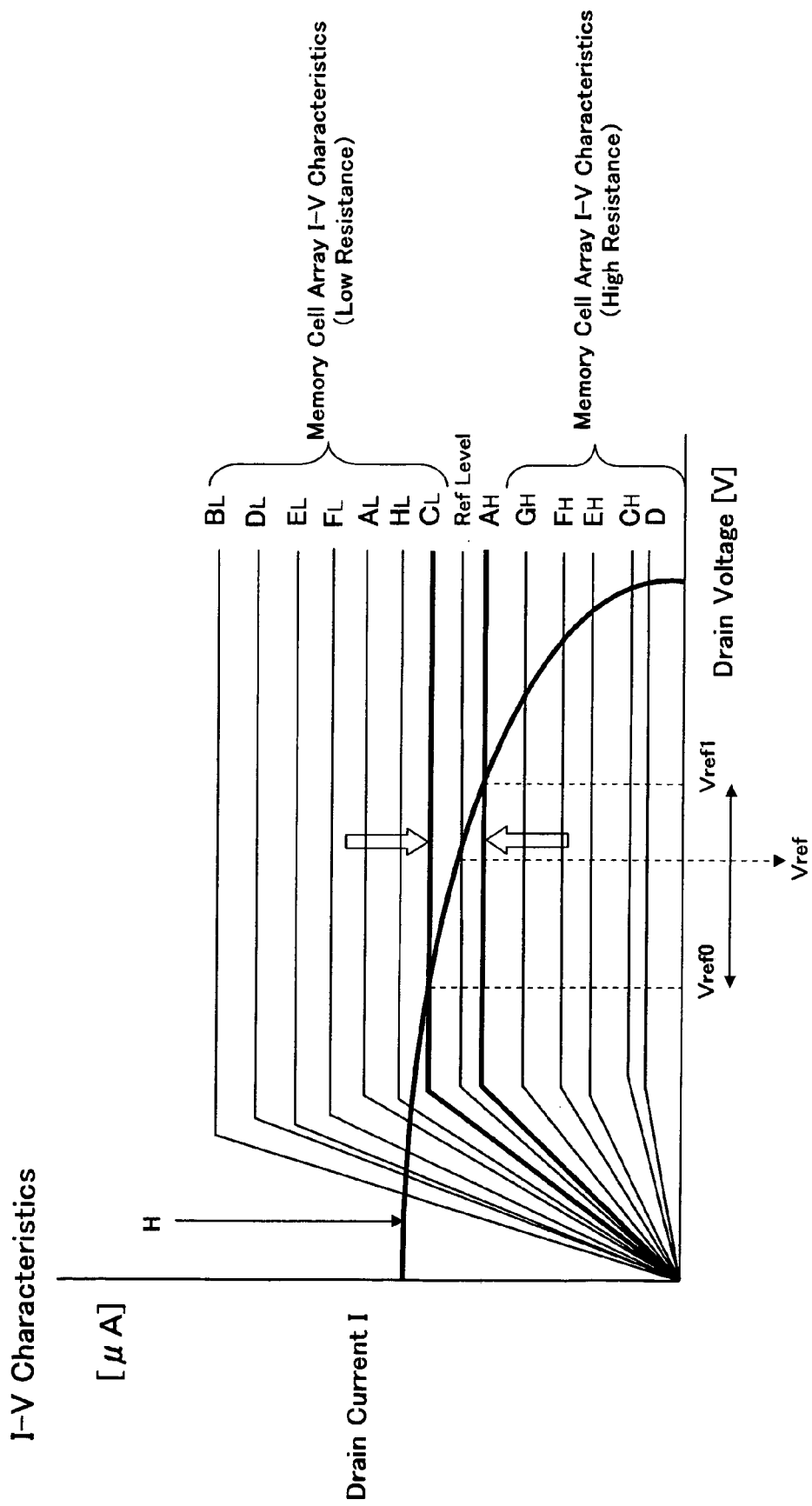
FIG. 15 is a static characteristic view showing I-V characteristics of a PMOS load transistor shown in FIG. 2 and I-V characteristics of a memory cell array in various kinds of distribution patterns in resistance states of memory cells in the memory cell array comprising a row voltage displacement prevention circuit and a column voltage displacement prevention circuit shown in FIG. 1.

FIG. 15 shows I-V characteristics H of the load transistor (PMOS 30) shown in FIG. 2, and I-V characteristics of the memory cell array in various kinds of distribution patterns (patterns A to H) showing the resistance states of the memory cells in the memory cell array shown in FIG. 1. The I-V characteristics H of the load transistor shown in FIG. 15 needs to have the I-V characteristics such that a potential Vref0 at intersection with I-V characteristic $C_L$ (at the time of reading the low-resistance memory cell in the pattern C) shows an L (low) level and a potential Vref1 at intersection with I-V characteristics $A_H$ (at the time of reading the high-resistance memory cell in the pattern A) shows an H (high) level, and a middle level between the Vref0 and the Vref1 is set as a reference level Vref.

The memory cells of the device of the present invention may have any structure and characteristics as far as they are variable resistive elements which can store information by a change of the electric resistance. In addition, a changing method (that is, a writing method) of the electric resistance is not always the electric method. Furthermore, the memory storing characteristics of the memory cells may be volatile or nonvolatile. In addition, in the case of the device of the present invention is applied to a nonvolatile memory, since high density of the memory cell array can be implemented, a large-capacity nonvolatile memory can be provided.

As one example of the memory cells, the following is considered. For example, the present invention can be applied to a phase change memory which uses a phase change between a crystalline phase (small resistance) and an amorphous phase (large resistance), in a phase change of phase transformation material such as chalcogenide compound. In addition, it can be applied to a polymer memory and a polymer ferroelectric RAM (PFRAM) in which ferroelectric polarization state is changed in polarization orientation of a fluorocarbon molecule (polarized conductive polymer molecule), using a fluorocarbon material in memory cells.

Furthermore, it can be applied when the memory cells are formed of an Mn oxide material such as PCMO ($Pr_{(1-x)}Ca_xMnO_3$) with a perovskite structure having a CMR (Colossal Magnetic Resistance) effect. This utilizes that a resistance value of the Mn oxide material such as PCMO which constitutes the memory cell elements is changed by a phase change between a ferromagnetic metallic body and a diamagnetic insulating body.

In addition, the device of the present invention can be applied to a memory in which memory cells are constituted by metal oxide including transition metal such as Ni, Ti, Hf and Zr, and resistance of the memory cell changes depending on change of electric pulse.

In addition, the device of the present invention can be applied to a memory in which memory cells are constituted by metal particles and metal oxide such as STO (SrTiO$_3$), SZO (SrZrO$_3$) and SRO (SrRuO$_3$), and an interfacial phenomenon in which a resistance value of the memory cell is changed according to a voltage applied at an interface between the metal oxide and the metal particles is utilized.

In addition, the device of the present invention can be applied to the following memories in the broad sense, that is,
1) A memory in which a resistance element which constitutes a memory cell comprises a semiconductor material;
2) A memory in which a resistance element which constitutes a memory cell is formed of an oxide or a nitride;
3) A memory in which a resistance element which constitutes a memory cell is formed of a compound of metal and a semiconductor;
4) A memory in which a resistance element which constitutes a memory cell is formed of a fluorocarbon resin material;
5) A polymer ferroelectric RAM (PFRAM) in which a resistance element which constitutes a memory cell is formed of a conductive polymer;
6) A memory (OUM) in which a resistance element which constitutes a memory cell is formed of a chalcogenide material;
7) A memory in which a resistance element which constitutes a memory cell is formed of a compound with a perovskite structure having a CMR effect; and
8) A MRAM in which a resistance element which constitutes a memory cell is formed of a spin-dependent tunnel junction element.

Embodiment 2

Although the sense circuit 15 having the circuit constitution shown in FIG. 14 is illustrated as the sense circuit of the device of the present invention in the embodiment 1, the sense circuit is not limited to the circuit constitution shown in FIG. 14.

Figure 16:
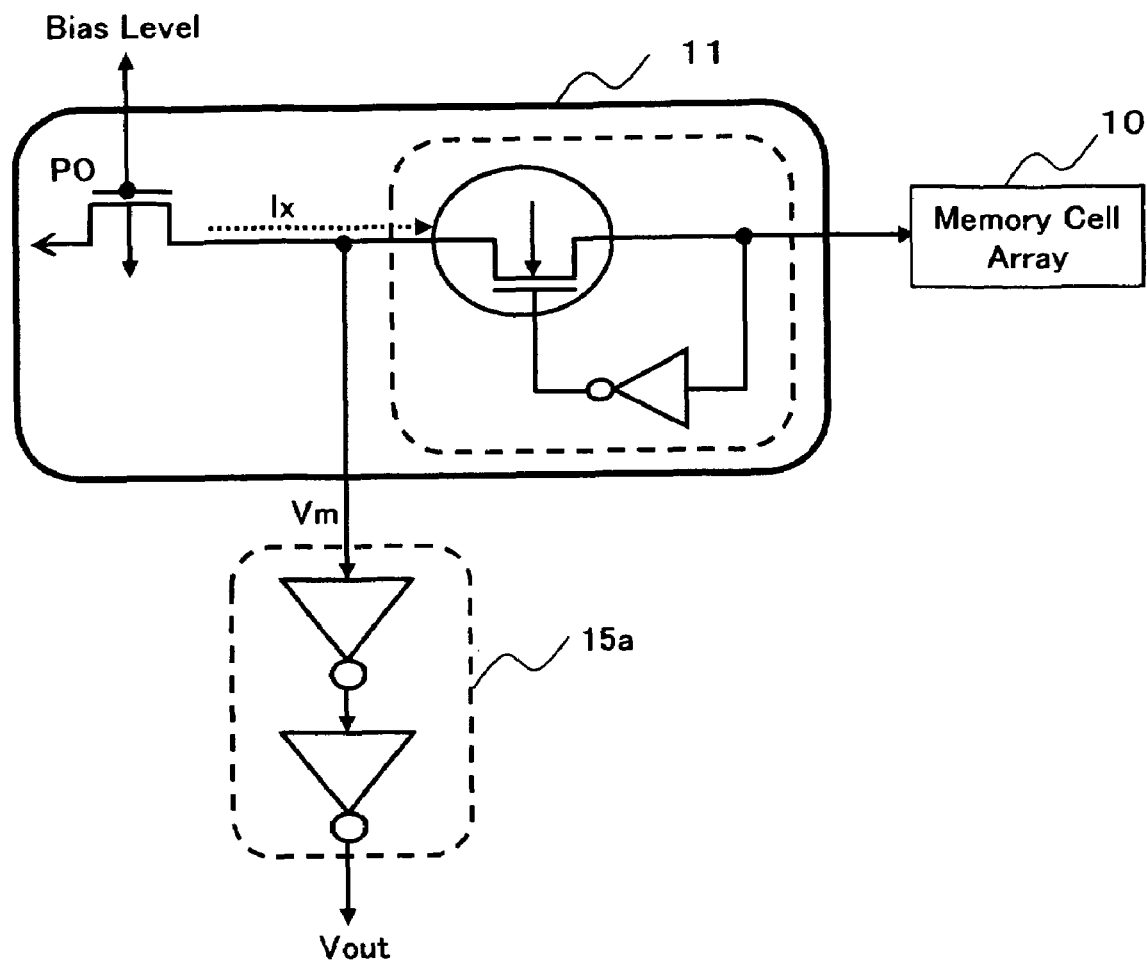
FIG. 16 is a circuit block diagram showing another example of the sense circuit of the semiconductor memory device according to the present invention.

As shown in FIG. 16, the sense circuit may be consist of one or more stages of inverter circuit 15a. Referring to FIG. 16, the output Vm of the data drive circuit 11 read from a desired memory cell in the memory cell array 10 shown in FIG. 1 is input to the first stage of the inverter circuit 15a of the two-stage inverters. Since this inverter circuit 15a has a voltage amplifying function and a current amplifying function, a general sense amplifier (a circuit which determines binary data on the basis of a reference level and amplifies an output level) can be omitted. In addition, the number of stages of the inverter circuit 15a may be at least one. Here, an inversion level of the first stage inverter of the inverter circuit 15a may be set at a middle level-between the potentials Vk and Vj as shown in FIG. 18 described later.

Figure 17:
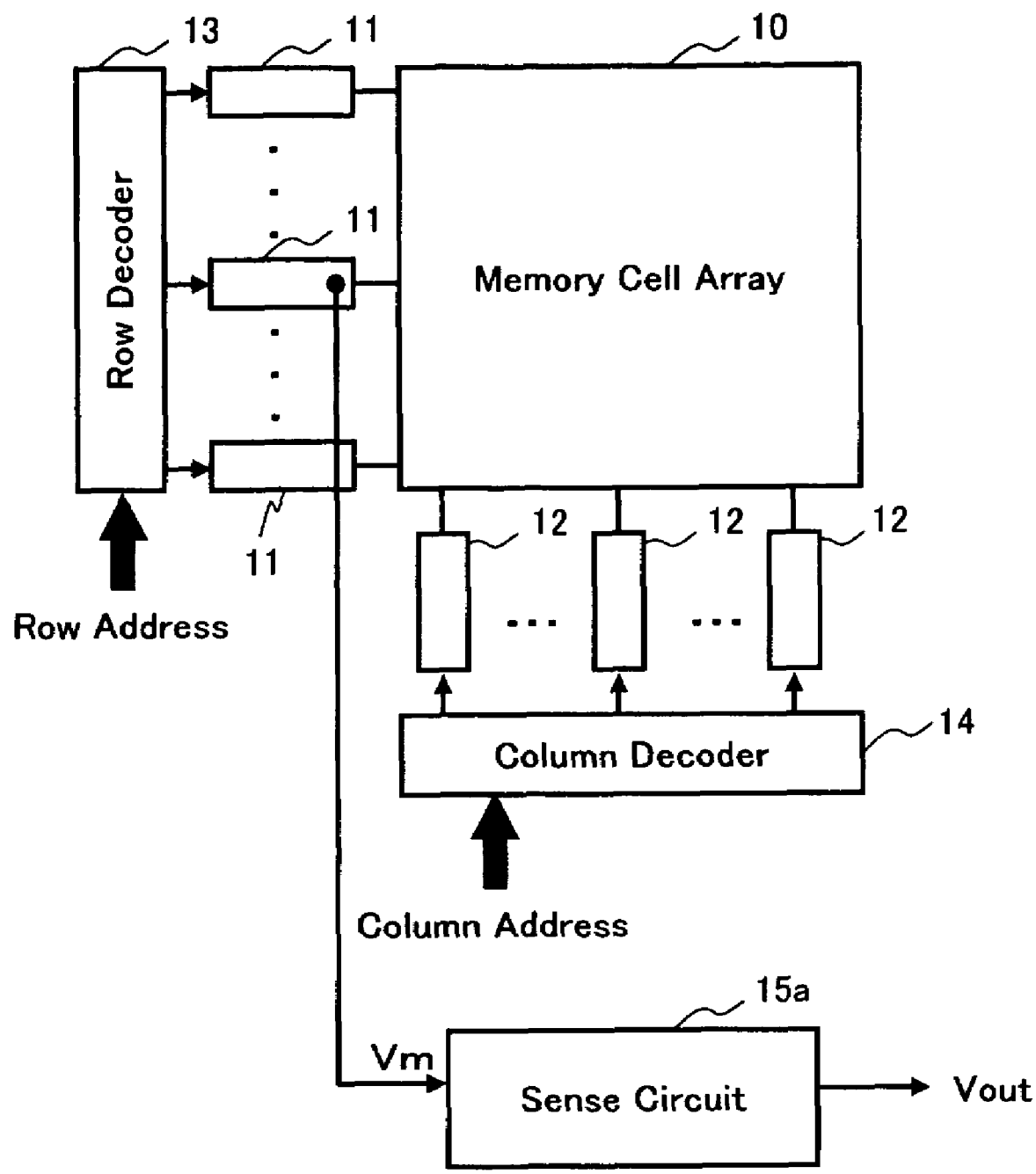
FIG. 17 is a circuit block diagram showing an embodiment 2 of a semiconductor memory device according to the present invention using the sense circuit shown in FIG. 16.

FIG. 17 is a block diagram showing a main part regarding a reading operation of the device of the present invention when the inverter circuit 15a shown in FIG. 16 is used as the sense circuit. As shown in FIG. 17, when the inverter circuit 15a is used as the sense circuit, the circuit constitution of the sense circuit itself is simplified and the circuit for generating the reference level Vref shown in FIG. 1 is not necessary, so that a circuit size for the reading operation can be considerably reduced.

Figure 18:
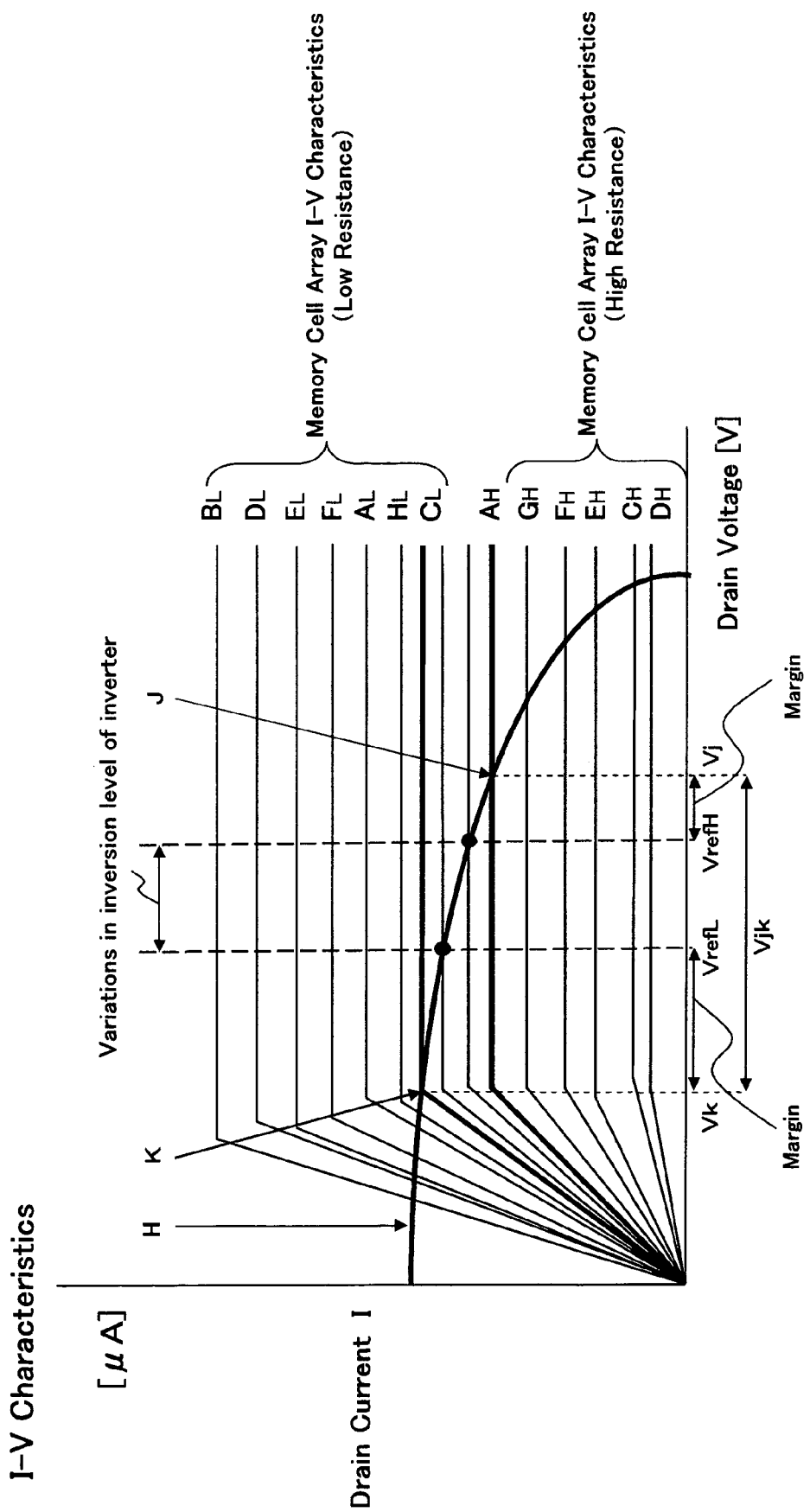
FIG. 18 is a static characteristic view showing a relation among a load characteristics of a data line drive circuit, I-V characteristics of a memory cell array in various kinds of distribution patterns in the resistance states of the memory cells in the memory cell array, and variation allowable range of an input conversion level of the sense circuit when an output voltage of the data line drive circuit is input to the sense circuit shown in FIG. 16.

In addition, FIG. 18 shows a relation between an readout output Vout and a variation range of an inversion level of the first stage inverter of the inverter circuit 15a when an output Vm from a data line drive circuit 11 read from a desired memory cell in a memory cell array 10 shown in FIG. 17 is input to the inverter circuit 15a. In FIG. 18, it is assumed that the inversion level of the first stage inverter fluctuates from VrefL to VrefH.

Here, when it is assumed that a potential at intersection of I-V characteristics H of a PMOS load transistor with I-V characteristics C$_L$ of the memory cell is Vk and a potential at intersection of the I-V characteristics H of the PMOS load transistor with I-V characteristics A$_H$ of the memory cell is Vj, the conditions shown by the following two inequalities (7a) and (7b) have to be satisfied.

$$VrefL > Vk \tag{7a}$$

$$VrefH < Vj \tag{7b}$$

Here, a voltage level (VrefL−Vk) becomes a readout voltage margin for the low-resistance memory cell and a voltage level (Vj−VrefH) becomes a readout voltage margin for the high-resistance memory cell.

Embodiment 3

A third circuit constitution of the sense circuit of the device of the present invention will be described with reference to FIG. 19. According to an embodiment 3, as shown in FIG. 19, a sense circuit 15b comprises a first comparison circuit 16 which compares a voltage level Vm of a selected data line with a first voltage Vref0 which is converted from a first current state in which a current flowing in the selected data line when a high-resistance memory cell is read becomes a maximum level depending on a distribution pattern of an electric resistance state of other non-selected memory cells in a memory cell array, a second comparison circuit 17 which compares the voltage level Vm of the selected data line with a second voltage Vref1 which is converted from a second current state in which a current flowing in the selected data line when a low-resistance memory cell is read becomes a minimum level depending on a distribution pattern of an electric resistance state of other non-selected memory cells in the memory cell array, and a third comparison circuit 18 which compares an output voltage VrefA of the first comparison circuit 16 with an output voltage VrefB of the second comparison circuit 17.

According to the embodiment 3, the two reference levels Vref0 and Vref1 are used similar to the embodiment 1, however, since it is not necessary to generate a reference level Vref at the middle level between the reference levels Vref0 and Vref1, a circuit such as the second current and voltage conversion circuit part 52 shown in FIG. 14 in the embodiment 1 is not necessary.

Figure 19:
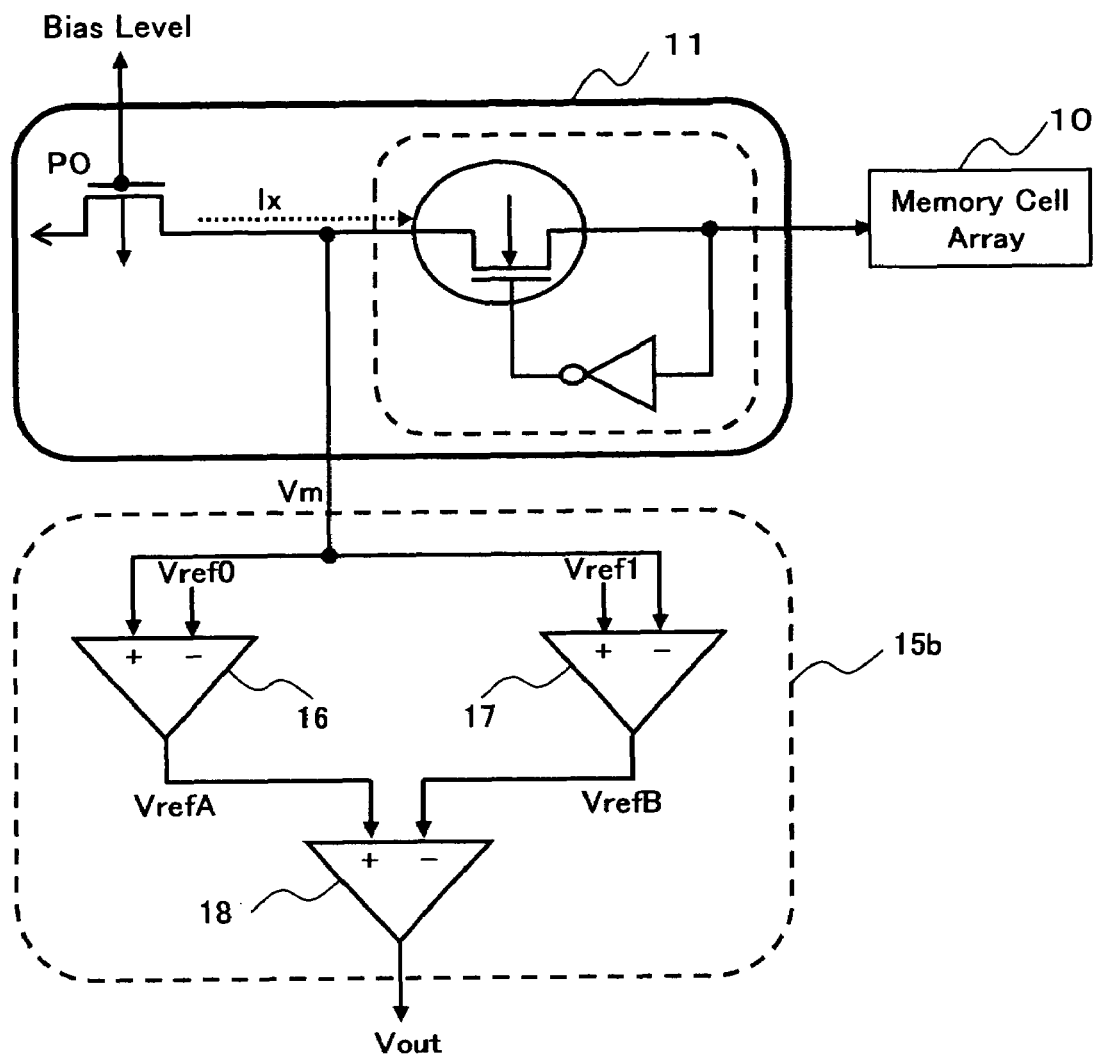
FIG. 19 is a circuit block diagram showing still another example of the sense circuit of the semiconductor memory device according to the present invention.

Referring to FIG. 19, when the voltage level Vm of the selected data line read from the desired memory cell is not less than the reference level Vref1, since a relation between the output voltage VrefA of the first comparison circuit 16 and the output voltage VrefB of the second comparison circuit 17 is as shown by the following inequality (8), an output Vout of the sense circuit 15b becomes high.

$$VrefA > VrefB \tag{8}$$

In addition, when the voltage level Vm of the selected data line read from the desired memory cell is not more than the reference level Vref0, since a relation between the VrefA and the VrefB is as shown by the following inequality (9), the output Vout of the sense circuit 15*b* becomes low.

$$VrefA < VreEB \quad (9)$$

Another embodiment of the device of the present invention will be described below.

Figure 29:
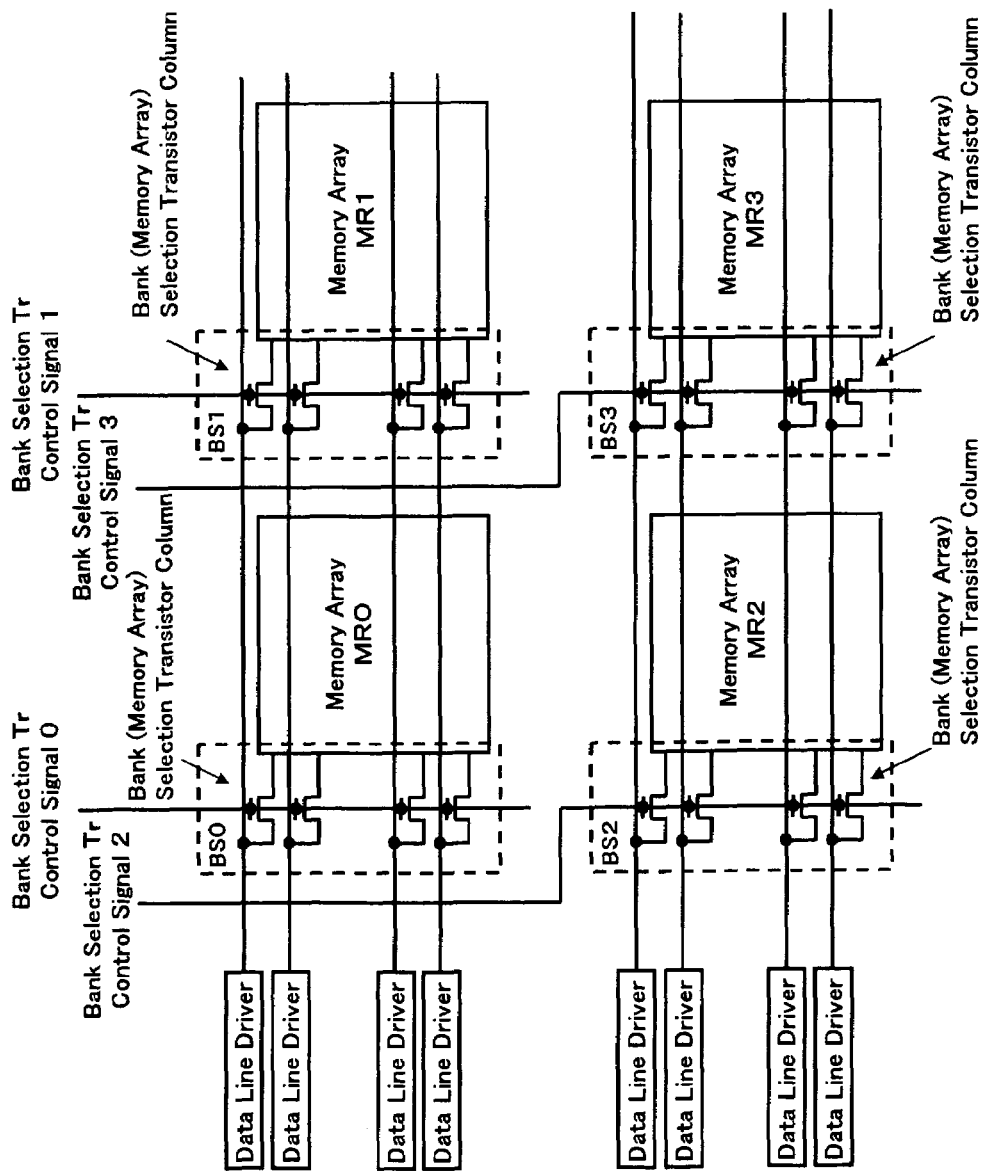
FIG. 29 is a circuit block diagram showing a memory cell constitution in which a memory cell array can be selected by the bank unit.
Figure 30:
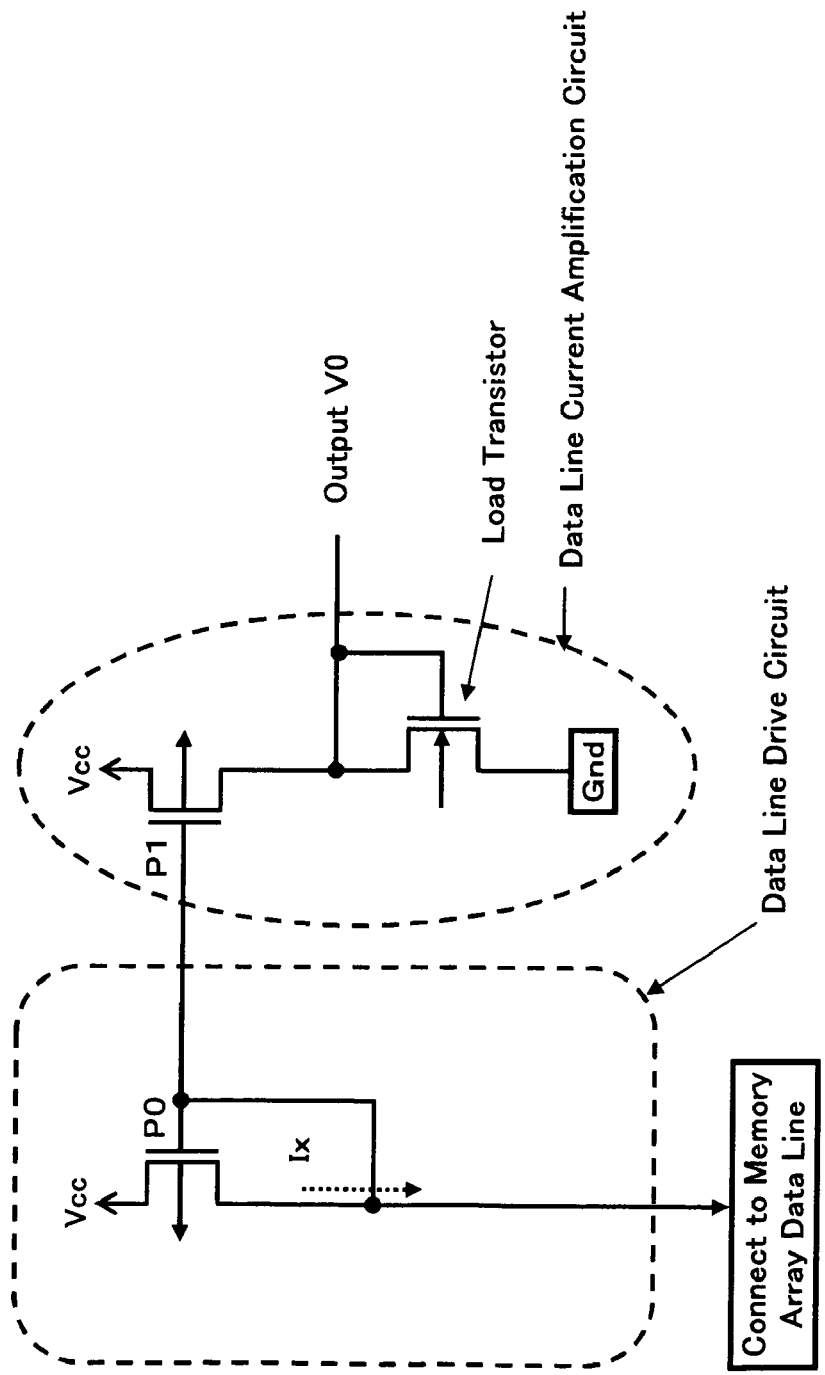
FIG. 30 is a circuit diagram showing one example of a data line driver-amplifier circuit used in the memory cell array of the conventional cross-point memory.
Figure 31:
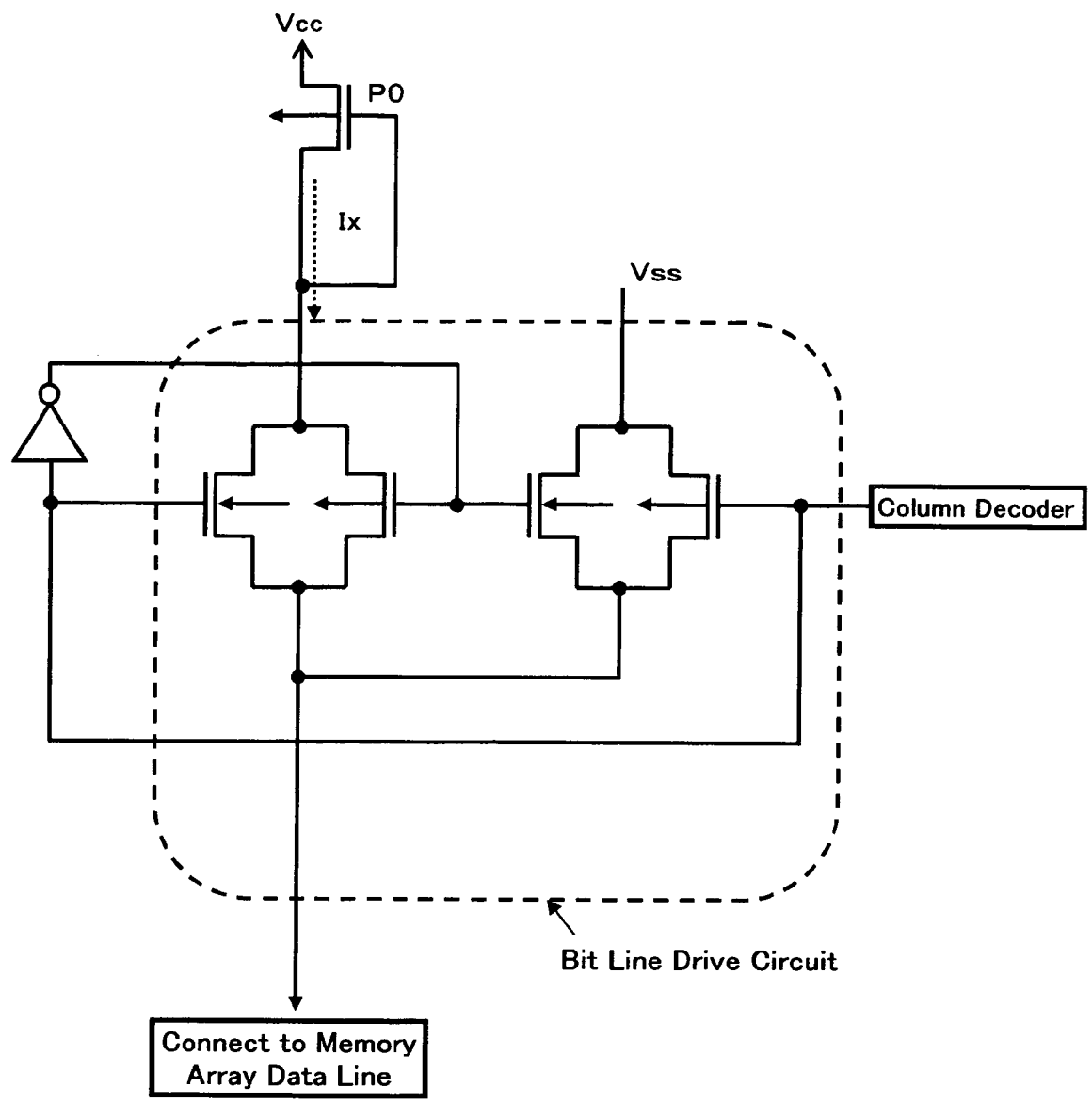
FIG. 31 is a circuit diagram showing one example of the bit line drive circuit used in the memory cell array of the conventional cross-point memory.
Figure 32:
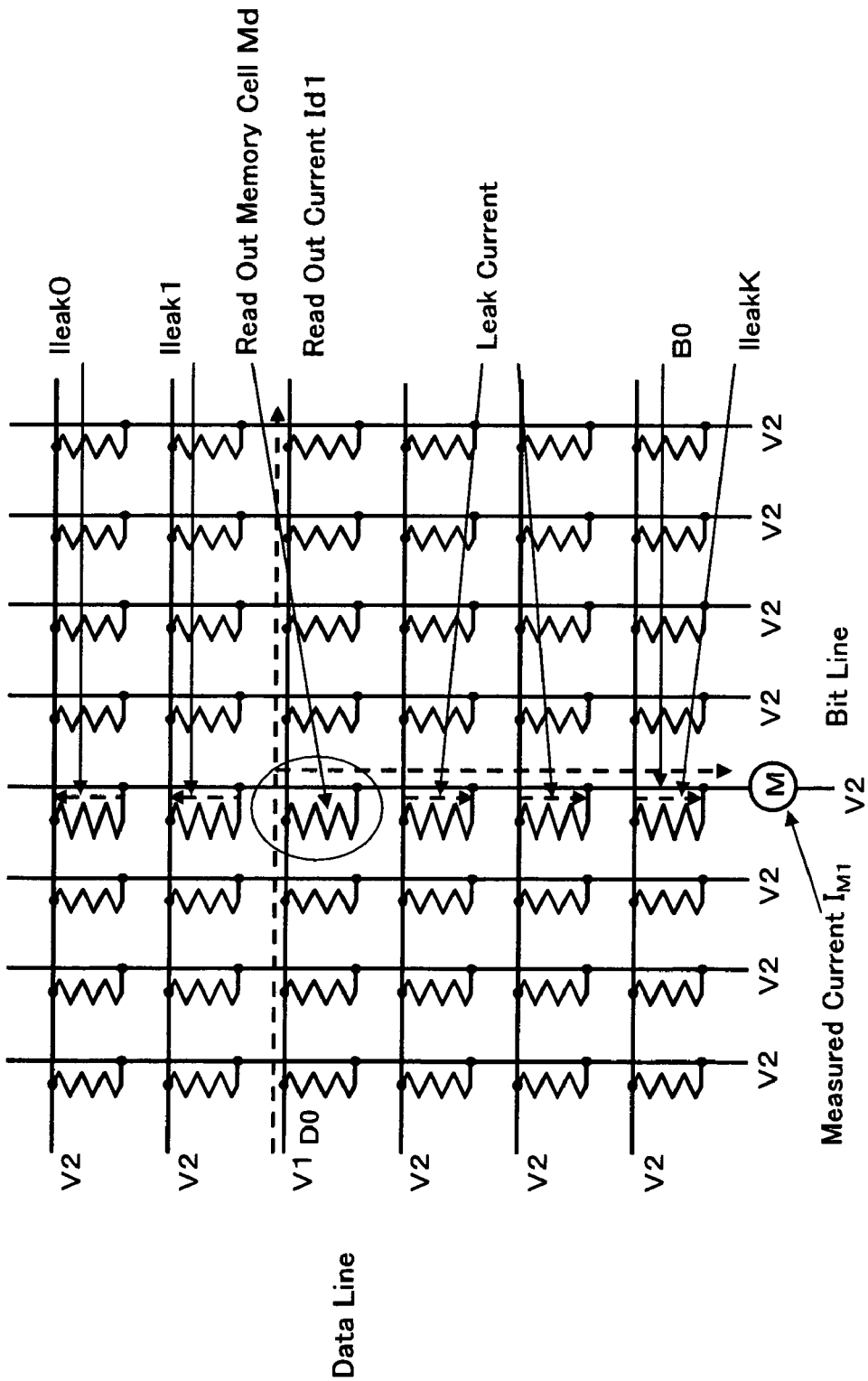
FIG. 32 is a circuit diagram showing voltage setting for each data line and each bit line and a current path when a high-resistance memory cell at intersection of a data line D0 with a bit line B0 in the memory cell array of the conventional cross-point memory is read.
Figure 33:
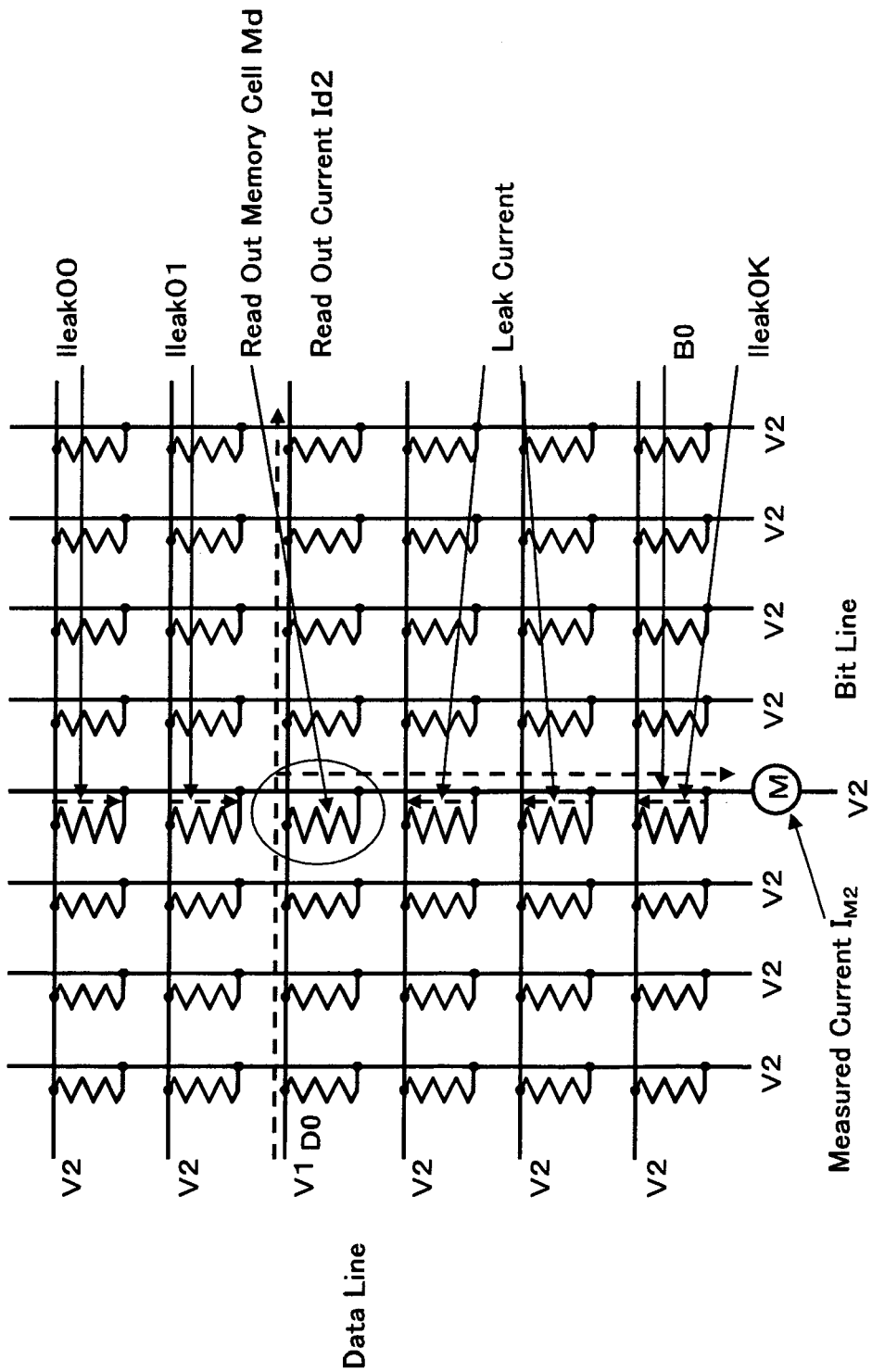
FIG. 33 is a circuit diagram showing voltage setting for each data line and each bit line and a current path when a low-resistance memory cell at intersection of a data line D0 with a bit line B0 in the memory cell array of the conventional cross-point memory is read.

Although the memory cell array 10 is one as shown in FIGS. 1, 17 and 19 in the above embodiments, it is necessary to increase an array size of the memory cell array 10 in order to implement a high-capacity memory. However, in the cross-point type of memory cell array structure, since a readout margin deteriorates as the array size is increased and the reading operation cannot be performed, there is a maximum limit in the array size for the single memory cell array 10. Therefore, in order to implement high capacity beyond the maximum limit of size, it is preferable that a bank structure consisting of a plurality of memory cell arrays shown in FIG. 29 is employed.

In this case, it is not necessary to provide reference memory cell arrays 20*a* and 20*b* for each bank (memory cell array), and the reference memory cell arrays 20*a* and 20*b* can be shared in the plurality of banks. In addition, the array size of each bank is preferably the same as the array size of the reference memory cell arrays 20*a* and 20*b*.

Although a description has been made of the case where data for one memory cell is read by selecting one data line from one memory cell array 10 in FIG. 1 according to the embodiment 1, data for a plurality of memory cells may be read by selecting a plurality of data lines from one memory cell array 10. In this case, although it is necessary to provide the same number of sense circuits 15 as that of the memory cells which are read at the same time, if they are serially read, one sense circuit 15 may be all right. In addition, when the plurality of sense circuits 15 are provided, the reference memory cell arrays 20*a* and 20*b* can be shared among the plurality of sense circuits 15.

According to the embodiment 1, although the reference memory cell arrays 20*a* and 20*b* set in the patterns A and C respectively are used as the first reference current generation circuit which implements the first current state in which the current flowing in the data line selected when the high-resistance memory cell is read becomes the maximum level depending on the distribution pattern of the electric resistance state of other non-selected memory cells, and the second reference current generation circuit which implements the second current state in which the current flowing in the data line selected when the low-resistance memory cell is read becomes the minimum level depending on the distribution pattern of the electric resistance state of other non-selected memory cells, other array-size reference memory cell arrays which can implement the first current state and the second current state, may be employed as the first reference current generation circuit and the second reference current generation circuit. For example, non-selected memory cells in the same resistance state may be combined and synthesized.

Figure 20:
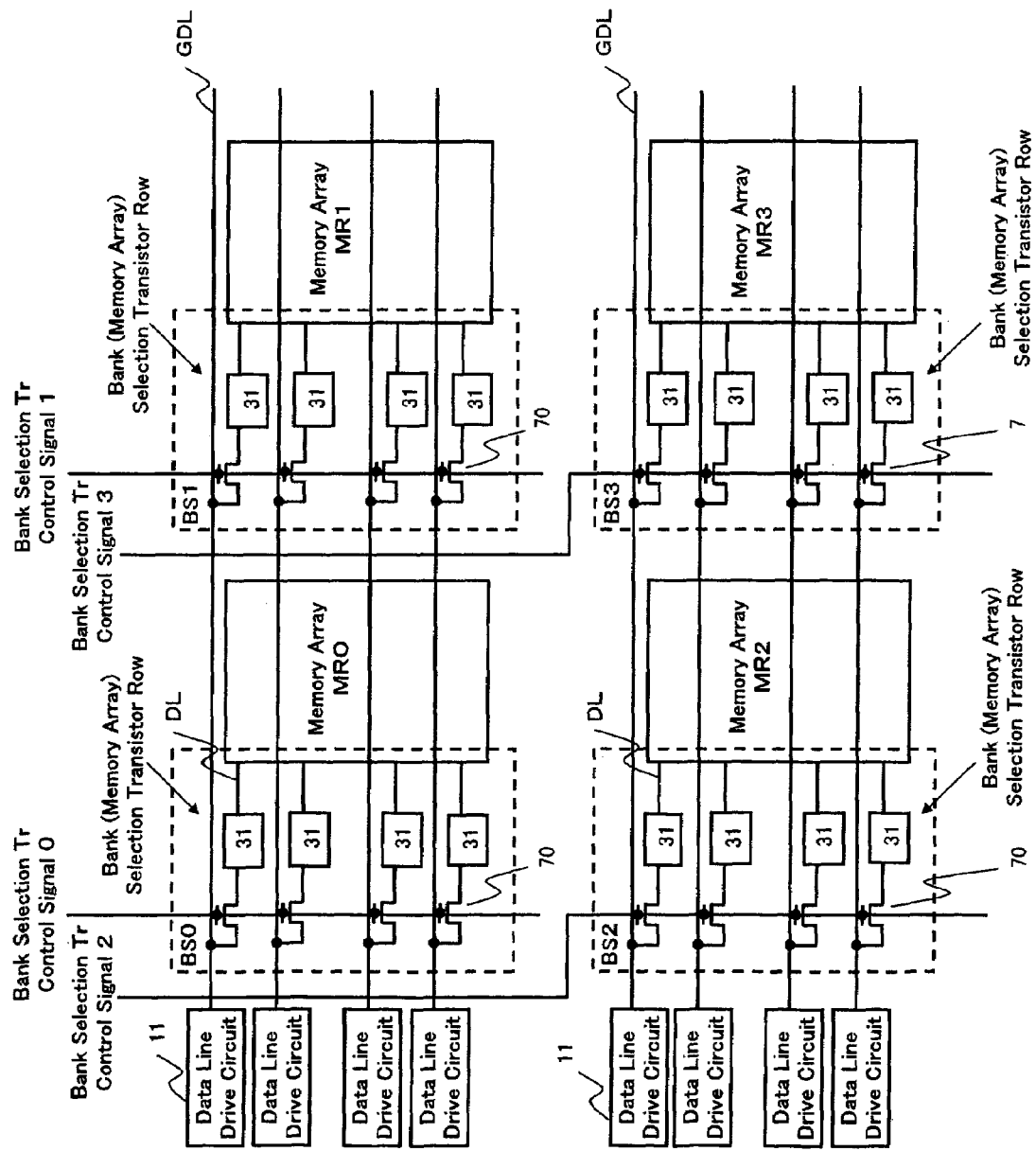
FIG. 20 is a circuit block diagram showing a memory cell array constitution in which a plurality of memory cell arrays of the semiconductor memory device according to the present invention can be selected by the bank unit.
Figure 21:
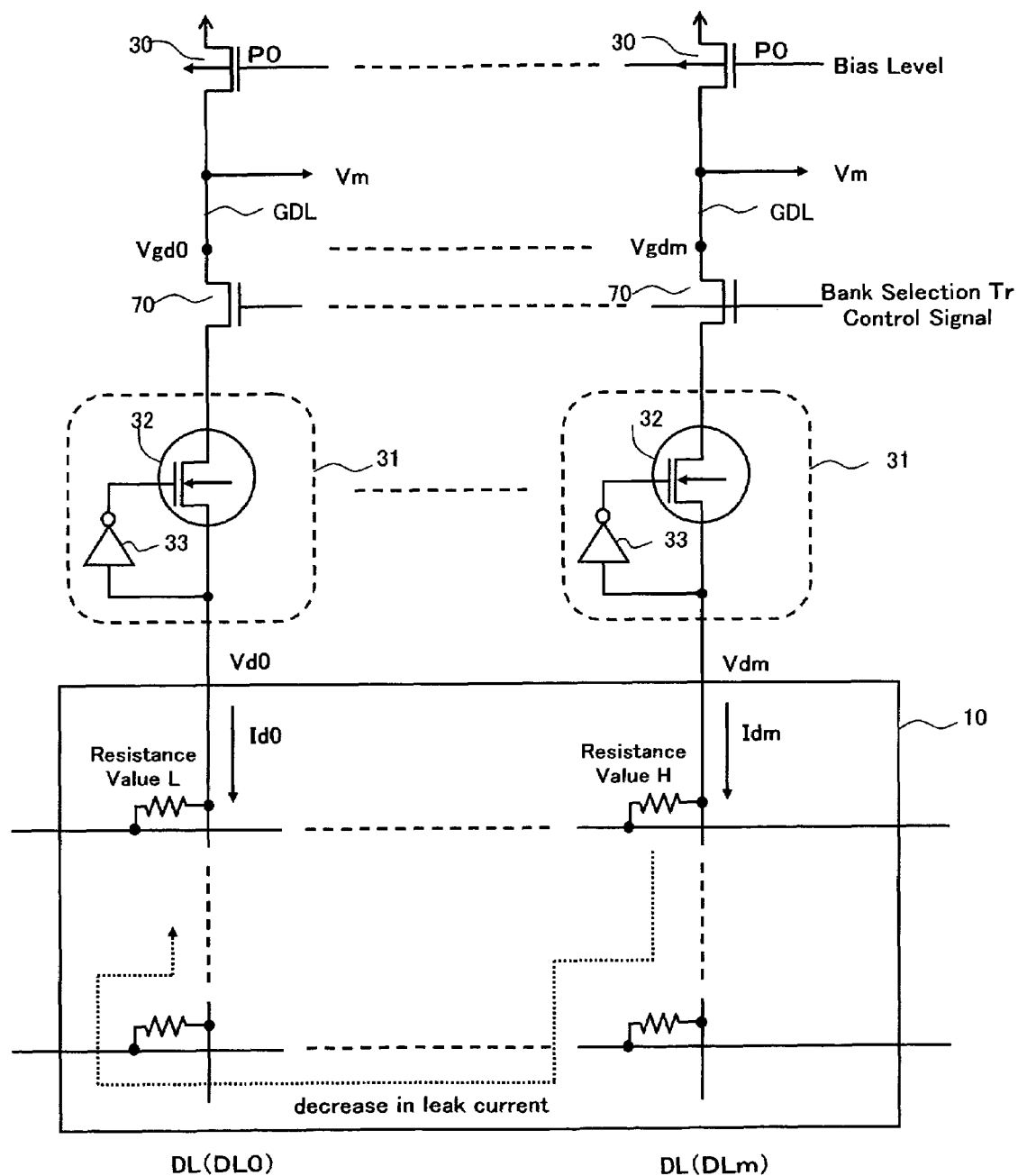
FIG. 21 is a circuit diagram showing one constitution example of a data line drive circuit in the memory cell array constitution of the semiconductor memory device according to the present invention.

When the bank structure consisting of the plurality of memory cell arrays is employed, it is preferable that the row voltage displacement prevention circuit 31 (refer to FIG. 2) employed in the above embodiments is inserted between a bank selection transistor 70 (corresponding to the array selection transistor) for selecting the memory cell array and the data line DL as shown in FIGS. 20 and 21. Referring to FIG. 20, a global data line GDL is extended in the row direction and connected to the data line DL in each bank (memory cell array) through the bank selection transistor 70 and the row voltage displacement prevention circuit 31, and the row readout voltage supply circuit 30 is connected to the global data line GDL. Therefore, according to the bank structure shown in FIG. 20, the data line drive circuit 11 shown in FIG. 2 becomes such that the row readout voltage supply circuit 30 and the row voltage displacement prevention circuit 31 are separated by the bank selection transistor 70.

Figure 22:
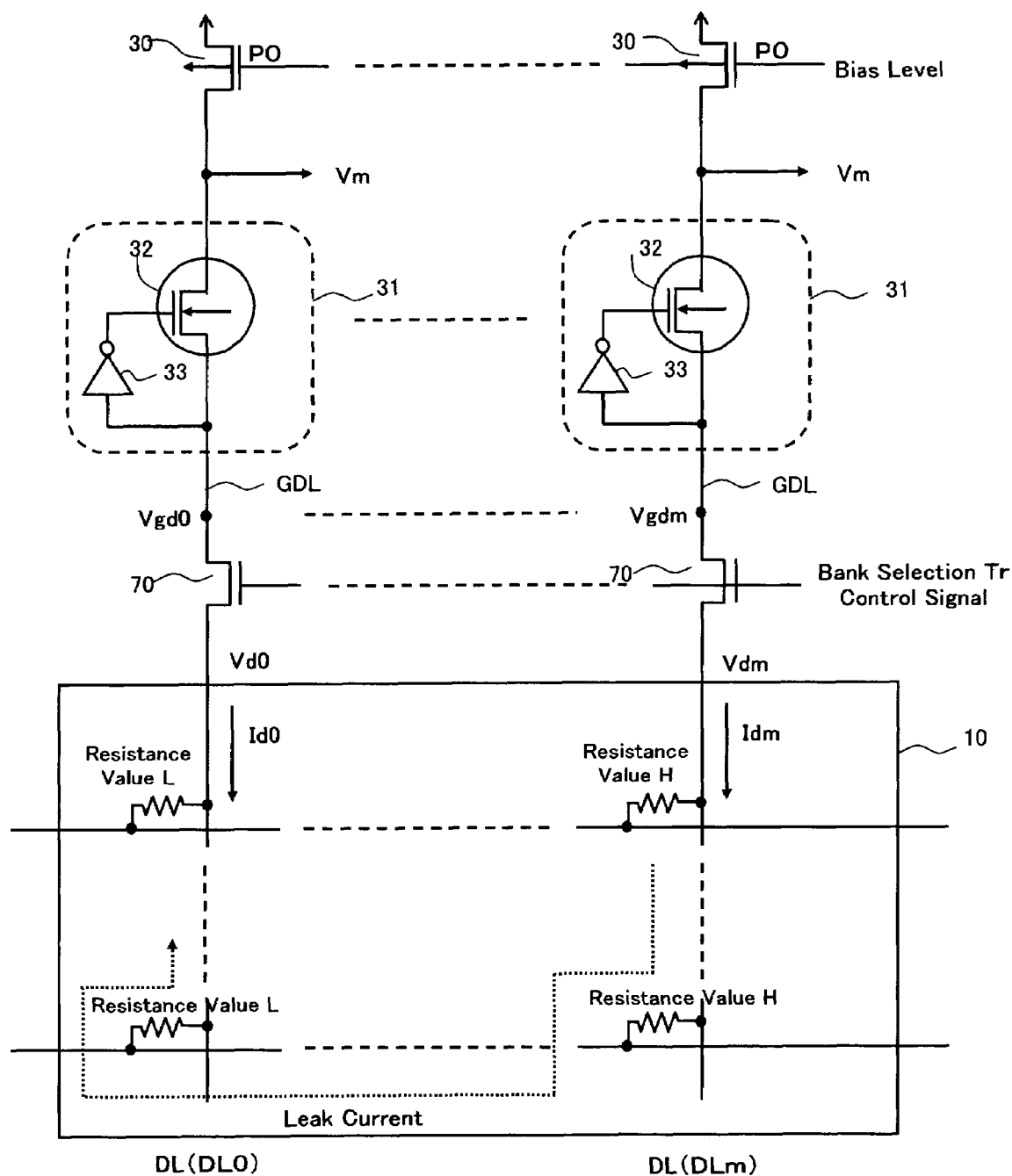
FIG. 22 is a circuit diagram showing another constitution example of the data line drive circuit in the memory cell array constitution in which a plurality of memory cell arrays can be selected by the bank unit.

When the row readout voltage supply circuit 30 and the row voltage displacement prevention circuit 31 in the data line drive circuit H are not separated by the bank selection transistor 70 as shown in a bank structure shown in FIG. 29, the row voltage displacement prevention circuit 31 is inserted between the row readout voltage supply circuit 30 and the global data line GDL as shown in FIG. 22. In this case, when one resistance value of the variable resistive elements connected to the data line DL0 or DLm and the selected bit line BL is high and the other thereof is low, a difference is generated between currents Id0 and Idm which flow in the data lines DL0 and DLm respectively. Here, although a large voltage difference is not generated between voltages Vdg0 and Vdgm on each global data line GDL because of an voltage displacement preventing effect of the row voltage displacement prevention circuit 31, a voltage difference is generated between voltages Vd0 and Vdm on the data lines DL0 and DLm. This voltage difference is generated when a difference between the currents Id0 and Idm flowing in the bank selection transistor 70 is generated by a difference in voltage drop between the source and the drain of the bank selection transistor 70. That is, since the current on the variable resistive element having the lower resistance value (Id0 in the example of FIG. 22) is higher, the voltage drop on the data line DL0 because of the bank selection transistor 70 becomes large, that is, Vd0<Vdm, causing a current to leak from the data line DLm to the data line DL0. That is, the voltage displacement preventing effect of the row voltage displacement prevention circuit 31 is lowered because of the bank selection transistor 70.

Meanwhile, as shown in FIGS. 20 and 21, when the row voltage displacement prevention circuit 31 is inserted between the bank selection transistor 70 and the data line DL, since voltage displacements of the voltages Vd0 and Vdm of the data lines DL0 and DLm are directly prevented by the voltage displacement preventing effect of the row voltage displacement prevention circuit 31, the voltage difference (Vdm−Vd0) between the data lines DL0 and DLm becomes small as compared with the constitution shown in FIG. 22, the current leakage caused by the voltage difference between the data lines DL0 and DLm can be prevented.

Figure 23:
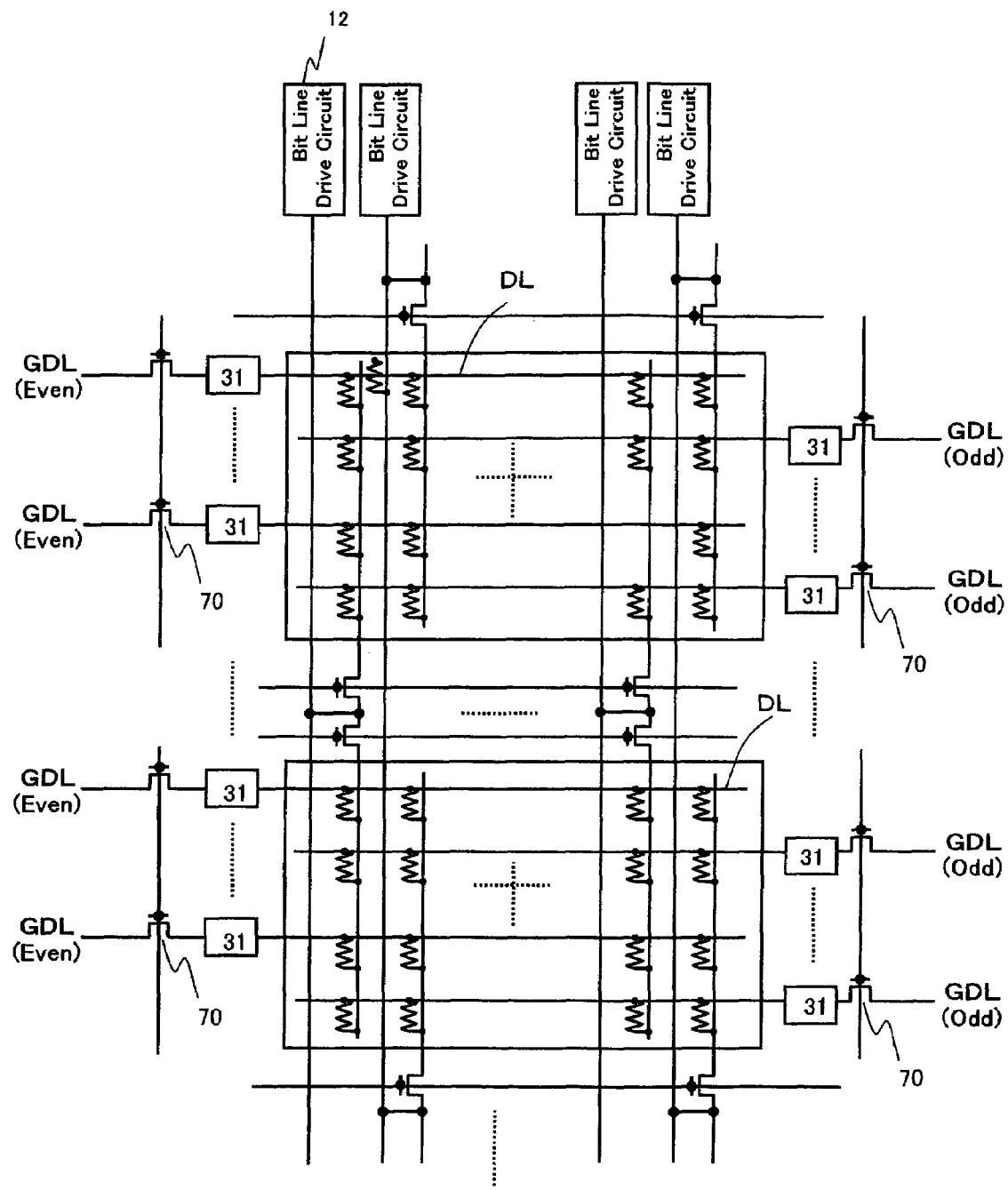
FIG. 23 is a circuit diagram showing a layout example when the memory cell array constitution of the semiconductor memory device according to the present invention shown in FIG. 20 is extended in the column direction.
Figure 24:
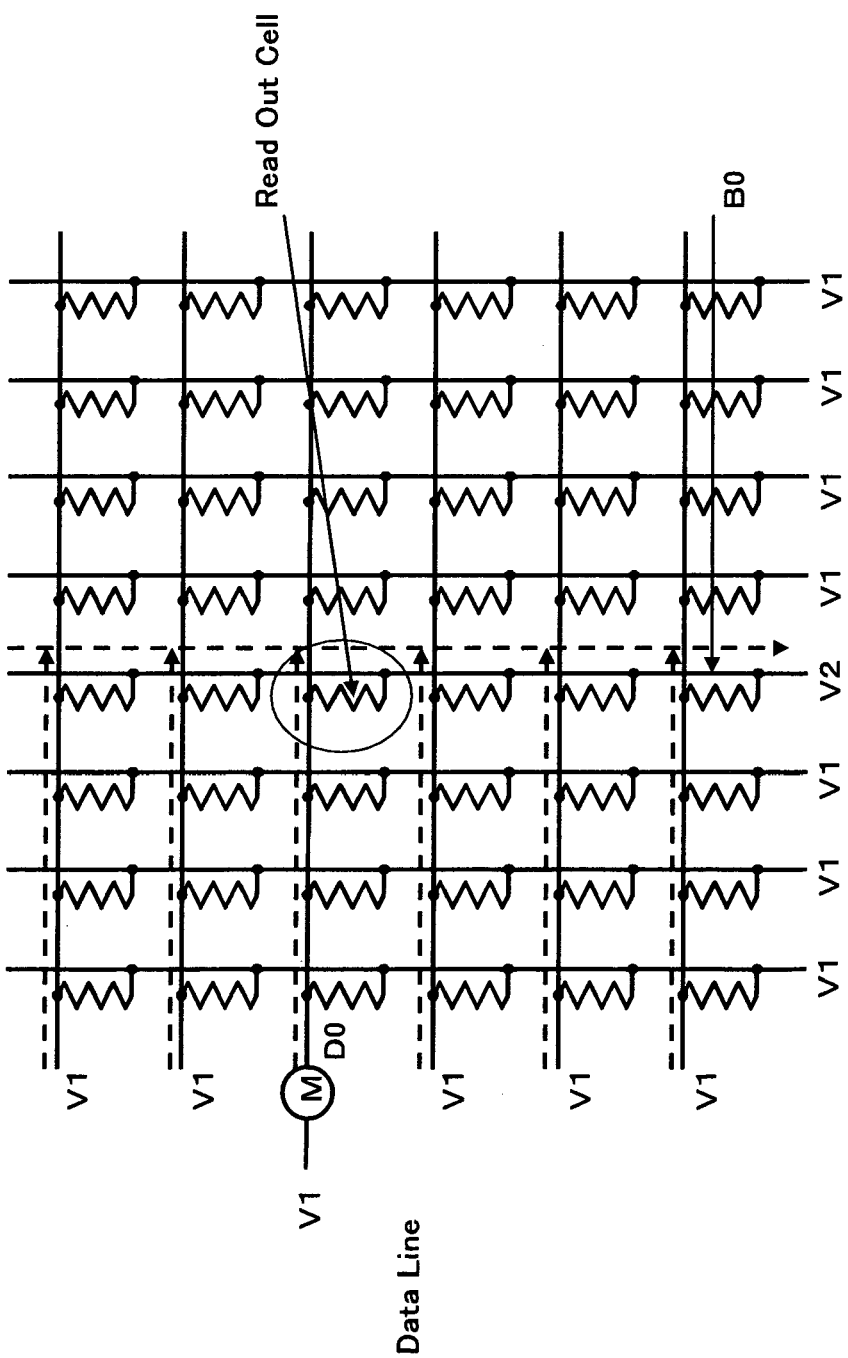
FIG. 24 is a circuit diagram showing a circuit constitution of memory cell array of the conventional cross-point memory, and a setting level and a current path of a voltage supplied to a data line and a bit line.
Figure 25:
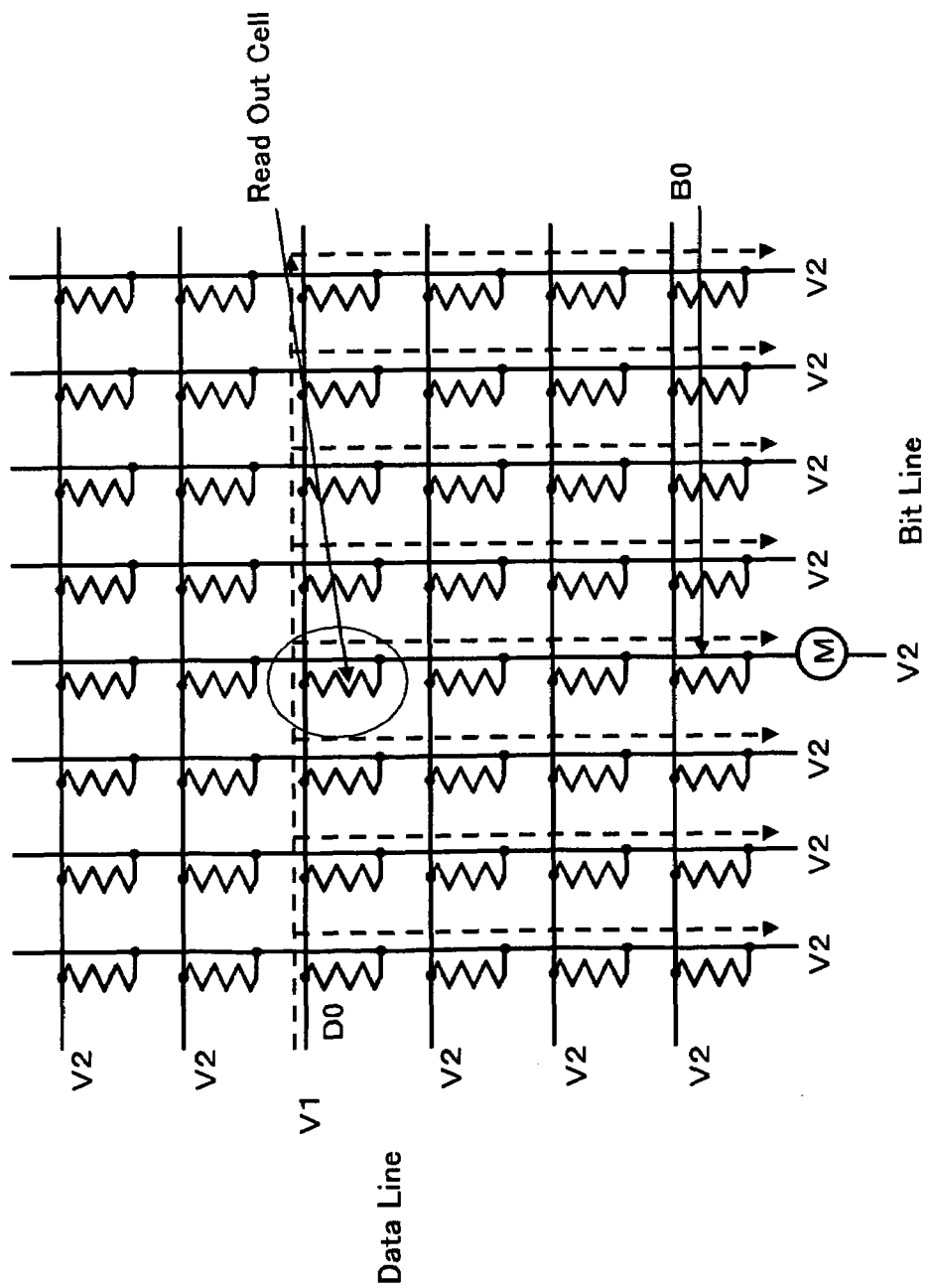
FIG. 25 is a circuit diagram showing voltage setting for each data line and each bit line and current path at the time of reading a resistance value of a memory cell at intersection of a data line D0 with a bit line B0 in the memory cell array of the conventional cross-point memory.

FIG. 23 shows an example of a layout of the bank structure when a plurality of memory cell arrays is arranged also in the column direction in the memory cell array constitution shown in FIGS. 20 and 21.

As shown in FIG. 23, the global data line GDL is extended in the row direction and connected to the data line DL in each bank (memory cell array) through the bank selection transistor 70 and the row voltage displacement prevention circuit 31, and the row readout voltage supply circuit 30 is connected to the global data line GDL. Here, the odd-numbered global data lines GDL are connected to the corresponding odd-numbered data lines DL from one side of each bank, and the even-numbered global data lines GDL are connected to the corresponding even-numbered data lines DL from the other side of each bank. In addition, the global bit line GBL is extended in the column direction and connected to the bit line DL in each bank (memory cell array) through the bank selection transistor 70, and the bit line drive circuit 12 (refer to FIG. 3) is connected to the global bit line GBL. Here, the odd-numbered global bit lines GBL are connected to the corresponding odd-numbered bit lines BL from one side of the each bank, and the even-numbered global bit lines GBL are connected to the corresponding even-numbered bit lines BL from the other side of each bank.

In addition, in the case of the bit line drive circuit 12 having the circuit constitution shown in FIG. 3, since the column readout voltage supply circuit 40 and the column voltage displacement prevention circuit 41 are integrally provided so that they cannot be separated, its layout constitution is as shown in FIG. 23. If the lowering of the voltage displacement preventing effect of the column voltage displacement prevention circuit 41 is to be prevented like the row voltage displacement prevention circuit 31, the bit line drive circuit 12 is provided in each bank or the circuit constitution of the bit line drive circuit 12 is changed so as to be adapted to the hierarchical bit line structure, for example. When the bit line drive circuit which is adapted to such hierarchical bit line structure is used, the column voltage displacement prevention circuit 41 can be directly connected to the bit line of each bank.

Although the row direction of the memory cell array is set in the lateral direction and the column direction is set in the vertical direction in the drawings in the above embodiments, the relation between the row and column can be exchanged. That is, the sense circuit may be so constituted that the current flowing in the selected column selection line is separated from the current flowing in the non-selected column selection line to be detected. In addition, although the column voltage displacement prevention circuit and the row voltage displacement prevention circuit are provided for each column selection line and each row selection line of the memory cell array in the above embodiments, either one of the column voltage displacement prevention circuit and the row voltage displacement prevention circuit may be provided.

Although the first voltage supplied to the selected bit line is lower than the second voltage supplied to the non-selected bit lines and to the data lines in the above embodiments, the first voltage may be higher than the second voltage. In addition, the first and second voltages may be the voltage other than the ground voltage and the power supply voltage.

As described above, the leak current which is generated depending on the resistance value of the memory cell to be read can be prevented by providing the row readout voltage supply circuit 30 in the data line drive circuit 11 and the column voltage displacement prevention circuit 41 in the bit line drive circuit 12 in the device of the present invention. As a result, the readout margin can be improved and accordingly a readout speed is improved.

According to the device of the present invention, even when the array size of the memory cell array (bank) is 128 rows and 128 columns, the readout margin of about several 10 mV to 200 mV can be provided. In addition, when one memory cell array (one hank) consists of 128 rows and 128 columns (16 k bit), memory capacity of 1 M bit can be provided by constituting the memory cell array with 64 banks (8×8). As a result, a total area of the memory cell array can be considerably reduced.

Although the present invention has been described in terms of the preferred embodiments, it will be appreciated that various modifications and alterations might be made by those skilled in the art without departing from the spirit and scope of the invention. The invention should therefore be measured in terms of the claims which follow.

What is claimed is:

1. A semiconductor memory device having a memory cell array in which a plurality of memory cells having variable resistive elements which store information by a change of electric resistance are arranged in a row direction and a column direction, a plurality of row selection lines extended in the row direction and a plurality of column selection lines extended in the column direction are provided, each of the memory cells in the same row has one end of the variable resistive element connected to the same row selection line, and each of the memory cells in the same column has the other end of the variable resistive element connected to the same column selection line, comprising:

a column readout voltage supply circuit coupled to each column selection line, which supplies a predetermined first voltage to a selected column selection line when readout is selected and supplies a predetermined second voltage which is different from the first voltage to a non-selected column selection line when the readout is not selected;

a row readout voltage supply circuit coupled to each row selection line, which supplies the second voltage to each row selection line at the time of readout;

a sense circuit which detects a current flowing in a selected row selection line separately from a current flowing in a non-selected row selection line to detect an electric resistance state of the selected memory cell at the time of readout; and a column voltage displacement prevention circuit which prevents displacement of a supplied voltage level for each of the non-selected column selection lines at the time of readout, wherein the column readout voltage supply circuit supplies the second voltage to each of the non-selected column selection lines through the column voltage displacement prevention circuit at the time of readout.

2. The semiconductor memory device according to claim 1, wherein the column voltage displacement prevention circuit comprises a MOSFET in which one of the drain and source is connected to the column selection line, and the other is connected to the column readout voltage supply circuit, and a feedback circuit part which adjusts ON resistance of the MOSFET by changing a gate voltage of the MOSFET depending on a voltage level of the column selection line.

3. The semiconductor memory device according to claim 1, further comprising a row voltage displacement prevention circuit which prevents displacement of a supplied voltage level for at least the selected row selection line at the time of readout, wherein the row readout voltage supply circuit supplies the second voltage to at least the selected row selection line through the row voltage displacement prevention circuit at the time of readout.

4. The semiconductor memory device according to claim 3, wherein the row voltage displacement prevention circuit comprises a MOSFET in which one of the drain and source is connected to the row selection line, and the other is connected to the row readout voltage supply circuit, and a feedback circuit part which adjusts ON resistance of the MOSFET by changing a gate voltage of the MOSFET depending on a voltage level of the row selection line.

5. The semiconductor memory device according to claim 3, wherein a plurality of the memory cell arrays are arranged at least in the row direction, each of the plurality of row selection lines of each memory cell array is connected to a corresponding global row selection line through an array selection transistor for selecting the memory cell array, the row readout voltage supply circuit is constituted so as to supply the second voltage to each of the plurality of row selection lines of the memory cell array selected by the array selection transistor through the corresponding global row selection line, and the row voltage displacement prevention circuit is provided between each row selection line and the array selection transistor.

6. The semiconductor memory device according to claim 1, further comprising a row voltage displacement prevention circuit which prevents displacement of a supplied voltage level for each of the row selection lines at the time of readout, wherein the row readout voltage supply circuit supplies the second voltage to each of the row selection lines through the row voltagedisplacement prevention circuit at the time of readout.

7. The semiconductor memory device according to claim 1, wherein the memory cell comprises a nonvolatile variable resistive element which can be rewritten electrically.

8. The semiconductor memory device according to claim 1, wherein the memory cell is arranged at each intersection of the plurality of row selection lines and the plurality of column selection lines.

9. The semiconductor memory device according to claim 1, wherein each of the column readout voltage supply circuit and the row readout voltage supply circuit supply the second voltage through a P-channel MOSFET which operates in a saturation region when the first voltage is lower than the second voltage.

10. The semiconductor memory device according to claim 1, wherein the sense circuit is constituted so as to compare a current flowing in the selected row selection line with a current of a middle state between a first current state in which a current flowing in the row selection line which is selected when a high-resistance memory cell whose electric resistance is in a high-resistance state is read becomes a maximum state depending on a distribution pattern of an electric resistance state of the other non-selected memory cells in the memory array, and a second current state in which a current flowing in the row selection line which is selected when a low-resistance memory cell whose electric resistance is in a low-resistance state is read becomes a minimum state depending on a distribution pattern of an electric resistance state of the other non-selected memory cells in the memory array.

11. The semiconductor memory device according to claim 10, wherein the sense circuit comprises:

a first current and voltage conversion circuit part which converts a current flowing in the selected row selection line to a readout voltage level;

a first reference current generation circuit which implements the first current state approximately;

a second reference current generation circuit which implements the second current state approximately;

a second current and voltage conversion circuit part which converts a current in a middle state between the first current state and the second current state to a reference voltage level; and a comparison circuit which compares the readout voltage level with the reference voltage level.

12. The semiconductor memory device according to claim 11, comprising a plurality of the memory cell arrays, wherein at least two sense circuits for memory cell arrays commonly use the first reference current generation circuit and the second reference current generation circuit.

13. The semiconductor memory device according to claim 10, comprising:

a first reference current generation circuit which implements the first current state approximately, and a second reference current generation circuit which implements the second current state approximately, wherein each of the first reference current generation circuit and the second reference current generation circuit comprises a reference memory cell array comprising reference memory cells consisting of the same variable resistive elements as the memory cells, which is equivalent to the memory cell array, a reference column readout voltage supply circuit which is equivalent to the column readout voltage supply circuit, and a reference row readout voltage supply circuit which is equivalent to the row readout voltage supply circuit, the distribution pattern of the electric resistance state of the reference memory cell in the reference memory cell array of the first reference current generation circuit is set at a first distribution pattern in which a current flowing in the selected row selection line in the reference memory cell array becomes the first current state, and the distribution pattern of the electric resistance state of the reference memory cell in the reference memory cell array of the second reference current generation circuit is set at a second distribution pattern in which a current flowing in the selected row selection line in the reference memory cell array becomes the second current state.

14. The semiconductor memory device according to claim 13, wherein the first distribution pattern is a distribution pattern in which the reference memory cells on one row connected to one row selection line and the reference memory cells on one column connected to one column selection line are high in resistance, and the reference memory cells in a region other than the region of the high-resistance reference memory cells are low in resistance, and the second distribution pattern is a distribution pattern in which the reference memory cells on one row connected to one row selection line and the reference memory cells on one column connected to one column selection line are low in resistance, and the reference memory cells in a region other than the region of the high-resistance reference memory cells are high in resistance.

15. The semiconductor memory device according to claim 14, wherein
the high-resistance reference memory cell in the first distribution pattern is connected to the row selection line which is closest to the row voltage displacement prevention circuit and to the column selection line which is closest to the column voltage displacement prevention circuit, and
the low-resistance reference memory cell in the second distribution pattern is connected to the row selection line which is farthest from the row voltage displacement prevention circuit and to the column selection line which is farthest from the column voltage displacement prevention circuit.

16. The semiconductor memory device according to claim 13, wherein
the number of each of the reference memory cells, the row selection lines and the column selection lines in the reference memory cell array is the same as the number of each of the memory cells, the row selection lines and the column selection lines in the corresponding memory cell array.

17. The semiconductor memory device according to claim 1, wherein
the sense circuit comprises one or more inverter circuit stages.

18. The semiconductor memory device according to claim 1, wherein
the sense circuit comprises
a first comparison circuit which compares a readout voltage which is converted from the current flowing in the selected row selection line, with a first voltage which is converted from the first current state in which a current flowing in the row selection line which is selected when a high-resistance memory cell whose electric resistance is in a high-resistance state is read becomes a maximum state depending on a distribution pattern of an electric resistance state of the other non-selected memory cells in the memory cell array;
a second comparison circuit which compares the readout voltage with a second voltage which is converted from the second current state in which a current flowing in the row selection line which is selected when a low-resistance memory cell whose electric resistance is in a low-resistance state is read becomes a minimum state depending on a distribution pattern of an electric resistance state of the other non-selected memory cells in the memory cell array; and
a third comparison circuit which compares an output voltage of the first comparison circuit with an output voltage of the second comparison circuit.

19. The semiconductor memory device according to claim 1, wherein the variable resistive elements are constituted by material selected among metal oxide with a perovskite structure, metal oxide including transition metal, chalcogenide compound, metal particles and metal oxide such as STO ($SrTiO_3$), SZO ($SrZrO_3$) and SRO ($SrRuO_3$), a fluorocarbon resin material, a conductive polymer, and a spin-dependent tunnel junction element.

20. A semiconductor memory device having a memory cell array in which a plurality of memory cells having variable resistive elements which store information by a change of electric resistance are arranged in a row direction and a column direction, a plurality of row selection lines extended in the row direction and a plurality of column selection lines extended in the column direction are provided, each of the memory cells in the same row has one end of the variable resistive element connected to the same row selection line, and each of the memory cells in the same column has the other end of the variable resistive element connected to the same column selection line, comprising:
a column readout voltage supply circuit coupled to each column selection line, which supplies a predetermined first voltage to a selected column selection line when readout is selected and supplies a predetermined second voltage which is different from the first voltage to a non-selected colunm selection line when the readout is not selected;
a row readout voltage supply circuit coupled to each row selection line, which supplies the second voltage to each row selection line at the time of readout;
a sense circuit which detects a current flowing in a selected row selection line separately from a current flowing in a non-selected row selection lineto detect an electric resistance state of the selected memory cell at the time of readout; and
a row voltage displacement prevention circuit which prevents displacement of a supplied voltage level for at least the selected row selection line at the time of readout, wherein
the row readout voltage supply circuit supplies the second voltage to at least the selected row selection line through the row voltage displacement prevention circuit at the time of readout.

21. The semiconductor memory device according to claim 20, wherein the variable resistive elements are constituted by material selected among metal oxide with a perovskite structure, metal oxide including transition metal, chalcogenide compound, metal particles and metal oxide such as STO ($SrTiO_3$), SZO ($SrZrO_3$) and SRO ($SrRuO_3$), a fluorocarbon resin material, a conductive polymer, and a spin-dependent tunnel junction element.

22. A semiconductor memory device having a memory cell array in which a plurality of memory cells having variable resistive elements which store information by a change of electric resistance are arranged in a row direction and a column direction, a plurality of row selection lines extended in the row direction and a plurality of column selection lines extended in the column direction are provided, each of the memory cells in the same row has one end of the variable resistive element connected to the same row selection line, and each of the memory cells in the same column has the other end of the variable resistive element connected to the same column selection line, comprising:
a column readout voltage supply circuit coupled to each column selection line, which supplies a predetermined first voltage to a selected column selection line when readout is selected and supplies a predetermined second voltage which is different from the first voltage to a non-selected column selection line when the readout is not selected;
a row readout voltage supply circuit coupled to each row selection line, which supplies the second voltage to each row selection line at the time of readout;
a sense circuit which detects a current flowing in a selected row selection line separately from a current flowing in a non-selected row selection line to detect an electric resistance state of the selected memory cell at the time of readout; and a row voltage displacement prevention circuit which prevents displacement of a supplied voltage level for each of the row selection lines at the time of readout, wherein the row readout voltage supply circuit supplies the second voltage to each of the row selection lines through the row voltage displacement prevention circuit at the time of readout.

23. The semiconductor memory device according to claim 22, wherein the variable resistive elements are constituted by material selected among metal oxide with a perovskite structure, metal oxide including transition metal, chalcogenide compound, metal particles and metal oxide such as STO ($SrTiO_3$), SZO ($SrZrO_3$) and SRO ($SrRuO_3$), a fluorocarbon resin material, a conductive polymer, and a spin-dependent tunnel junction element.

24. A semiconductor memory device having a memory cell array in which a plurality of memory cells having variable resistive elements which store information by a change of electric resistance are arranged in a row direction and a column direction, a plurality of row selection lines extended in the row direction and a plurality of column selection lines extended in the column direction are provided, each of the memory cells in the same row has one end of the variable resistive element connected to the same row selection line, and each memory cells in the same column has the other end of the variable resistive element connected to the same column selection line, wherein the memory cell array comprises a column readout voltage supply circuit coupled to each column selection line, which supplies a predetermined first voltage to a selected column selection line when readout is selected and supplies a predetermined second voltage which is different from the first voltage to a non-selected column selection line when the readout is not selected, and a row readout voltage supply circuit coupled to each row selection line, which supplies the second voltage to each row selection line at the time of readout, a sense circuit which detects an electric resistance state of the selected memory cell by separating a current flowing in a selected row selection line from a current flowing in a non-selected row selection lines at the time of readout and, then, comparing the current with a current in a middle state between a first current state in which the current flowing in the selected row selection line when a high-resistance memory cell whose electric resistance is in a high-resistance state is read becomes a maximum state depending on a distribution pattern of an electric resistance state of the other non-selected memory cells in the memory array, and a second current state in which the current flowing in the selected row selection line when a low-resistance memory cell whose electric resistance is in a low-resistance state is read becomes a minimum state depending on the distribution pattern of the electric resistance state of the other non-selected memory cells in the memory array, is provided, each of a first reference current generation circuit which implements the first current state approximately and a second reference current generation circuit which implements the second current state approximately comprises a reference memory cell array comprising reference memory cells including the same variable resistive elements as the memory cells, which is equivalent to the memory cell array, a reference column readout voltage supply circuit which is equivalent to the column readout voltage supply circuit, and a reference row readout voltage supply circuit which is equivalent to the row readout voltage supply circuit, a distribution pattern of an electric resistance state of the reference memory cells in the reference memory cell array of the first reference current generation circuit is set in a first distribution pattern in which a current flowing in a selected row selection line of the reference memory cell array becomes the first current state, and a distribution pattern of an electric resistance state of the reference memory cells in the reference memory cell array of the second reference current generation circuit is set in a second distribution pattern in which a current flowing in a selected row selection line of the reference memory cell array becomes the second current state.

25. The semiconductor memory device according to claim 24, wherein the number of each of the reference memory cells, the row selection lines and the column selection lines in the reference memory cell array is the same as the number of each of the memory cells, the row selection lines and the column selection lines in the corresponding memory cell array.

26. The semiconductor memory device according to claim 24, comprising a plurality of the memory cell arrays, wherein at least two sense circuits for memory cell arrays commonly use the first reference current generation circuit and the second reference current generation circuit.

27. The semiconductor memory device according to claim 24, wherein the first distribution pattern is a distribution pattern in which the reference memory cells on one row connected to one row selection line and the reference memory cells on one column connected to one column selection line are high in resistance, and the reference memory cells in a region other than the region of the high-resistance reference memory cells are low in resistance, and the second distribution pattern is a distribution pattern in which the reference memory cells on one row connected to one row selection line and the reference memory cells on one column connected to one column selection line are low in resistance, and the reference memory cells in a region other than the region of the low-resistance reference memory cells are high in resistance.

28. The semiconductor memory device according to claim 24, wherein the variable resistive elements are constituted by material selected among metal oxide with a perovskite structure, metal oxide including transition metal, chalcogenide compound, metal particles and metal oxide such as STO ($SrTiO_3$), SZO ($SrZrO_3$) and SRO ($SrRuO_3$), a fluorocarbon resin material, a conductive polymer, and a spin-dependent tunnel junction element.

29. A semiconductor memory device having a memory cell array in which a plurality of memory cells consisting of variable resistive elements which store information by a change of electric resistance are arranged in a row direction and a column direction, a plurality of row selection lines extended in the row direction and a plurality of column selection lines extended in the column direction are provided, each of the memory cells in the same row has one end of the variable resistive element connected to the same row selection line, and each of the memory cells in the same column has the other end of the variable resistive element connected to the same column selection line, comprising:

a column readout voltage supply circuit coupled to each column selection line, which supplies a predetermined first voltage to a selected column selection line when readout is selected and supplies a predetermined second voltage which is different from the first voltage to a non-selected column selection line when the readout is not selected;

a row readout voltage supply circuit coupled to each row selection line, which supplies the second voltage to each row selection line at the time of readout;

a sense circuit which detects a current flowing in a selected row selection line separately from a current flowing in a non-selected row selection line to detect an electric resistance state of the selected memory cell at the time of readout; and a column voltage displacement prevention circuit which prevents displacement of a supplied voltage level for each of the non-selected column selection lines at the time of readout, wherein the column voltage displacement prevention circuit comprises a MOSFET in which any one of the drain and source is connected to the column selection line, and the other is connected to the column readout voltage supply circuit, and a feedback circuit part which adjusts ON resistance of the MOSFET by changing a gate voltage of the MOSFET depending on a voltage level of the column selection line.

30. A semiconductor memory device having a memory cell array in which a plurality of memory cells consisting of variable resistive elements which store information by a change of electric resistance are arranged in a row direction and a column direction, a plurality of row selection lines extended in the row direction and a plurality of column selection lines extended in the column direction are provided, each of the memory cells in the same row has one end of the variable resistive element connected to the same row selection line, and each of the memory cells in the same column has the other end of the variable resistive element connected to the same column selection line, comprising:

a column readout voltage supply circuit coupled to each column selection line, which supplies a predetermined first voltage to a selected column selection line when readout is selected and supplies a predetermined second voltage which is different from the first voltage to a non-selected column selection line when the readout is not selected;

a row readout voltage supply circuit coupled to each row selection line, which supplies the second voltage to each row selection line at the time of readout;

a sense circuit which detects a current flowing in a selected row selection line separately from a current flowing in a non-selected row selection line to detect an electric resistance state of the selected memory cell at the time of readout; and a column voltage displacement prevention circuit which prevents displacement of a supplied voltage level for each of the non-selected column selection lines at the time of readout, further comprising a row voltage displacement prevention circuit which prevents displacement of a supplied voltage level for at least the selected row selection line at the time of readout;

wherein the row voltage displacement prevention circuit comprises a MOSFET in which any one of the drain and source is connected to the row selection line, and the other is connected to the row readout voltage supply circuit, and a feedback circuit part which adjusts ON resistance of the MOSFET by changing a gate voltage of the MOSFET depending on a voltage level of the row selection line.

31. A semiconductor memory device having a memory cell array in which a plurality of memory cells consisting of variable resistive elements which store information by a change of electric resistance are arranged in a row direction and a column direction, a plurality of row selection lines extended in the row direction and a plurality of column selection lines extended in the column direction are provided, each of the memory cells in the same row has one end of the variable resistive element connected to the same row selection line, and each of the memory cells in the same column has the other end of the variable resistive element connected to the same column selection line, comprising:

a column readout voltage supply circuit coupled to each column selection line, which supplies a predetermined first voltage to a selected column selection line when readout is selected and supplies a predetermined second voltage which is different from the first voltage to a non-selected column selection line when the readout is not selected;

a row readout voltage supply circuit coupled to each row selection line, which supplies the second voltage to each row selection line at the time of readout;

a sense circuit which detects a current flowing in a selected row selection line separately from a current flowing in a non-selected row selection line to detect an electric resistance state of the selected memory cell at the time of readout; and a column voltage displacement prevention circuit which prevents displacement of a supplied voltage level for each of the non-selected column selection lines at the time of readout;

further comprising a row voltage displacement prevention circuit which prevents displacement of a supplied voltage level for at least the selected row selection line at the time of readout;

further comprising a row voltage displacement prevention circuit which prevents displacement of a supplied voltage level for at least the selected row selection line at the time of readout;

wherein a plurality of the memory cell arrays are arranged at least in the row direction, each of the plurality of row selection lines of each memory cell array is connected to a corresponding global row selection line through an array selection transistor for selecting the memory cell array, the row readout voltage supply circuit is constituted so as to supply the second voltage to each of the plurality of row selection lines of the memory cell array selected by the array selection transistor through the corresponding global row selection line, and the row voltage displacement prevention circuit is provided between each row selection line and the array selection transistor.

32. A semiconductor memory device having a memory cell array in which a plurality of memory cells consisting of variable resistive elements which store information by a change of electric resistance are arranged in a row direction and a column direction, a plurality of row selection lines extended in the row direction and a plurality of column selection lines extended in the column direction are provided, each of the memory cells in the same row has one end of the variable resistive element connected to the same row selection line, and each of the memory cells in the same column has the other end of the variable resistive element connected to the same column selection line, comprising:
  a column readout voltage supply circuit coupled to each column selection line, which supplies a predetermined first voltage to a selected column selection line when readout is selected and supplies a predetermined second voltage which is different from the first voltage to a non-selected column selection line when the readout is not selected;
  a row readout voltage supply circuit coupled to each row selection line, which supplies the second voltage to each row selection line at the time of readout;
  a sense circuit which detects a current flowing in a selected row selection line separately from a current flowing in a non-selected row selection line to detect an electric resistance state of the selected memory cell at the time of readout; and
  a column voltage displacement prevention circuit which prevents displacement of a supplied voltage level for each of the non-selected column selection lines at the time of readout;
  wherein each of the column readout voltage supply circuit and the row readout voltage supply circuit supply the second voltage through a P-channel MOSFET which operates in a saturation region when the first voltage is lower than the second voltage.

33. A semiconductor memory device having a memory cell array in which a plurality of memory cells consisting of variable resistive elements which store information by a change of electric resistance are arranged in a row direction and a column direction, a plurality of row selection lines extended in the row direction and a plurality of column selection lines extended in the column direction are provided, each of the memory cells in the same row has one end of the variable resistive element connected to the same row selection line, and each of the memory cells in the same column has the other end of the variable resistive element connected to the same column selection line, comprising:
  a column readout voltage supply circuit coupled to each column selection line, which supplies a predetermined first voltage to a selected column selection line when readout is selected and supplies a predetermined second voltage which is different from the first voltage to a non-selected column selection line when the readout is not selected;
  a row readout voltage supply circuit coupled to each row selection line, which supplies the second voltage to each row selection line at the time of readout;
  a sense circuit which detects a current flowing in a selected row selection line separately from a current flowing in a non-selected row selection line to detect an electric resistance state of the selected memory cell at the time of readout; and
  a column voltage displacement prevention circuit which prevents displacement of a supplied voltage level for each of the non-selected column selection lines at the time of readout;
  wherein the sense circuit is constituted so as to compare a current flowing in the selected row selection line with a current of a middle state between a first current state in which a current flowing in the row selection line which is selected when a high-resistance memory cell whose electric resistance is in a high-resistance state is read becomes a maximum state depending on a distribution pattern of an electric resistance state of the other non-selected memory cells in the memory array, and a second current state in which a current flowing in the row selection line which is selected when a low-resistance memory cell whose electric resistance is in a low-resistance state is read becomes a minimum state depending on a distribution pattern of an electric resistance state of the other non-selected memory cells in the memory array.

34. A semiconductor memory device having a memory cell array in which a plurality of memory cells consisting of variable resistive elements which store information by a change of electric resistance are arranged in a row direction and a column direction, a plurality of row selection lines extended in the row direction and a plurality of column selection lines extended in the colunm direction are provided, each of the memory cells in the same row has one end of the variable resistive element connected to the same row selection line, and each of the memory cells in the same column has the other end of the variable resistive element connected to the same column selection line, comprising:
  a column readout voltage supply circuit coupled to each colunm selection line, which supplies a predetermined first voltage to a selected column selection line when readout is selected and supplies a predetermined second voltage which is different from the first voltage to a non-selected column selection line when the readout is not selected;
  a row readout voltage supply circuit coupled to each row selection line, which supplies the second voltage to each row selection line at the time of readout;
  a sense circuit which detects a current flowing in a selected row selection line separately from a current flowing in a non-selected row selection line to detect an electric resistance state of the selected memory cell at the time of readout; and
  a column voltage displacement prevention circuit which prevents displacement of a supplied voltage level for each of the non-selected column selection lines at the time of readout, wherein the sense circuit comprises one or more inverter circuit stages alone.

35. A semiconductor memory device having a memory cell array in which a plurality of memory cells consisting of variable resistive elements which store information by a change of electric resistance are arranged in a row direction and a column direction, a plurality of row selection lines extended in the row direction and a plurality of column selection lines extended in the column direction are provided, each of the memory cells in the same row has one end of the variable resistive element connected to the same row selection line, and each of the memory cells in the same column has the other end of the variable resistive element connected to the same column selection line, comprising:
  a column readout voltage supply circuit coupled to each column selection line, which selected and supplies a predetermined second voltage which is different from the first voltage to a non-selected column selection line when the readout is not selected;
  a row readout voltage supply circuit coupled to each row selection line, which supplies the second voltage to each row selection line at the time of readout;
  a sense circuit which detects a current flowing in a selected row selection line separately from a current flowing in a non-selected row selection line to detect an electric resistance state of the selected memory cell at the time of readout; and a column voltage displacement prevention circuit which prevents displacement of a supplied voltage level for each of the non-selected column selection lines at the time of readout;

wherein the sense circuit comprises a first comparison circuit which compares a readout voltage which is converted from the current flowing in the selected row selection line, with a first voltage which is converted from the first current state in which a current flowing in the row selection line which is selected when a high-resistance memory cell whose electric resistance is in a high-resistance state is read becomes a maximum state depending on a distribution pattern of an electric resistance state of the other non-selected memory cells in the memory cell array;

a second comparison circuit which compares the readout voltage with a second voltage which is converted from the second current state in which a current flowing in the row selection line which is selected when a low-resistance memory cell whose electric resistance is in a low-resistance state is read becomes a minimum state depending on a distribution pattern of an electric resistance state of the other non-selected memory cells in the memory cell array; and a third comparison circuit which compares an output voltage of the first comparison circuit with an output voltage of the second comparison circuit.

36. A semiconductor memory device having a memory cell array in which a plurality of memory cells consisting of variable resistive elements which store information by a change of electric resistance are arranged in a row direction and a column direction, a plurality of row selection lines extended in the row direction and a plurality of column selection lines extended in the column direction are provided, each of the memory cells in the same row has one end of the variable resistive element connected to the same row selection line, and each of the memory cells in the same column has the other end of the variable resistive element connected to the same column selection line, comprising:

a column readout voltage supply circuit coupled to each column selection line, which supplies a predetermined first voltage to a selected column selection line when readout is selected and supplies a predetermined second voltage which is different from the first voltage to a non-selected column selection line when the readout is not selected;

a row readout voltage supply circuit coupled to each row selection line, which supplies the second voltage to each row selection line at the time of readout;

a sense circuit which detects a current flowing in a selected row selection line separately from a current flowing in a non-selected row selection line to detect an electric resistance state of the selected memory cell at the time of readout; and a row voltage displacement prevention circuit which prevents displacement of a supplied voltage level for at least the selected row selection line at the time of readout;

wherein the variable resistive elements are constituted by material selected among metal oxide with a perovskite structure, metal oxide including transition metal, chalcogenide compound, metal particles and metal oxide such as STO ($SrTiO_3$), SZO ($SrZrO_3$) and SRO ($SrRuO_3$), a fluorocarbon resin material, a conductive polymer, and a spin-dependent tunnel junction element.

* * * * *